US012648350B2

(12) United States Patent
Lee et al.

(10) Patent No.: US 12,648,350 B2
(45) Date of Patent: Jun. 2, 2026

(54) LIGHT-EMITTING DEVICE AND ELECTRONIC APPARATUS INCLUDING LIGHT-EMITTING DEVICE

(71) Applicant: Samsung Display Co., Ltd., Yongin-si (KR)

(72) Inventors: Juyon Lee, Yongin-si (KR); Jingoo Kang, Yongin-si (KR); Sehun Kim, Yongin-si (KR); Yonghwi Kim, Yongin-si (KR); Jonghoon Kim, Yongin-si (KR); Myoungjin Park, Yongin-si (KR); Junwoo Park, Yongin-si (KR); Sanghee Yu, Yongin-si (KR); Jaekook Ha, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 413 days.

(21) Appl. No.: 18/178,842

(22) Filed: Mar. 6, 2023

(65) Prior Publication Data

US 2023/0284521 A1 Sep. 7, 2023

(30) Foreign Application Priority Data

Mar. 7, 2022 (KR) ........................ 10-2022-0028961

(51) Int. Cl.

| | |
|---|---|
| ***H10K 85/60*** | (2023.01) |
| *H10K 50/16* | (2023.01) |
| *H10K 50/17* | (2023.01) |

(52) U.S. Cl.

CPC ........... *H10K 85/611* (2023.02); *H10K 50/16* (2023.02); *H10K 50/17* (2023.02); *H10K 50/171* (2023.02)

(58) Field of Classification Search

CPC .... H10K 85/611; H10K 50/16; H10K 59/122; H10K 59/38; H10K 50/165; H10K 50/115; H10K 50/15; H10K 50/171; H10K 85/60

See application file for complete search history.

(56) References Cited

U.S. PATENT DOCUMENTS

| | | | | |
|---|---|---|---|---|
| 8,174,179 | B2 | 5/2012 | Suh | |
| 2007/0077452 | A1* | 4/2007 | Liu | H10K 50/82 428/690 |
| 2010/0007270 | A1* | 1/2010 | Suh | H10K 59/8731 313/504 |
| 2019/0198765 | A1 | 6/2019 | Devore et al. | |
| 2019/0276734 | A1* | 9/2019 | Kim | H10K 50/15 |

(Continued)

FOREIGN PATENT DOCUMENTS

| | | | | |
|---|---|---|---|---|
| CN | 112708302 A | | 4/2021 | |
| EP | 1416549 A2 | * | 5/2004 | H10K 59/80523 |

(Continued)

OTHER PUBLICATIONS

Himchan Cho et al., "Direct Optical Patterning of Quantum Dot Light-Emitting Diodes via In Situ Ligand Exchange," Adv. Mater., 2020, pp. 1-8, No. 2003805.

*Primary Examiner* — Ermias T Woldegeorgis

(74) *Attorney, Agent, or Firm* — CANTOR COLBURN LLP

(57) ABSTRACT

A light-emitting device including: a substrate; a cathode on the substrate; an anode facing the cathode; and an interlayer including an emission layer, wherein the interlayer is located between the cathode and the anode; and a thermal acid generator.

15 Claims, 2 Drawing Sheets

(56) References Cited

U.S. PATENT DOCUMENTS

| | | | |
|---|---|---|---|
| 2022/0376180 | A1 | 11/2022 | Steiger et al. |
| 2023/0002313 | A1 | 1/2023 | Yu et al. |

FOREIGN PATENT DOCUMENTS

| | | | | |
|---|---|---|---|---|
| KR | 20080063764 | A | 7/2008 | |
| KR | 20100007265 | A | 1/2010 | |
| KR | 20190018717 | A | 2/2019 | |
| KR | 20200014823 | A | 2/2020 | |
| KR | 102239351 | B1 | 4/2021 | |
| WO | WO-2007099808 | A1 * | 9/2007 | ........... C07C 309/73 |

* cited by examiner

LIGHT-EMITTING DEVICE AND ELECTRONIC APPARATUS INCLUDING LIGHT-EMITTING DEVICE

CROSS-REFERENCE TO RELATED APPLICATION

This application is based on and claims priority to Korean Patent Application No. 10-2022-0028961, filed on Mar. 7, 2022, in the Korean Intellectual Property Office, and all the benefits accruing therefrom under 35 U.S.C. § 119, the content of which is incorporated by reference herein in its entirety.

BACKGROUND

1. Field

One or more embodiments relate to a light-emitting device and an electronic apparatus including the light-emitting device.

2. Description of the Related Art

Light-emitting devices, e.g., organic light-emitting devices (OLEDs), are self-emissive devices that, as compared with devices of the related art, have wide viewing angles, high contrast ratios, short response times, and excellent characteristics in terms of brightness, driving voltage, and response speed.

In the organic light-emitting devices, an emission layer may be located between an anode and a cathode, wherein holes are injected from the anode to the emission layer, and electrons are injected from the cathode to the emission layer. Carriers, such as holes and electrons, recombine in the emission layer to produce excitons. These excitons transition from an excited state to a ground state, thereby generating light.

In another example, quantum dots may be used as materials that perform various optical functions in optical members and various electronic apparatuses. For example, quantum dots may provide a light conversion function, a light emission function, or the like. Quantum dots, which are semiconductor nanocrystals with a quantum confinement effect, may have different energy bandgaps based on the average particle size and composition of the nanocrystals, and thus may emit light of various emission wavelengths by controlling the particle size.

SUMMARY

One or more embodiments include a light-emitting device having a low driving voltage and excellent luminescence efficiency, a method of manufacturing the light-emitting device, and an electronic apparatus including the light-emitting device.

Additional aspects will be set forth in part in the detailed description that follows and, in part, will be apparent from the detailed description, or may be learned by practice of the presented exemplary embodiments.

According to an aspect, a light-emitting device includes:

a substrate;

a cathode disposed on the substrate;

an anode facing the cathode;

an interlayer including an emission layer, wherein the interlayer is located between the cathode and the anode; and a thermal acid generator.

According to another aspect, a method of manufacturing a light-emitting device includes:

forming a cathode on a substrate;

forming an electron transport region on the cathode, wherein the electron transport region comprises a thermal acid generator;

forming an emission layer on the electron transport region; and forming an anode on the electron transport region.

According to still another aspect, an electronic apparatus includes the light-emitting device.

BRIEF DESCRIPTION OF THE DRAWINGS

The above and other aspects, features, and advantages of certain embodiments will be more apparent from the following detailed description taken in conjunction with the accompanying drawings, in which.

DETAILED DESCRIPTION

Figure 1:
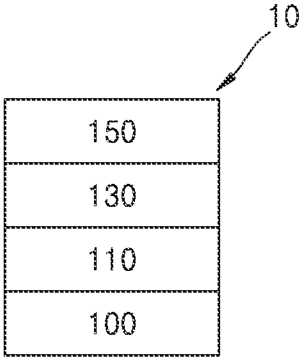
FIG. 1 is a schematic cross-sectional view of a light-emitting device according to one or more embodiments.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described in further below, by referring to the figures, to explain aspects of the present description. As used herein, the term “and/or” includes any and all combinations of one or more of the associated listed items. As used herein, the expression “at least one of a, b, or c” indicates only a, only b, only c, both a and b, both a and c, both b and c, all of a, b, and c, or variations thereof.

The terminology used herein is for the purpose of describing one or more exemplary embodiments only and is not intended to be limiting. As used herein, the singular forms “a,” “an,” and “the” are intended to include the plural forms as well, unless the context clearly indicates otherwise. The term “or” means “and/or.” It will be further understood that the terms “comprises” and/or “comprising,” or “includes” and/or “including” when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, etc. may be used herein to describe various elements, these elements should not be limited by these terms. These terms are only used to distinguish one element from another. Thus, a first element, component, region, layer, or section discussed below could be termed a second element, component, region, layer, or section without departing from the teachings of the present embodiments.

In the embodiments described in the present specification, an expression used in the singular encompasses the expression of the plural, unless it has a clearly different meaning in the context.

In the following embodiments, when various components such as layers, films, regions, or plates are described as being "on" another component, this expression may include not only a case where the layers, films, regions, or plates are "directly on" the other component but also a case in which another component may be placed therebetween. In addition, sizes of components in the drawings may be exaggerated for convenience of explanation. In other words, since sizes and thicknesses of components in the drawings are arbitrarily illustrated for convenience of explanation, the following embodiments are not limited thereto.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the present specification, it is to be understood that the terms such as "including," "having," and "comprising" are intended to indicate the existence of the features or components disclosed in the specification, and are not intended to preclude the possibility that one or more other features or components may exist or may be added. For example, unless otherwise limited, terms such as "including" or "having" may refer to either consisting of features or components described in the specification only or further including other components.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and as used herein, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Hereinafter, a work function or a highest occupied molecular orbital (HOMO) energy level is expressed as an absolute value from a vacuum level. In addition, when the work function or the HOMO energy level is referred to be "deep," "high" or "large," the work function or the HOMO energy level has a large absolute value based on "0 eV" of the vacuum level, while when the work function or the HOMO energy level is referred to be "shallow," "low," or "small," the work function or HOMO energy level has a small absolute value based on "0 eV" of the vacuum level.

In the present specification, "Group 1" includes, but is not limited to, Group IA elements of the IUPAC Periodic Table of Elements, for example, Li, Na, K, Rb, and Cs.

In the present specification, "Group 2" includes, but is not limited to, Group IIA elements of the IUPAC Periodic Table of Elements, for example, Be, Mg, Ca, Sr, and Ba.

In the present specification, "Group 3" includes, but is not limited to, Group IIIB elements of the IUPAC Periodic Table of Elements, for example, Sc, Y, La, and Ac.

In the present specification, "Group 4" includes, but is not limited to, Group IVB elements of the IUPAC Periodic Table of Elements, for example, Ti, Zr, and Hf.

In the present specification, "Group 5" includes, but is not limited to, Group VB elements of the IUPAC Periodic Table of Elements, for example, V, Nb, and Ta.

In the present specification, "Group 6" includes, but is not limited to, Group VIB elements of the IUPAC Periodic Table of Elements, for example, Cr, Mo, and W.

In the present specification, "Group 7" includes, but is not limited to, Group VIIB elements of the IUPAC Periodic Table of Elements, for example, Mn, Tc, and Re.

In the present specification, "Groups 8 to 10" include, but are not limited to, Group VIIIB elements of the IUPAC Periodic Table of Elements, for example, Fe, Ru, Os, Co, Rh, Ir, Ni, Pd, and Pt.

In the present specification, "Group 11" includes, but is not limited to, Group IB elements of the IUPAC Periodic Table of Elements, for example, Cu, Ag, and Au.

In the present specification, "Group 12" includes, but is not limited to, Group IIB elements of the IUPAC Periodic Table of Elements, for example, Zn, Cd, and Hg.

In the present specification, "Group 13" includes, but is not limited to, Group IIIA elements of the IUPAC Periodic Table of Elements, for example, Al, Ga, In, and TI.

In the present specification, "Group 14" includes, but is not limited to, Group IVA elements of the IUPAC Periodic Table of Elements, for example, Si, Ge, Sn, and Pb.

According to an aspect, a light-emitting device includes:

a substrate;

a cathode disposed on the substrate;

an anode facing the cathode;

an interlayer including an emission layer, wherein the interlayer is located between the cathode and the anode; and a thermal acid generator.

The thermal acid generator may be understood by referring to the description of the thermal acid generator provided herein.

In some embodiments, in the light-emitting device, the interlayer may further include an electron transport region located between the cathode and the emission layer, and a hole transport region located between the emission layer and the anode, the electron transport region may include a buffer layer, a hole blocking layer, an electron control layer, an electron transport layer, an electron injection layer, or a combination thereof, and wherein the hole transport region may include a hole injection layer, a hole transport layer, an emission auxiliary layer, an electron blocking layer, or a combination thereof.

In one or more embodiments, in the light-emitting device, the cathode may include the thermal acid generator, the electron transport region may include the thermal acid generator, the emission layer may include the thermal acid generator, the hole transport region may include the thermal acid generator, the anode may include the thermal acid generator, or a combination thereof, the light-emitting device may further include a thermal acid generating layer including the thermal acid generator, or a combination thereof.

For example, in the light-emitting device, the thermal acid generator may be included in the electron transport region, but embodiments are not limited thereto.

For example, the light-emitting device may include the thermal acid generating layer, wherein the thermal acid generating layer may be: located between the cathode and the electron transport region; located between the electron transport region and the emission layer; located between the emission layer and the hole transport region; located between the hole transport region and the anode; or a combination thereof.

In one or more embodiments, the electron transport region in the light-emitting device may include an electron transport layer, and the electron transport layer may include a metal oxide. The metal oxide may be understood by referring to the description of the metal oxide provided herein.

For example, the electron transport layer in the light-emitting device may include the thermal acid generator, the electron transport region may further include the thermal acid generating layer, wherein the thermal acid generating layer may be in direct contact with the electron transport layer, or a combination thereof.

In one or more embodiments, the emission layer in the light-emitting device may include one or more quantum dots. The quantum dots may be understood by referring to the description of the quantum dot provided herein.

In one or more embodiments, the light-emitting device may include a capping layer located outside the cathode or the anode.

A method of manufacturing the light-emitting device includes:

forming a cathode on a substrate;

forming an electron transport region on the cathode, wherein the electron transport region includes a thermal acid generator;

forming an emission layer on the electron transport region; and forming an anode on the electron transport region.

Description of Metal Oxide

In one or more embodiments, the electron transport region in the light-emitting device may include an electron transport layer, and the electron transport layer may include a metal oxide.

In one or more embodiments, the electron transport layer may include 50 parts by weight of the metal oxide, based on 100 parts by weight of the electron transport layer. For example, the electron transport layer may essentially consist of the metal oxide and include less than about 1 parts by weight of impurities, for example, an organic material.

In one or more embodiments, the metal oxide may include a compound represented by Formula 1:

$$M_xO_y \qquad \text{Formula 1}$$

wherein, in Formula 1,

M may be at least one metal or metalloid from one of Groups 1 to 14 of the IUPAC Periodic Table of Elements, and x and y may each independently be an integer from 1 to 5.

In one or more embodiments, in Formula 1, M may include Zn, Ti, W, Sn, In, Nb, Fe, Ce, Sr, Ba, In, Al, Nb, Si, Mg, Ga, or a combination thereof, but embodiments are not limited thereto.

In one or more embodiments, the metal oxide may include a compound represented by Formula 2:

$$M1_{\alpha}M2_{\beta}O_{\gamma} \qquad \text{Formula 2}$$

wherein, in Formula 2,

M1 may be a metal or metalloid from one of Groups 1 to 14 of the IUPAC Periodic Table of Elements, M2 may be a metal or metalloid from one of Groups 1 to 14 of the IUPAC Periodic Table of Elements, M1 and M2 may be different, and $0<\alpha\leq2$, $0<\beta\leq2$, and $1<\gamma\leq5$.

In one or more embodiments, in Formula 2, M1 may include Zn, Ti, W, Sn, In, Nb, Fe, Ce, Sr, Ba, In, Al, Nb, or a combination thereof, and M2 may include Ti, Sn, Si, Mg, Al, Ga, In, or a combination thereof, but embodiments are not limited thereto.

For example, the metal oxide may include ZnO, $TiO_2$, $WO_3$, $SnO_2$, $In_2O_3$, $Nb_2O_5$, $Fe_2O_3$, $CeO_2$, $SrTiO_3$, $Zn_2SnO_4$, $BaSnO_3$, $In_2S_3$, ZnSiO, Mg-doped ZnO (ZnMgO), Al-doped ZnO (AZO), Ga-doped ZnO (GZO), In-doped ZnO (IZO), Al-doped $TiO_2$, Ga-doped $TiO_2$, In-doped $TiO_2$, Al-doped $WO_3$, Ga-doped $WO_3$, In-doped $WO_3$, Al-doped $SnO_2$, Ga-doped $SnO_2$, In-doped $SnO_2$, Mg-doped $In_2O_3$, Al-doped $In_2O_3$, Ga-doped $In_2O_3$, Mg-doped $Nb_2O_5$, Al-doped $Nb_2O_5$, Ga-doped $Nb_2O_5$, Mg-doped $Fe_2O_3$, Al-doped $Fe_2O_3$, Ga-doped $Fe_2O_3$, In-doped $Fe_2O_3$, Mg-doped $CeO_2$, Al-doped $CeO_2$, Ga-doped $CeO_2$, In-doped $CeO_2$, Mg-doped $SrTiO_3$, Al-doped $SrTiO_3$, Ga-doped $SrTiO_3$, In-doped $SrTiO_3$, Mg-doped $Zn_2SnO_4$, Al-doped $Zn_2SnO_4$, Ga-doped $Zn_2SnO_4$, In-doped $Zn_2SnO_4$, Mg-doped $BaSnO_3$, Al-doped $BaSnO_3$, Ga-doped $BaSnO_3$, In-doped $BaSnO_3$, Mg-doped $In_2S_3$, Al-doped $In_2S_3$, Ga-doped $In_2S_3$, In-doped $In_2S_3$, Mg-doped ZnSiO, Al-doped ZnSiO, Ga-doped ZnSiO, In-doped ZnSiO, or the like, or a combination thereof.

For example, the metal oxide may be a zinc-containing oxide.

Description of Thermal Acid Generator

The thermal acid generator may dissociate protons through pyrolysis or thermal-bonding by heat. For example, the thermal acid generator may irreversibly dissociate protons. The types of the thermal acid generator is not particularly limited. That is, the thermal acid generator may not dissociate or barely dissociate protons by exposure and or contact under ambient conditions, but may dissociate protons upon heat treatment. In this regard, the thermal acid generator is different from a photoacid generator.

In one or more embodiments, in the light-emitting device, when the cathode, the electron transport region, the emission layer, the hole transport region, the anode, or a combination thereof includes the thermal acid generator, the thermal acid generator may be included greater than about 0 parts by weight to about 10 parts by weight or less, based on 100 parts of weight of the cathode, based on 100 parts of weight of the electron transport region, based on 100 parts of weight of the emission layer, based on 100 parts of weight of the hole transport region, or based on 100 parts of weight of the anode, respectively. For example, the light-emitting device may include greater than about 0 parts by weight to about 10 parts by weight or less of the thermal acid generator, based on 100 parts of weight of the cathode, greater than about 0 parts by weight to about 10 parts by weight or less of the thermal acid generator, based on 100 parts of weight of the electron transport region, or a combination thereof, but embodiments are not limited thereto.

For example, when the light-emitting device further includes the electron transport region, the electron transport region includes the electron transport layer, the electron transport layer includes the metal oxide and the thermal acid generator, the thermal acid generator may be included in an amount of greater than about 0 parts by weight to about 10 parts by weight or less, greater than about 0 parts by weight to about 5 parts by weight or less, greater than about 0 parts by weight to about 3 parts by weight or less, greater than about 0 parts by weight to about 2 parts by weight or less, or greater than about 0 parts by weight to about 1 part by weight or less, based on 100 parts of weight of the electron transport layer.

In one or more embodiments, the electron transport layer may include the metal oxide and the thermal acid generator, and a weight ratio of the metal oxide to the thermal acid generator (metal oxide:thermal acid generator) may be in a range of about 1,000:1 to about 90:1, about 1,000:1 to about 95:1, about 1,000:1 to about 99:1, or about 1,000:1 to about 100:1.

In some embodiments, the thermal acid generator may include an ammonium compound, a sulfonate compound, or a combination thereof.

In one or more embodiments, the thermal acid generator may generate an acid having a pKa of less than about 2, or, for example, less than about 1, or less than about 0, upon heat treatment.

In some embodiments, the thermal acid generator may be a compound represented by Formula 1 or Formula 2:

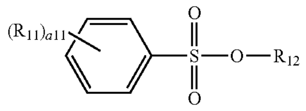

1

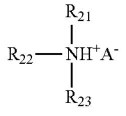

2 wherein, in Formulae 1 and 2, a11 may be an integer from 1 to 5, $A^-$ may be a counter anion, $R_{11}$, $R_{12}$, and $R_{21}$ to $R_{23}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ aryl alkyl group unsubstituted or substituted with at least one $R_{10a}$, a $C_2$-$C_{60}$ heteroaryl alkyl group unsubstituted or substituted with at least one $R_{10a}$, a $C_1$-$C_{60}$ heteroaryloxy group unsubstituted or substituted with at least one $R_{10a}$, a $C_1$-$C_{60}$ heteroarylthio group unsubstituted or substituted with at least one $R_{10a}$, —$B(Q_1)(Q_2)$, —$P(Q_1)(Q_2)$, or —$C(=O)(Q_1)$, wherein $R_{12}$ and $R_{21}$ to $R_{23}$ may not each be hydrogen, when a11 is 2 or greater, two or more of $R_{11}$ in the number of a11 may optionally be bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, at least two of $R_{21}$ to $R_{23}$ may optionally be bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and $R_{10a}$ may be:

deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, a $C_1$-$C_{60}$ heteroaryloxy group, a $C_1$-$C_{60}$ heteroarylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(Q_{11})(Q_{12})$, —$P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, or a $C_1$-$C_{60}$ heteroarylthio group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, a $C_1$-$C_{60}$ heteroaryloxy group, a $C_1$-$C_{60}$ heteroarylthio group, —$Si(Q_{21})(Q_{22})(Q_{23})$, —$N(Q_{21})(Q_{22})$, —$B(Q_{21})(Q_{22})$, —C(═O)($Q_{21}$), —S(═O)$_2$($Q_{21}$), —P($Q_{21}$)($Q_{22}$), —P(═O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), —P($Q_{31}$)($Q_{32}$), or —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; —$SF_5$; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_1$-$C_{60}$ alkylthio group, a $C_3$-$C_{60}$ carbocyclic group, or a $C_1$-$C_{60}$ heterocyclic group, each unsubstituted or substituted with at least one of deuterium, —F, a cyano group, a $C_1$-$C_{60}$ alkyl group, a $C_1$-$C_{60}$ alkoxy group, a $C_1$-$C_{60}$ alkylthio group, a phenyl group, a biphenyl group, or a combination thereof.

In one or more embodiments, in Formulae 1 and 2, $R_{11}$, $R_{12}$, and $R_{21}$ to $R_{23}$ may each independently be:

hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof;

a $C_1$-$C_{20}$ alkyl group, a $C_2$-$C_{20}$ alkenyl group, a $C_2$-$C_{20}$ alkynyl group, a $C_1$-$C_{20}$ alkoxy group, or a $C_1$-$C_{20}$ alkylthio group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), —P($Q_{31}$)($Q_{32}$), —P(═O)($Q_{31}$)($Q_{32}$), or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each unsubstituted or substituted with at least one of deuterium, —F, —Cl, —Br, —I, —$SF_5$, —$CD_3$,-$CD_2H$,-$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_1$-$C_{20}$ alkylthio group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), —P($Q_{31}$)($Q_{32}$), —P(═O)($Q_{31}$)($Q_{32}$), or a combination thereof; or B($Q_1$)($Q_2$), —P($Q_1$)($Q_2$), or —C(═O)($Q_1$), wherein $R_{12}$ and $R_{21}$ to $R_{23}$ may not each be hydrogen.

In one or more embodiments, in Formulae 1 and 2, $R_{11}$, $R_{12}$, and $R_{21}$ to $R_{23}$ may each independently be:

hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof; or a $C_1$-$C_{20}$ alkyl group, a $C_2$-$C_{20}$ alkenyl group, a $C_2$-$C_{20}$ alkynyl group, a $C_1$-$C_{20}$ alkoxy group, or a $C_1$-$C_{20}$ alkylthio group, each unsubstituted or substituted with at least one of deuterium, —F, —Cl, —Br, —I, —$SF_5$,-$CD_3$,-$CD_2H$,-$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(Q_{31})(Q_{32})$, —$P(=O)(Q_{31})(Q_{32})$, or a combination thereof, wherein $R_{12}$ and $R_{21}$ to $R_{23}$ may not each be hydrogen.

In one or more embodiments, in Formulae 1 and 2, $R_{11}$, $R_{12}$, and $R_{21}$ to $R_{23}$ may each independently be:

hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof; or a $C_1$-$C_{10}$ alkyl group, a $C_2$-$C_{10}$ alkenyl group, a $C_2$-$C_1$ alkynyl group, a $C_1$-$C_1$ alkoxy group, or a $C_1$-$C_{10}$ alkylthio group, each unsubstituted or substituted with at least one of deuterium, —F, —Cl, —Br, —I, —$SF_5$,-$CD_3$,-$CD_2H$,-$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a cyclopentyl group, a cyclohexyl group, a cycloheptyl group, a cyclooctyl group, a cyclopentenyl group, a cyclohexenyl group, a cycloheptenyl group, a phenyl group, a naphthyl group, a pyridinyl group, a pyrimidinyl group, or a combination thereof, wherein $R_{12}$ and $R_{21}$ to $R_{23}$ may each not be hydrogen.

In one or more embodiments, the thermal acid generator may include at least one of Compounds TAG1 to TAG8:

TAG1

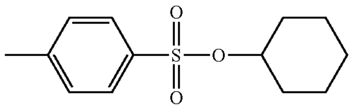

TAG2

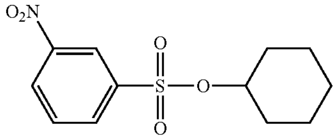

TAG3

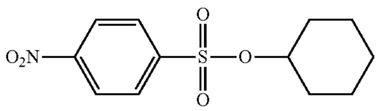

TAG4

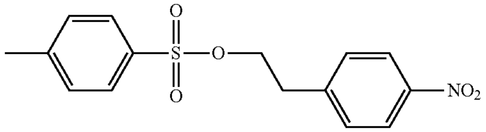

TAG5

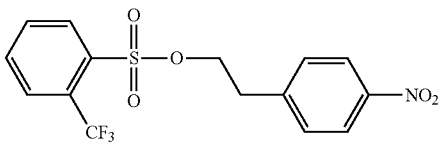

TAG6

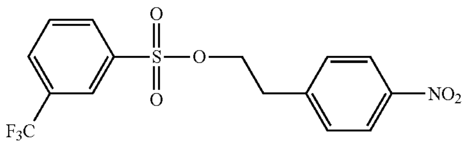

-continued

TAG7

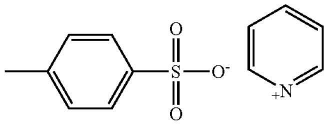

TAG8

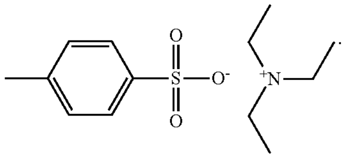

The light-emitting device according to one or more embodiments may be an inverted light-emitting device including a cathode on a substrate and including a thermal acid generator. Thus, as influence (e.g., damage) of the emission layer by heat treatment may be small, deterioration of the light-emitting device may be prevented. For example, when the light-emitting device further includes an electron transport layer including metal oxide, and the electron transport layer includes the thermal acid generator, as acid is dissociated in the thermal acid generator by heat treatment, a defect density of the metal oxide may be reduced, thus improving the electron transport properties. In addition, as the light-emitting device includes a thermal acid generator rather than a photoacid generator, the light irradiation is not performed, and thus, the manufacturing process of the light-emitting device may be simplified, thus improving convenience. Accordingly, the light-emitting device may have a low driving voltage and excellent luminescence efficiency, and the light-emitting device may be used in manufacture of a high-quality electronic apparatus.

The expression that "(an electron transport region and/or an electron transport layer) includes a thermal acid generator" as used herein may be construed as meaning that "(the electron transport region and/or the electron transport layer) may include one type of a thermal acid generator belonging to the thermal acid generator or two types of thermal acid generators belonging to the thermal acid generator."

For example, the electron transport region and/or the electron transport layer may include Compound TAG1 only as the thermal acid generator. In this embodiment, Compound TAG1 may be situated in an electron transport layer of the light-emitting device. In some embodiments, the electron transport region may include, as the thermal acid generator, Compound TAG1 and Compound TAG2. In this embodiment, Compound TAG1 and Compound TAG2 may be situated in the same layer (for example, both Compound TAG1 and Compound TAG2 may be situated in an electron transport layer), or in different layers (for example, Compound TAG1 may be situated in an electron transport layer, and Compound TAG2 may be situated in an electron injection layer).

The term "interlayer" as used herein refers to a single layer and/or a plurality of all layers located between a cathode and an anode in a light-emitting device.

According to another aspect, an electronic apparatus includes the light-emitting device. The electronic apparatus may further include a thin-film transistor. In some embodiments, the electronic apparatus may further include a thin-film transistor including a source electrode and drain electrode, and a cathode or anode of the light-emitting device may be electrically connected to the source electrode or the drain electrode.

In one or more embodiments, the substrate in the electronic apparatus may include a plurality of sub-pixel areas, and a pixel-defining film may be located between the sub-pixel areas, wherein the pixel-defining film may include the thermal acid generator, a thermal acid generating layer including the thermal acid generator is included in the pixel-defining film, or a combination thereof.

The electronic apparatus may further include a color filter, a color-conversion layer, a touchscreen layer, a polarizing layer, or a combination thereof. The electronic apparatus may be understood by referring to the description of the electronic apparatus provided herein.

Description of FIG. 1

FIG. 1 is a schematic view of a light-emitting device 10 according to one or more embodiments. The light-emitting device 10 may include a substrate 100, a cathode 110, an interlayer 130, and an anode 150.

Hereinafter, the structure of the light-emitting device 10 according to one or more embodiments, and a method of manufacturing the light-emitting device 10 according to one or more embodiments will be described in connection with FIG. 1.

Substrate 100

The substrate 100 may be any suitable substrate that is used in the related art. For example, the substrate 100 may be an inorganic substrate or an organic substrate with high mechanical strength, thermal stability, transparency, surface smoothness, ease of handling, and/or water resistance.

The substrate may be a glass substrate or a plastic substrate. The substrate may be a flexible substrate including plastic having excellent heat resistance and durability, for example, a polyimide, a polyethylene terephthalate (PET), a polycarbonate, a polyethylene naphthalate, a polyarylate (PAR), a polyetherimide, or a combination thereof.

Cathode 110

The cathode 110 may be formed by depositing or sputtering a material for forming the cathode 110 on the substrate. In one or more embodiments, the cathode 110 may be an electron injection electrode. In this embodiment, a material for forming the cathode 110 may be a material having a low work function, for example, a metal, an alloy, an electrically conductive compound, or a combination thereof.

The cathode 110 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), indium tin oxide (ITO), indium zinc oxide (IZO), or a combination thereof. The cathode 110 may be a transmissive electrode, a semi-transmissive electrode, or a reflective electrode.

The cathode 110 may have a single-layered structure, or a multi-layered structure including two or more layers.

Interlayer 130

The interlayer 130 may be located on the cathode 110. The interlayer 130 may include an emission layer.

The interlayer 130 may further include an electron transport region located between the first cathode and the emission layer, and a hole transport region located between the emission layer and the anode 150.

The interlayer 130 may further include metal-containing compounds such as organometallic compounds, inorganic materials such as quantum dots, or the like, in addition to various organic materials.

The interlayer 130 may include: i) at least two emitting units sequentially stacked between the cathode 110 and the anode 150; and ii) a charge generation layer located between the at least two emitting units. When the interlayer 130 includes the at least two emitting units and a charge generation layer, the light-emitting device 10 may be a tandem light-emitting device.

Electron Transport Region in Interlayer 130

The electron transport region may have i) a single-layered structure consisting of a single layer consisting of a single material, ii) a single-layered structure consisting of a single layer including a plurality of different materials, or iii) a multi-layered structure having a plurality of layers including a plurality of different materials.

The electron transport region may include a buffer layer, a hole blocking layer, an electron control layer, an electron transport layer, an electron injection layer, or a combination thereof.

In some embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers of each structure are sequentially stacked on the cathode 110 in each stated order.

The electron transport region (e.g., a buffer layer, a hole blocking layer, an electron control layer, or an electron transport layer in the electron transport region) may include a metal-free compound including at least one π electron-deficient nitrogen-containing $C_1$-$C_{60}$ cyclic group.

In some embodiments, the electron transport region may include a compound represented by Formula 601:

$$[Ar_{601}]_{xe11}\text{-}[(L_{601})_{xe1}\text{-}R_{601}]_{xe21} \qquad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{601})(Q_{602})(Q_{603})$, $—C(=O)(Q_{601})$, $—S(=O)_2(Q_{601})$, $—P(Q_{601})(Q_{602})$, or $—P(=O)(Q_{601})(Q_{602})$, wherein $Q_{601}$ to $Q_{603}$ may each be understood by referring to the description of $Q_1$ provided herein, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, in Formula 601, when xe11 is 2 or greater, at least two $Ar_{601}$ may be bonded to each other via a single bond.

In some embodiments, in Formula 601, $Ar_{601}$ may be a substituted or unsubstituted anthracene group.

In some embodiments, the electron transport region may include a compound represented by Formula 601-1:

Formula 601-1

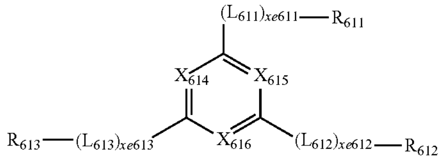

wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each be understood by referring to the description of $L_{601}$ provided herein, xe611 to xe613 may each be understood by referring to the description of xe1 provided herein, $R_{611}$ to $R_{613}$ may each be understood by referring to the description of $R_{601}$ provided herein, and $R_{614}$ to $R_{616}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), tris(8-hydroxy-quinolinato)aluminum ($Alq_3$), bis (2-methyl-8-quinolinolato-N1,O8)-(1,1'-biphenyl-4-olato) aluminum (BAlq), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), or a combination thereof:

ET1

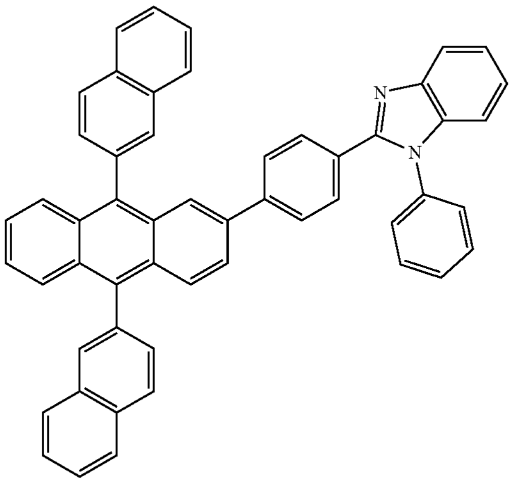

-continued

ET2

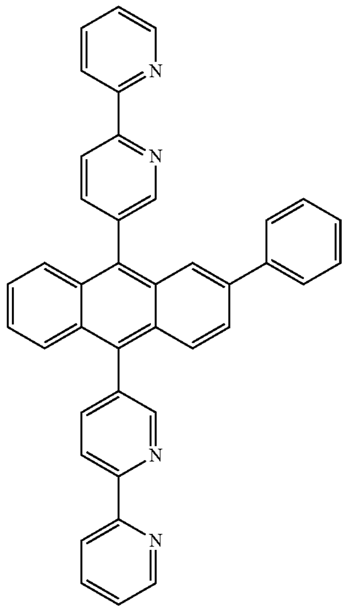

ET3

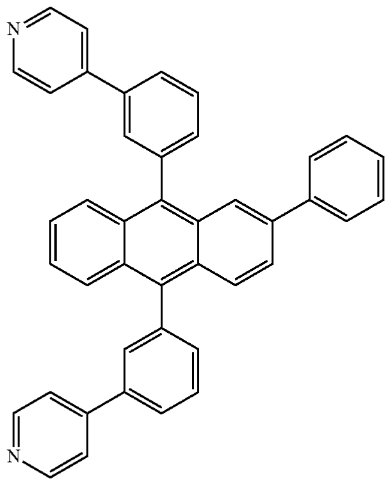

ET4

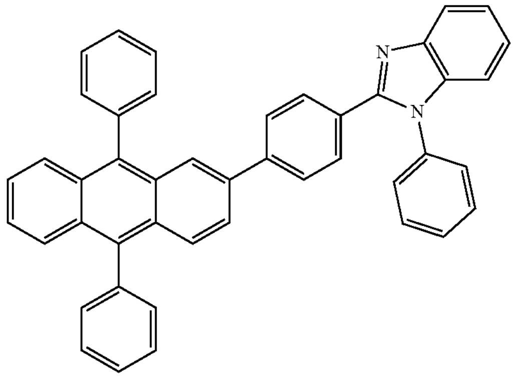

-continued
ET5
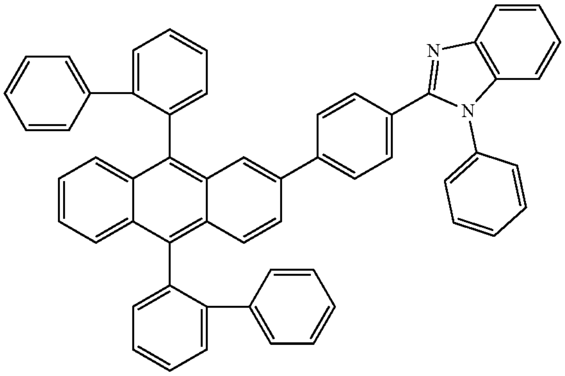
ET6
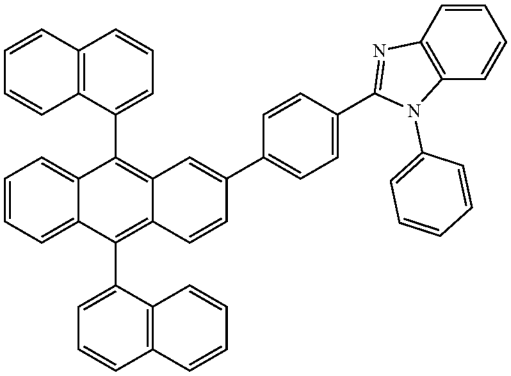
ET7
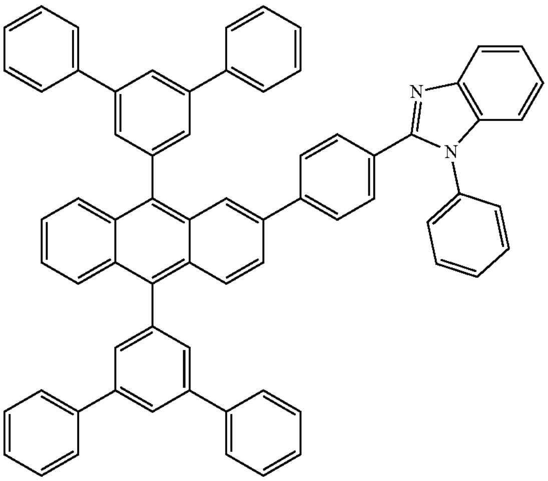
-continued
ET8
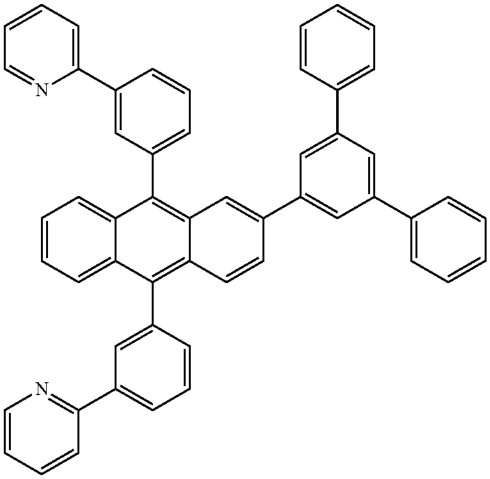
ET9
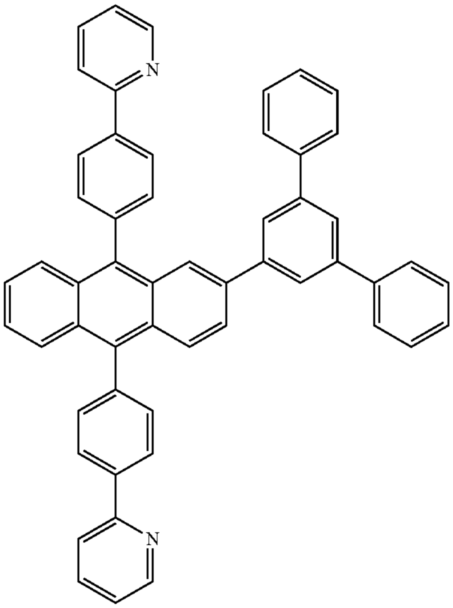

-continued
ET10
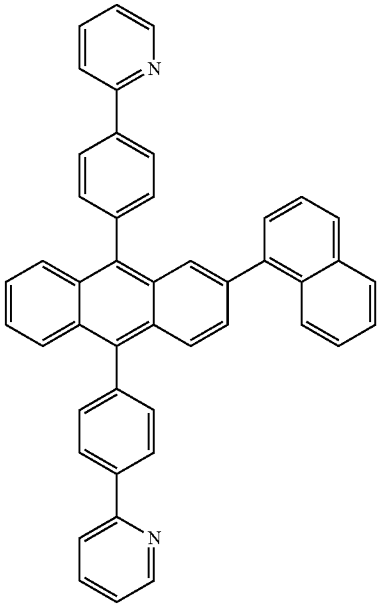
ET11
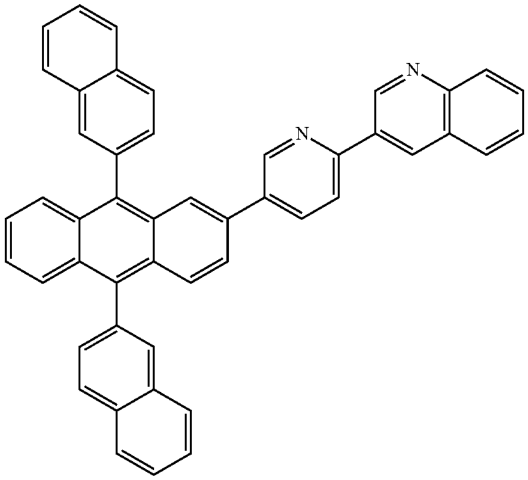
ET12
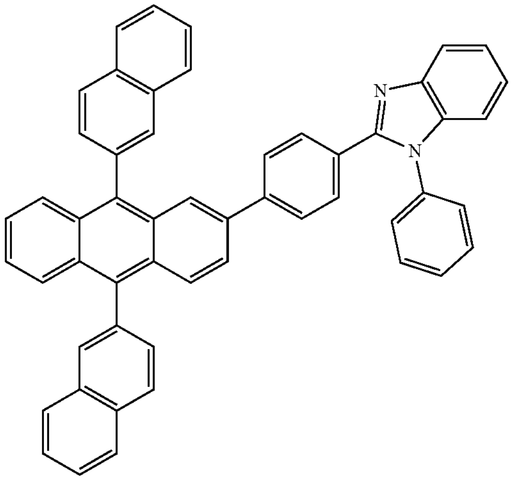
-continued
ET13
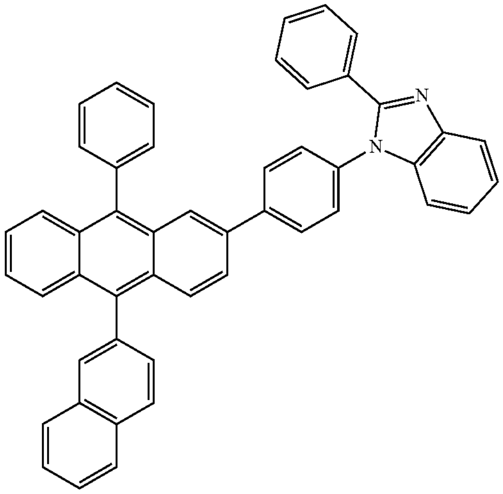
ET14
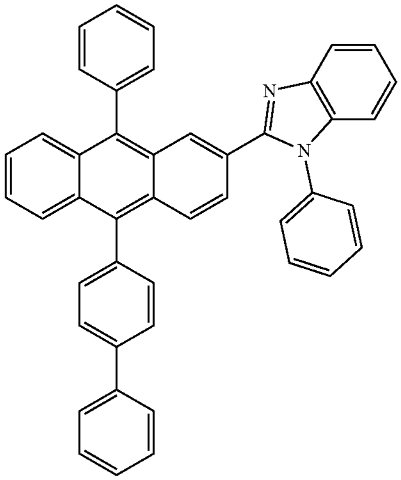
ET15
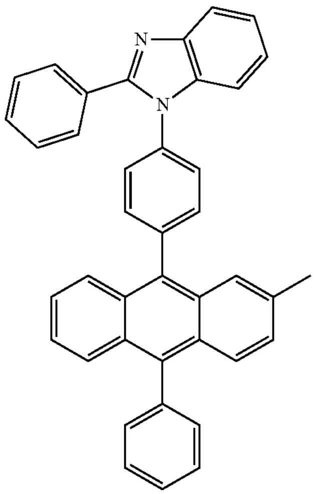

-continued
ET16
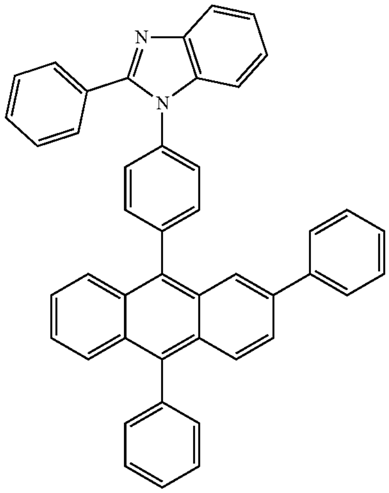
ET17
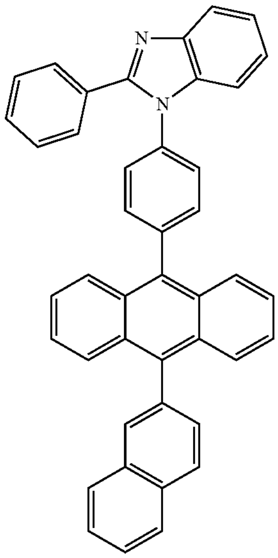
ET18
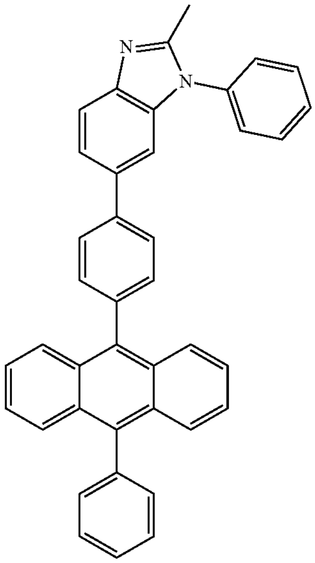
-continued
ET19
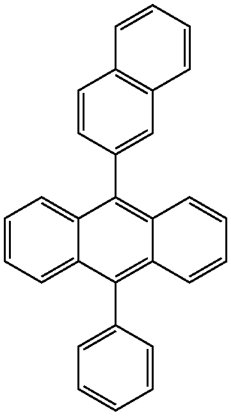
ET20
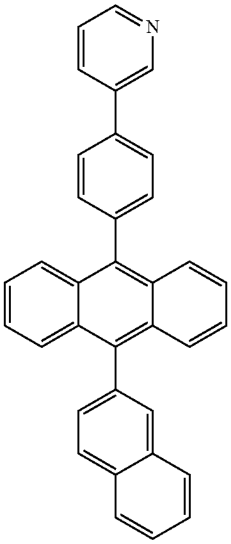
ET21
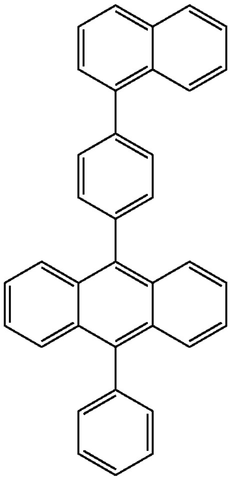

-continued
ET22
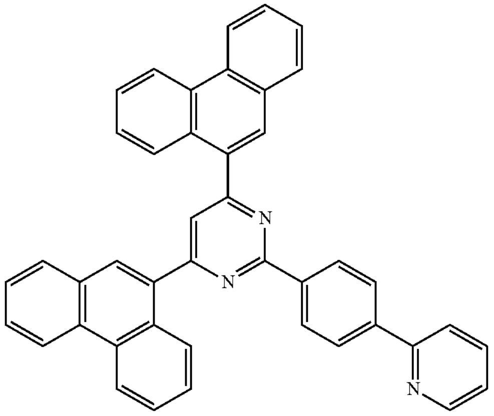
ET23
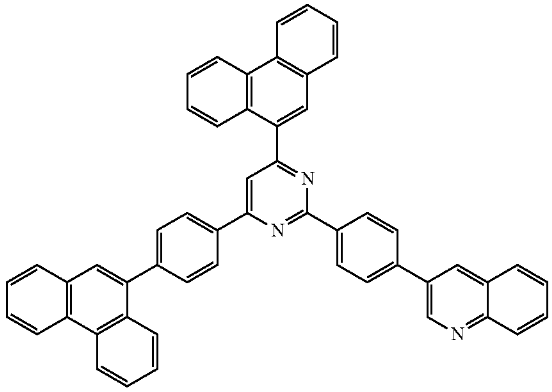
ET24
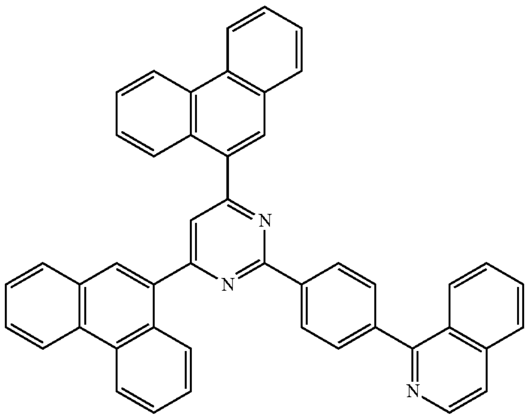
-continued
ET25
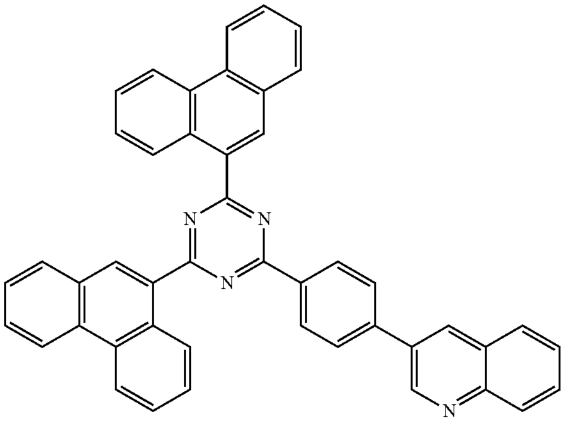
ET26
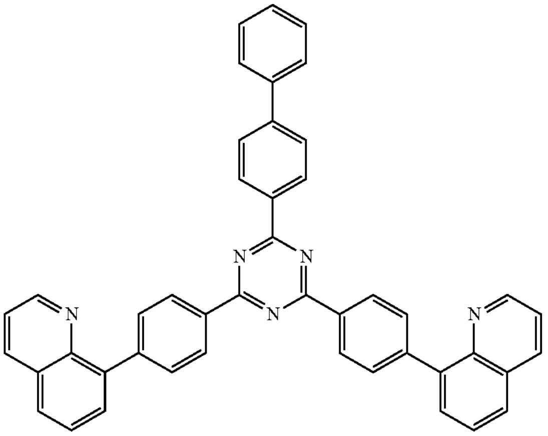
ET27
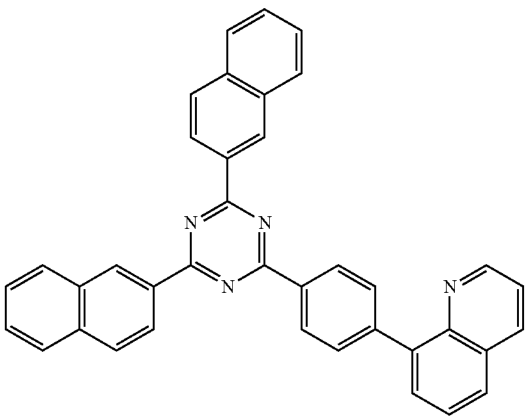

ET28
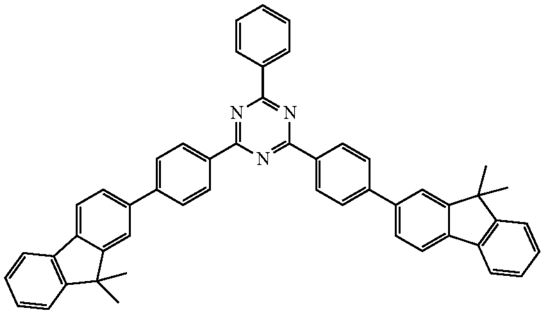
ET29
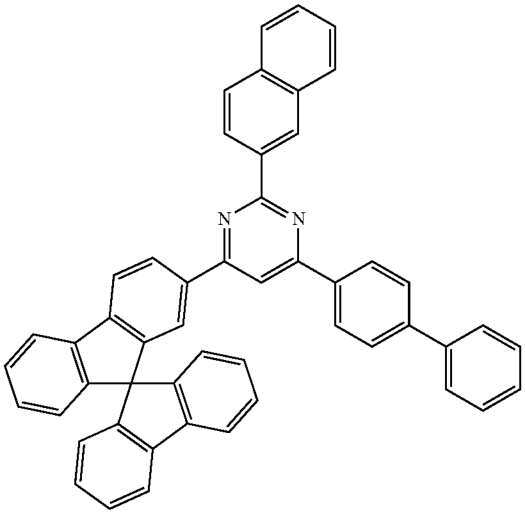
ET30
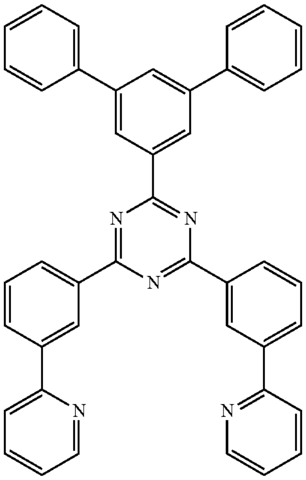
ET31
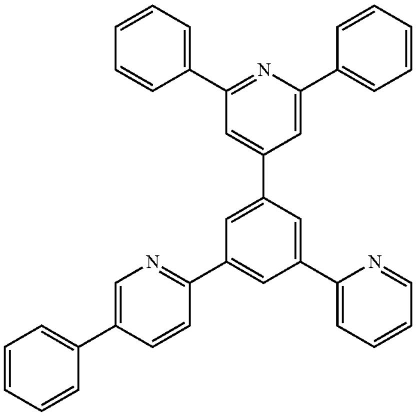
ET32
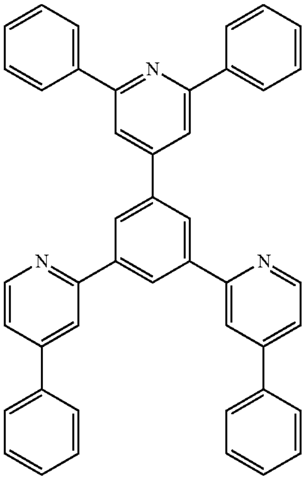
ET33
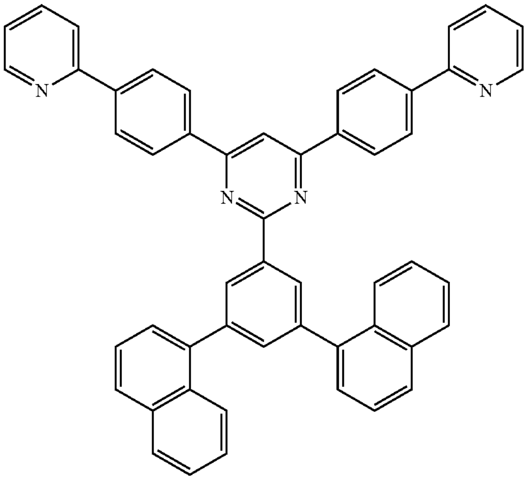

-continued
ET34
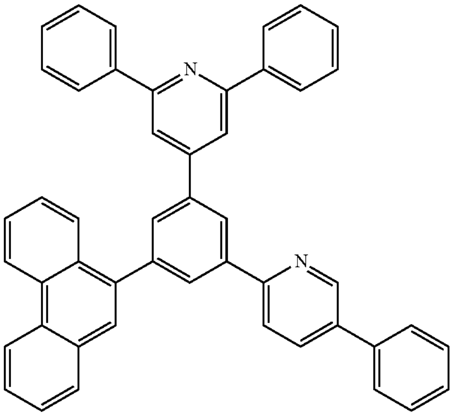
ET35
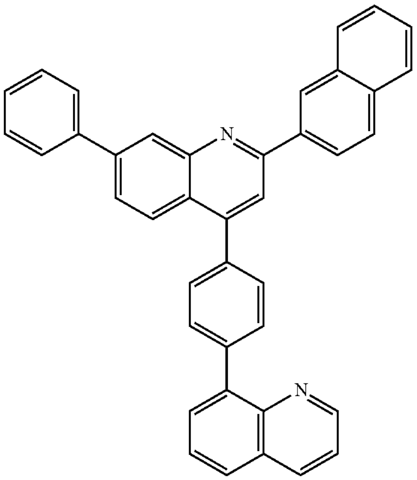
ET36
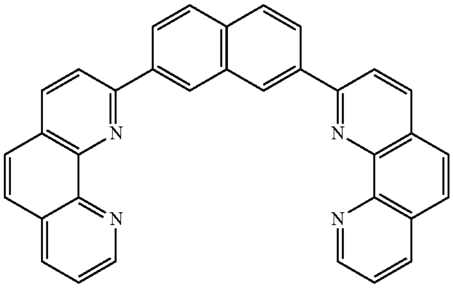
ET37
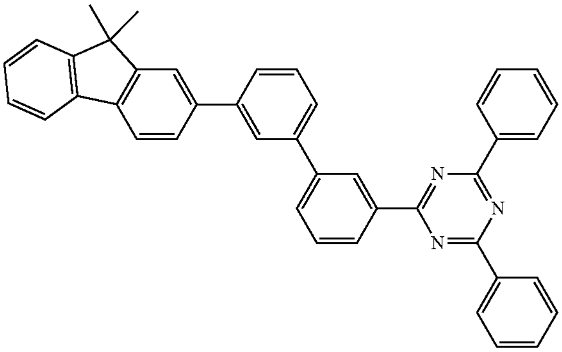
-continued
ET38
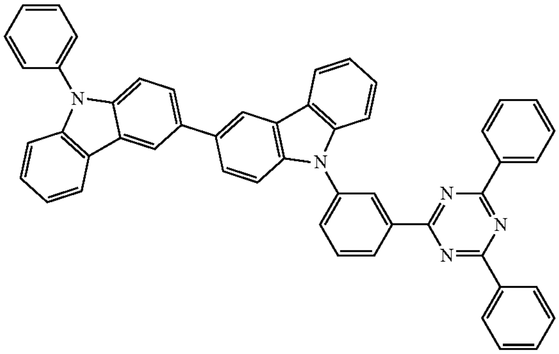
ET39
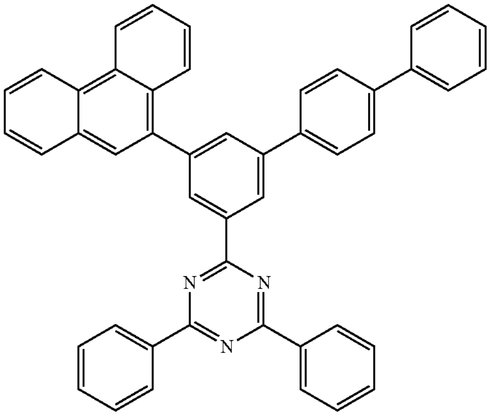
ET40
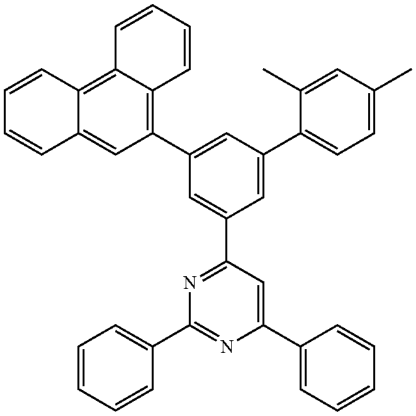

-continued
ET41
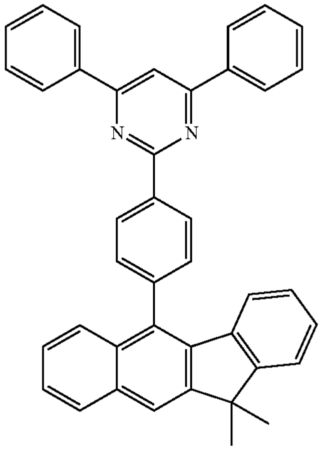
ET42
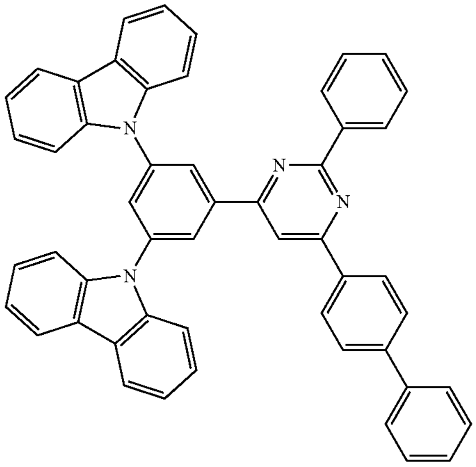
ET43
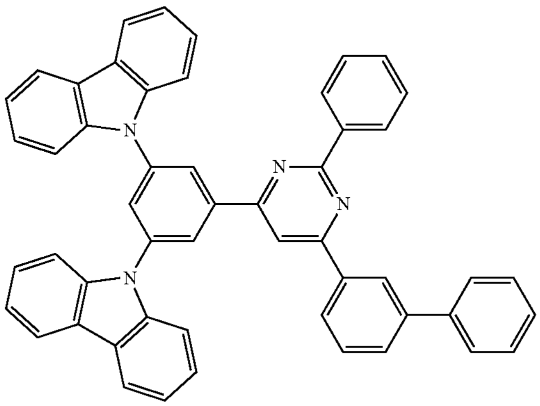
-continued
ET44
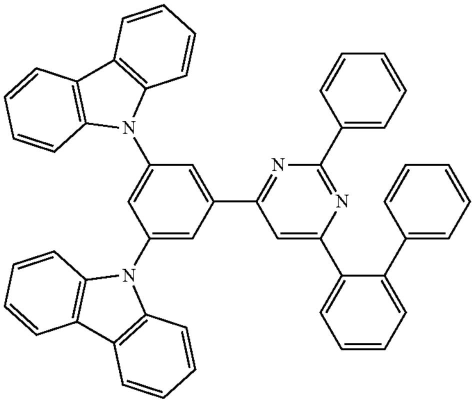
ET45
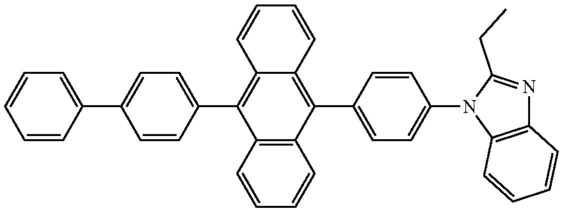
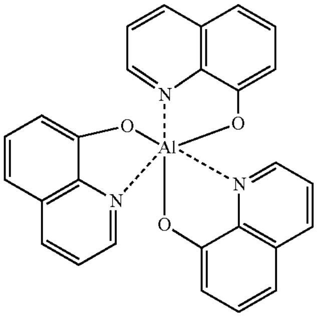
Alq3
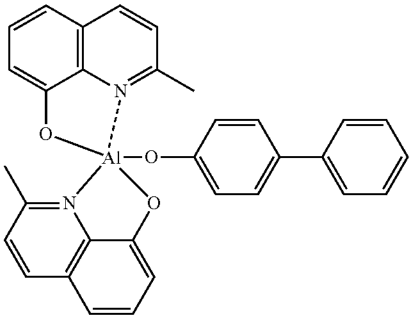
BAlq
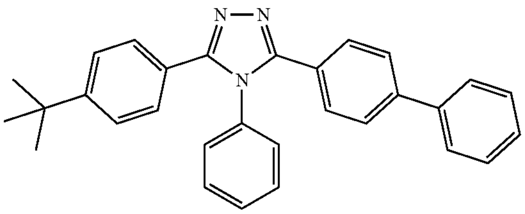
TAZ -continued

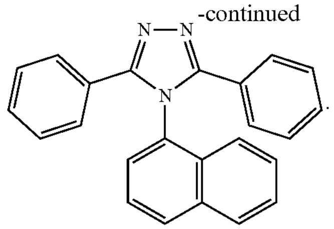

NTAZ

The thickness of the electron transport region may be in a range of about 100 Å to about 5,000 Å, and in some embodiments, about 160 Å to about 4,000 Å. When the electron transport region includes a buffer layer, a hole blocking layer, an electron control layer, an electron transport layer, or a combination thereof, the thicknesses of the buffer layer, the hole blocking layer, or the electron control layer may each independently be in a range of about 20 Å to about 1,000 Å, for example, about 30 Å to about 300 Å, and the thickness of the electron transport layer may be in a range of about 100 Å to about 1,000 Å, for example, about 150 Å to about 500 Å. Without wishing to be bound to theory, when the thicknesses of the buffer layer, the hole blocking layer, the electron control layer, the electron transport layer, and/or the electron transport region are each within these ranges, excellent electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or a combination thereof. A metal ion of the alkali metal complex may be a lithium (Li) ion, a sodium (Na) ion, a potassium (K) ion, a rubidium (Rb) ion, a cesium (Cs) ion, or a combination thereof. A metal ion of the alkaline earth metal complex may be a beryllium (Be) ion, a magnesium (Mg) ion, a calcium (Ca) ion, a strontium (Sr) ion, a barium (Ba) ion, or a combination thereof. Each ligand coordinated with the metal ion of the alkali metal complex and the alkaline earth metal complex may independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or a combination thereof.

For example, the metal-containing material may include a Li complex. The Li complex may include, e.g., Compound ET-D1 (LiQ) or Compound ET-D2:

ET-D1

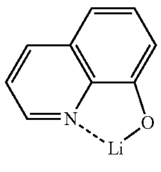

-continued

ET-D2

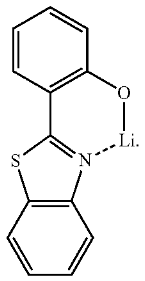

In some embodiments, the electron transport layer may include the metal oxide. For example, the electron transport layer may essentially consist of the metal oxide and include less than 1 parts by weight of impurities, for example, an organic material, based on 100 parts by weight of the electron transport layer. The metal oxide may be understood by referring to the description of the metal oxide provided herein.

The electron transport region may include an electron injection layer that facilitates injection of electrons from the anode 150. The electron injection layer may be in direct contact with the anode 150.

The electron injection layer may have i) a single-layered structure consisting of a single layer consisting of a single material, ii) a single-layered structure consisting of a single layer including a plurality of different materials, or iii) a multi-layered structure having a plurality of layers including a plurality of different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or a combination thereof.

The alkali metal may be Li, Na, K, Rb, Cs, or a combination thereof. The alkaline earth metal may be Mg, Ca, Sr, Ba, or a combination thereof. The rare earth metal may be Sc, Y, Ce, Tb, Yb, Gd, or a combination thereof.

The alkali metal-containing compound, the alkaline earth metal-containing compound, and the rare earth metal-containing compound may respectively be an oxide, a halide (e.g., fluorides, chlorides, bromides, or iodides), a telluride, or a combination thereof of each of the alkali metal, the alkaline earth metal, and/or the rare earth metal.

The alkali metal-containing compound may be an alkali metal oxide such as $Li_2O$, $Cs_2O$, or $K_2O$, alkali metal halides such as LiF, NaF, CsF, KF, LiI, NaI, CsI, KI, or the like, or a combination thereof. The alkaline earth-metal-containing compound may include alkaline earth-metal oxides, such as BaO, SrO, CaO, $Ba_xSr_{1-x}O$ (wherein x is a real number satisfying $0<x<1$), $Ba_xCa_{1-x}O$ (wherein x is a real number satisfying $0<x<1$), or the like, or a combination thereof. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or the like, or a combination thereof. In some embodiments, the rare earth metal-containing compound may include a lanthanide metal telluride. Examples of the lanthanide metal telluride include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, or a combination thereof.

The alkali metal complex, the alkaline earth metal complex, and the rare earth metal complex may include: i) one of ions of the alkali metal, alkaline earth metal, and rare earth metal described above and ii) a ligand bond to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or a combination thereof.

The electron injection layer may include or consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or a combination thereof, as described above. In some embodiments, the electron injection layer may further include an organic material (e.g., a compound represented by Formula 601).

In some embodiments, the electron injection layer may consist of i) an alkali metal-containing compound (e.g., alkali metal halide), or ii) a) an alkali metal-containing compound (e.g., alkali metal halide); and b) an alkali metal, an alkaline earth metal, a rare earth metal, or a combination thereof. In some embodiments, the electron injection layer may be a KI:Yb co-deposition layer, a RbI:Yb co-deposition layer, or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or a combination thereof may be homogeneously or non-homogeneously dispersed in a matrix including the organic material.

The thickness of the electron injection layer may be in a range of about 1 Å to about 100 Å, and in some embodiments, about 3 Å to about 90 Å. When the thickness of the electron injection layer is within any of these ranges, excellent electron injection characteristics may be obtained without a substantial increase in driving voltage.

Emission Layer in Interlayer 130

When the light-emitting device 10 is a full color light-emitting device, the emission layer may be patterned into a red emission layer, a green emission layer, and/or a blue emission layer, according to a sub-pixel region. In one or more embodiments, the emission layer may have a stacked structure. The stacked structure may include two or more layers selected from a red emission layer, a green emission layer, and a blue emission layer. The two or more layers may be in direct contact with each other. In some embodiments, the two or more layers may be separated from each other. In one or more embodiments, the emission layer may include two or more materials. The two or more materials may include a red light-emitting material, a green light-emitting material, or a blue light-emitting material. The two or more materials may be mixed with each other in a single layer. The two or more materials mixed with each other in the single layer may emit white light.

The emission layer may include a host and a dopant. The dopant may be a phosphorescent dopant, a fluorescent dopant, or a combination thereof.

The amount of the dopant in the emission layer may be in a range of about 0.01 parts by weight to about 15 parts by weight based on 100 parts by weight of the host.

In some embodiments, the emission layer may include one or more quantum dots.

The emission layer may include a delayed fluorescence material. The delayed fluorescence material may serve as a host or a dopant in the emission layer.

The thickness of the emission layer may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

Host

The host may include a compound represented by Formula 301:

$$[Ar_{301}]_{xb11}\text{-}[(L_{301})_{xb1}\text{-}R_{301}]_{xb21} \quad \text{Formula 301}$$

wherein, in Formula 301, $Ar_{301}$ and $L_{301}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, —$P(Q_{301})(Q_{302})$, or —$P(=O)(Q_{301})(Q_{302})$, xb21 may be an integer from 1 to 5, and $Q_{301}$ to $Q_{303}$ may each be understood by referring to the description of $Q_1$ provided herein.

In some embodiments, when xb11 in Formula 301 is 2 or greater, at least two of $Ar_{301}$ may be bonded together via a single bond.

In some embodiments, the host may include a compound represented by Formula 301-1, a compound represented by Formula 301-2, or a combination thereof:

Formula 301-1

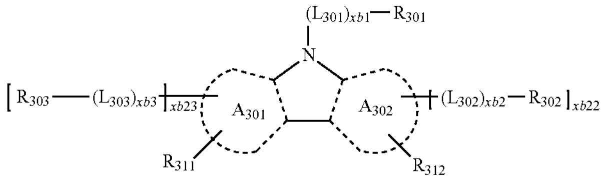

Formula 301-2

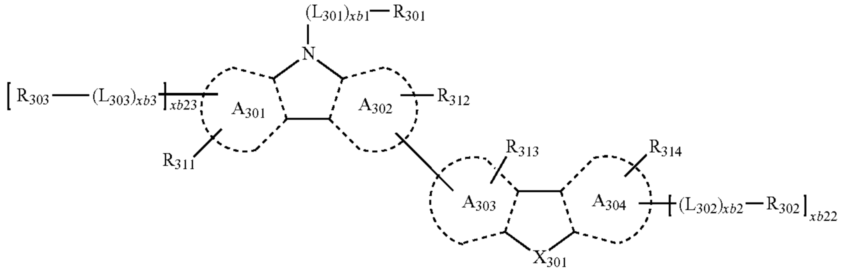

wherein, in Formulae 301-1 to 301-2, ring $A_{301}$ to ring $A_{304}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may respectively be understood by referring to the descriptions of $L_{301}$, xb1, and $R_{301}$ provided herein, $L_{302}$ to $L_{304}$ may each be understood by referring to the description of $L_{301}$ provided herein, xb2 to xb4 may each be understood by referring to the description of xb1 provided herein, and $R_{302}$ to $R_{305}$ and $R_{311}$ to $R_{314}$ may each be understood by referring to the description of $R_{301}$ provided herein.

In some embodiments, the host may include an alkaline earth-metal complex, a post-transitional metal complex, or a combination thereof. For example, the host may include a Be complex (e.g., Compound H55), a Mg complex, a Zn complex, or a combination thereof.

In some embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or a combination thereof:

H1

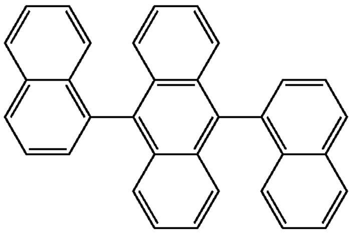

H2

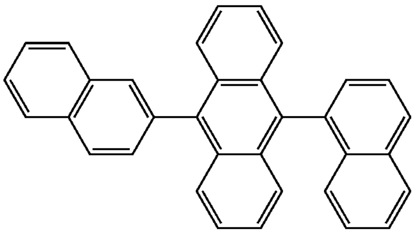

H3

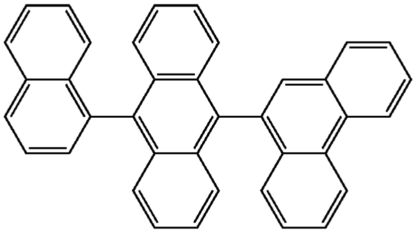

H4

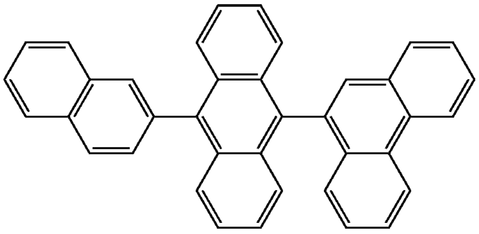

-continued
H5
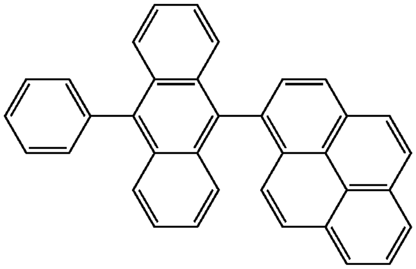
H6
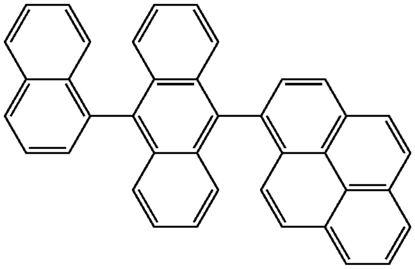
H7
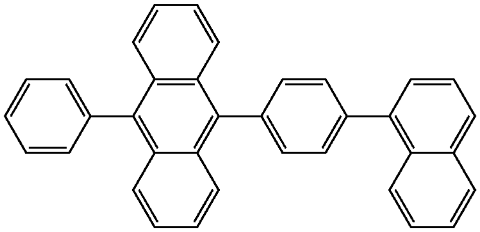
H8
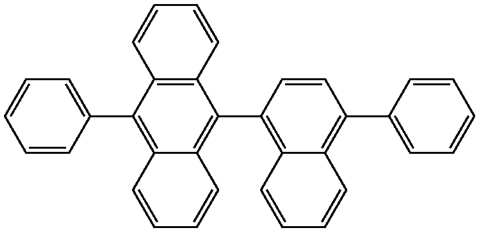
H9
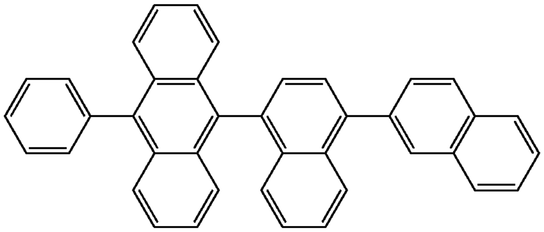
H10
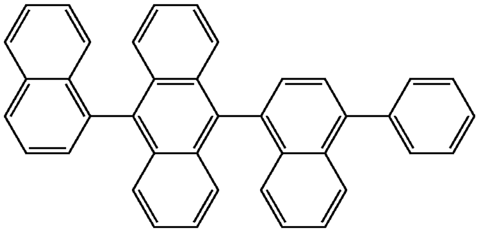
H11
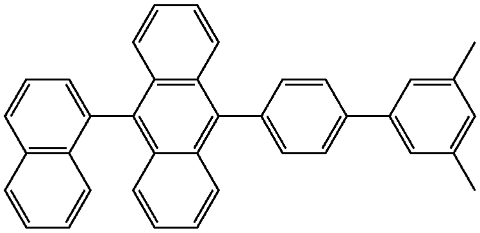
H12
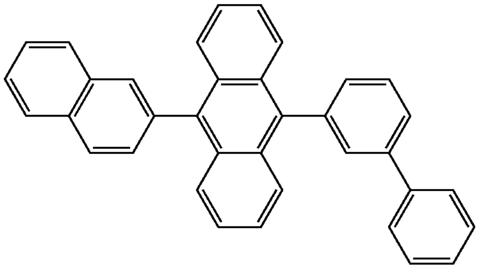
H13
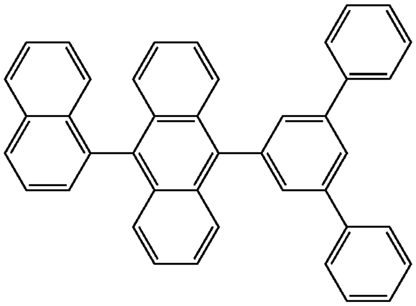
H14
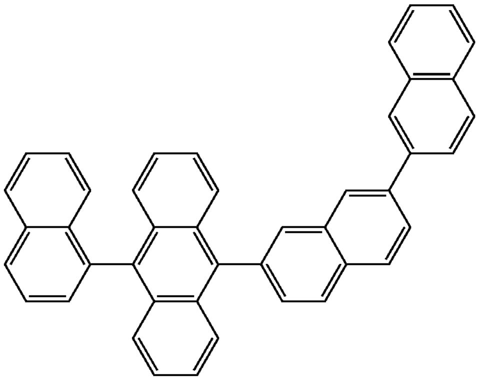

-continued
H15
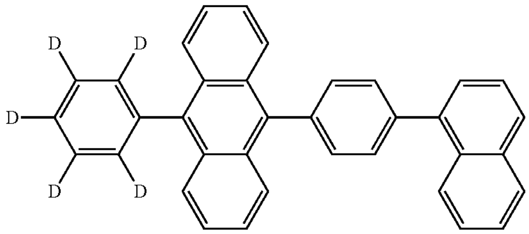
H16
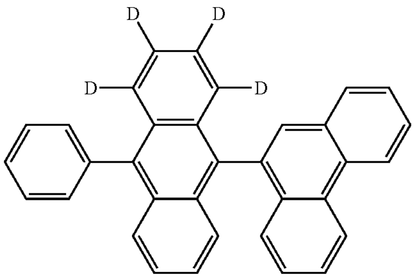
H17
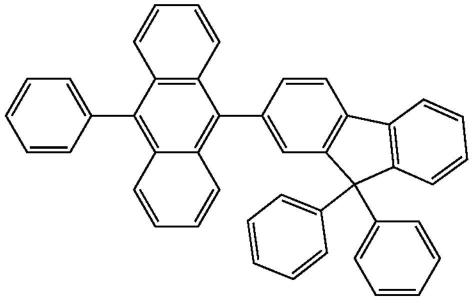
H18
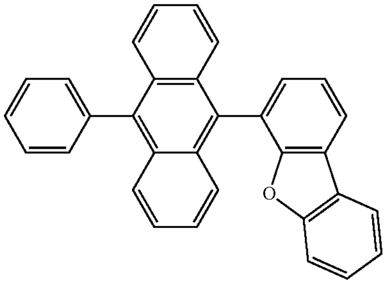
H19
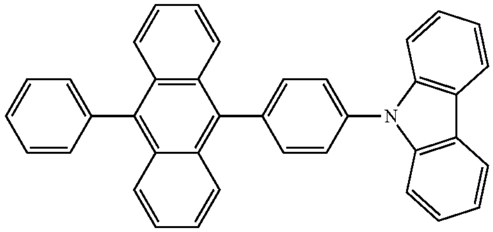
H20
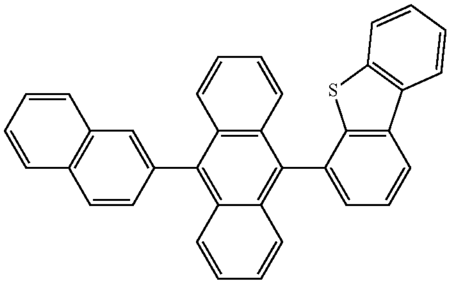
H21
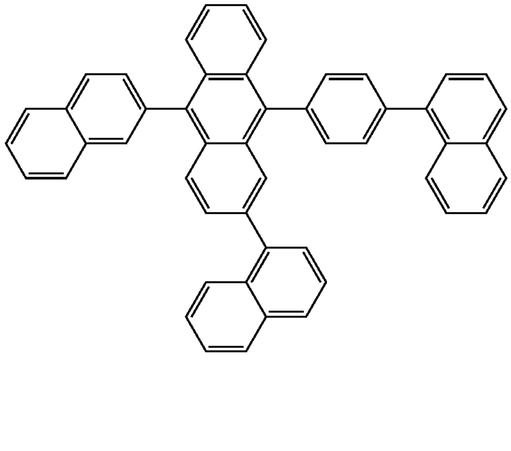
H22
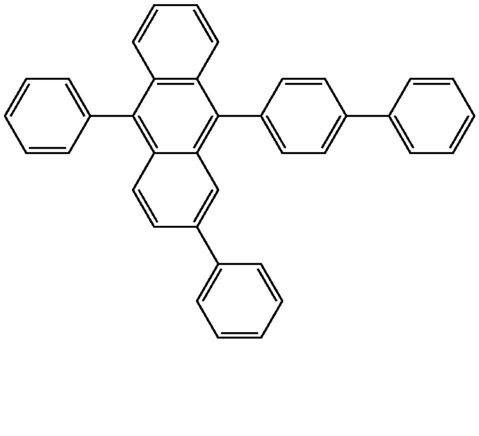

-continued
H23
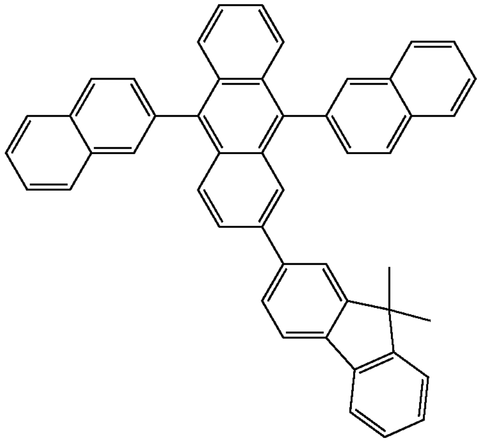
H24
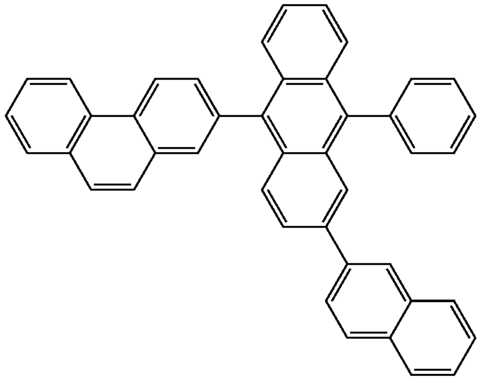
H25
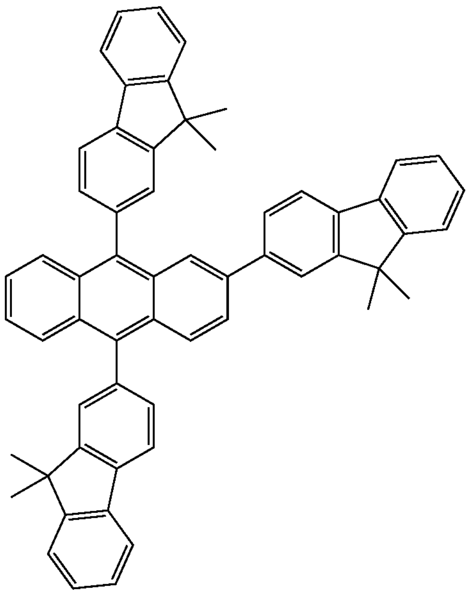
H26
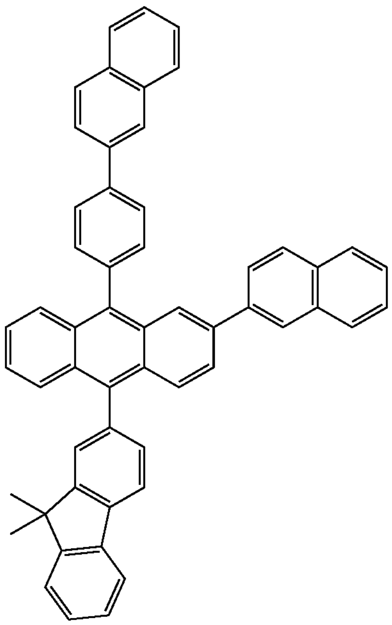
H27
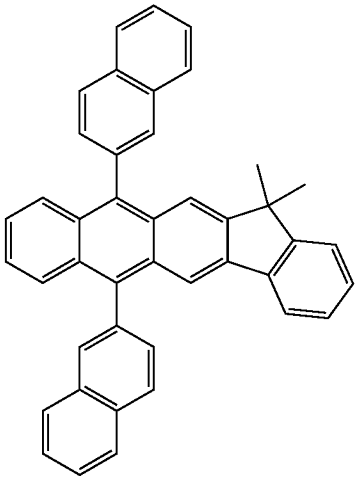
H28
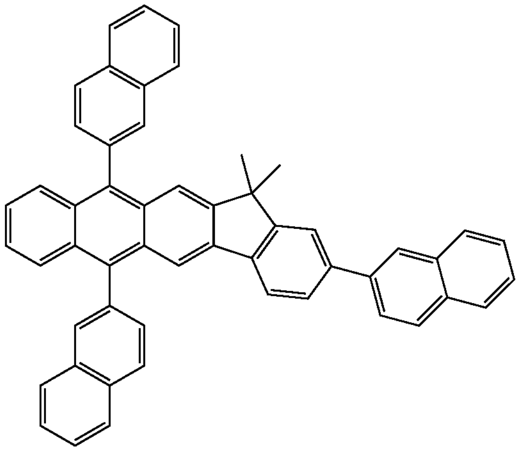

-continued
H29
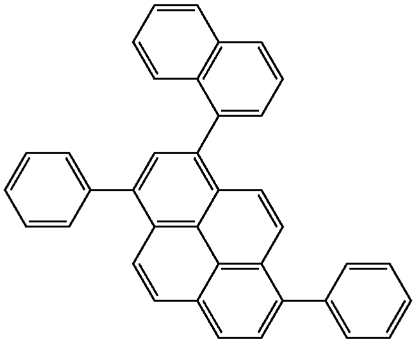
H30
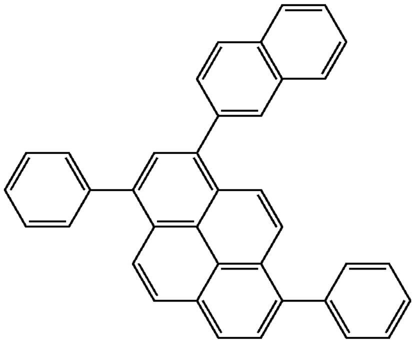
H31
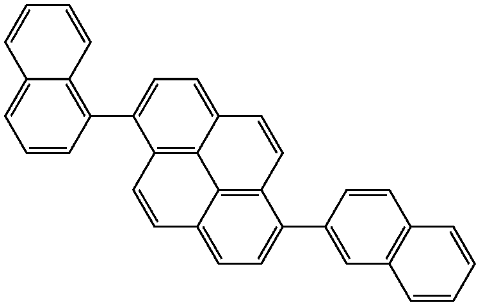
H32
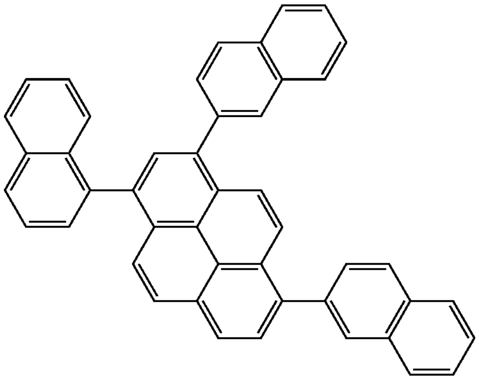
H33
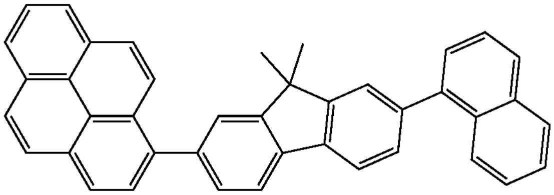
H34
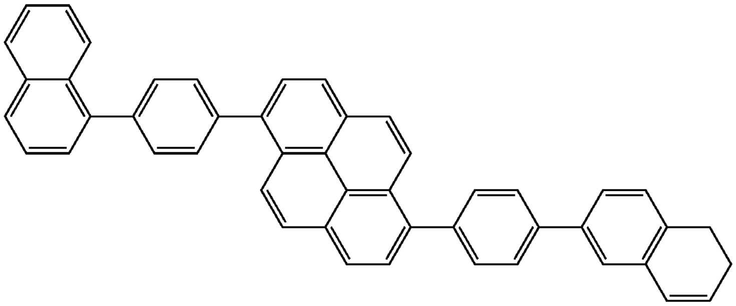

-continued
H35
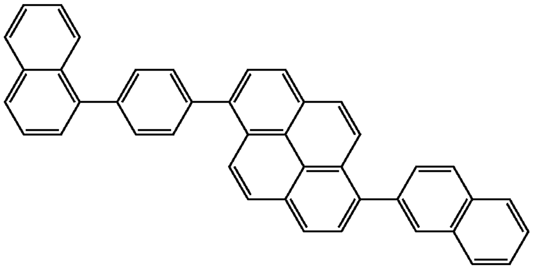
H36
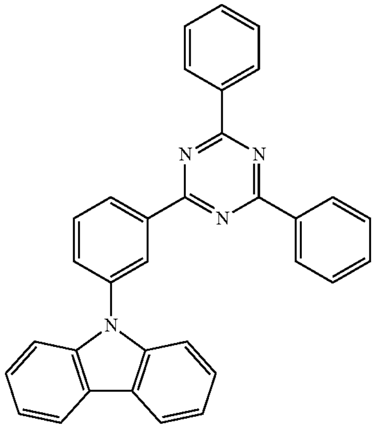
H37
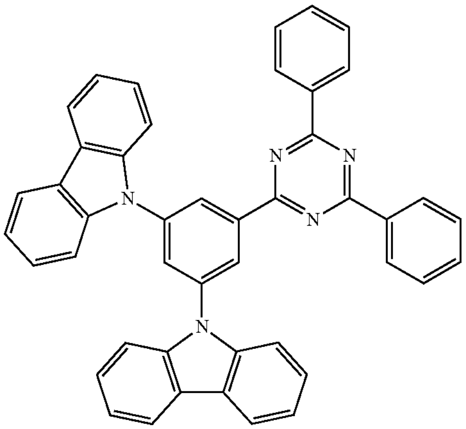
H38
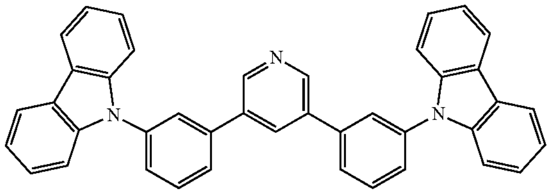
H39
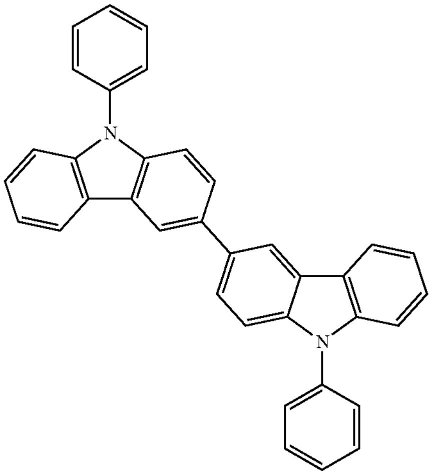
H40
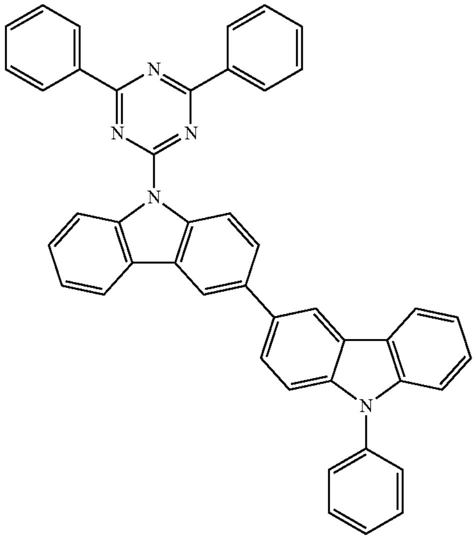

-continued
H41
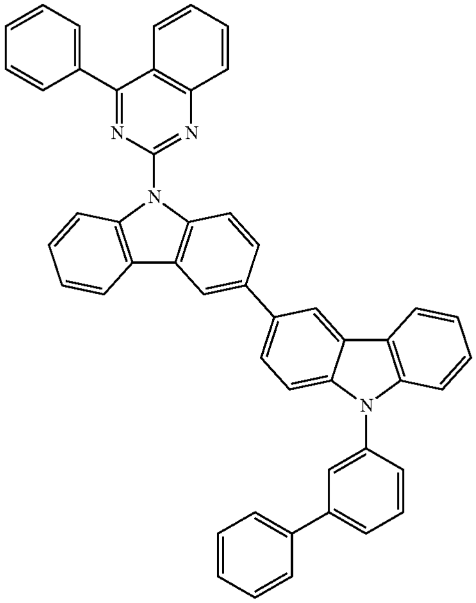
H42
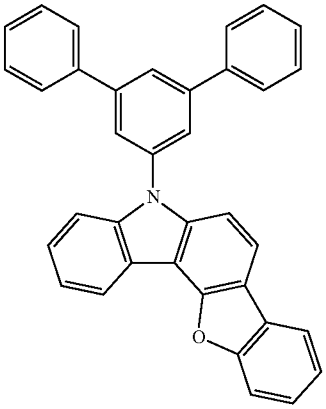
H43
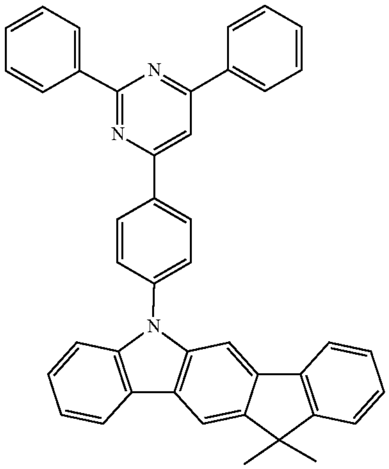
H44
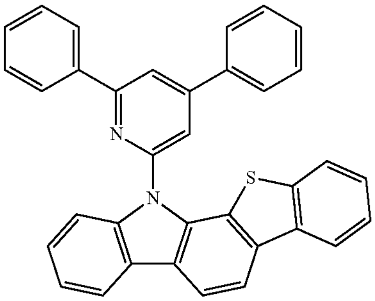
H45
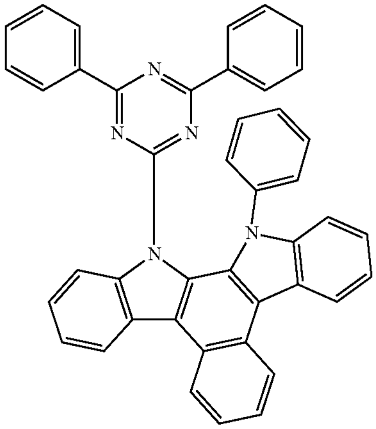
H46
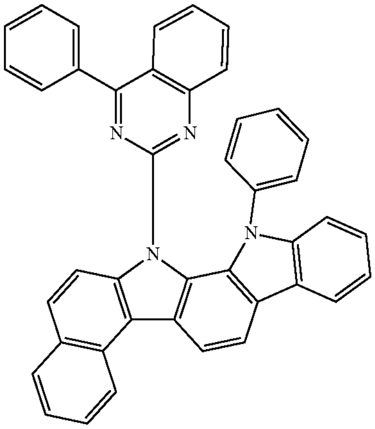

-continued
H47
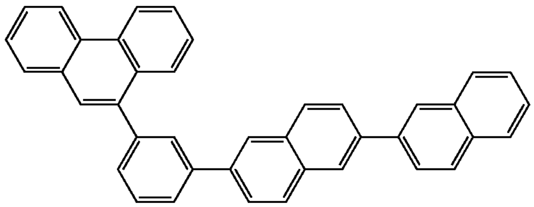
H48
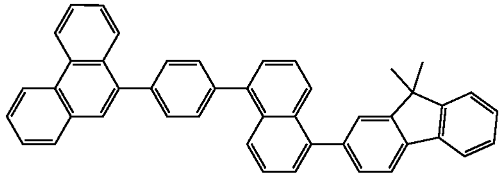
H49
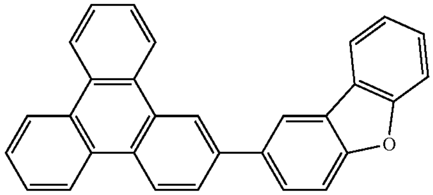
H50
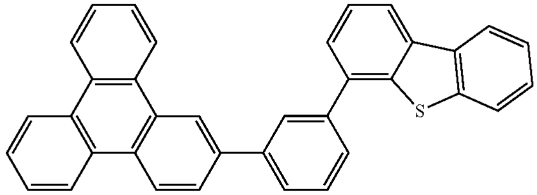
H51
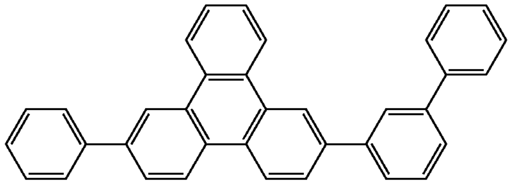
H52
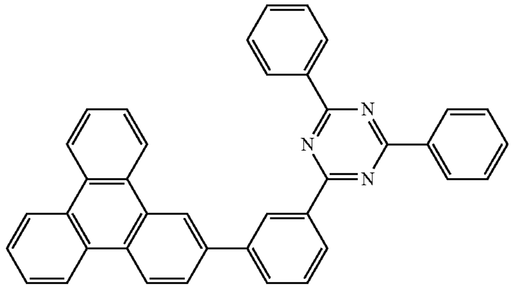
H53
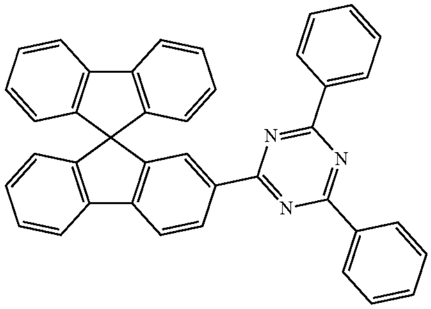
H54
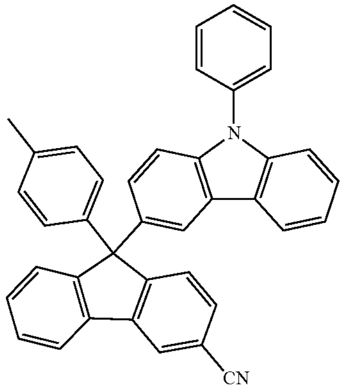
H55
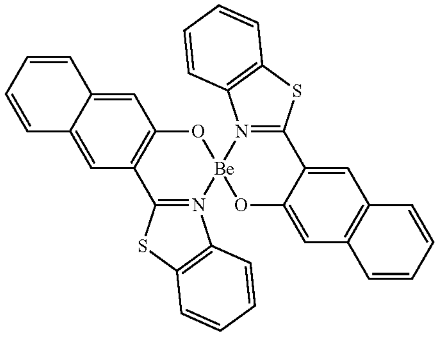
H56
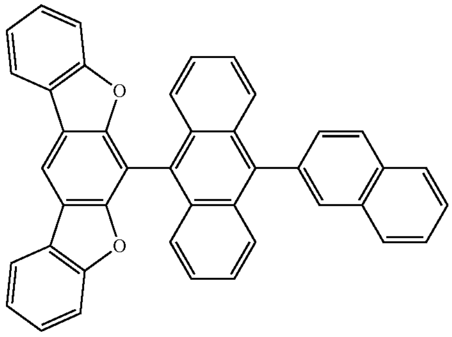

-continued
H57
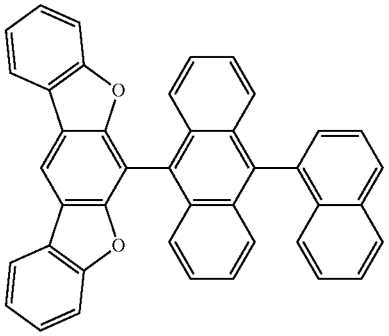
H58
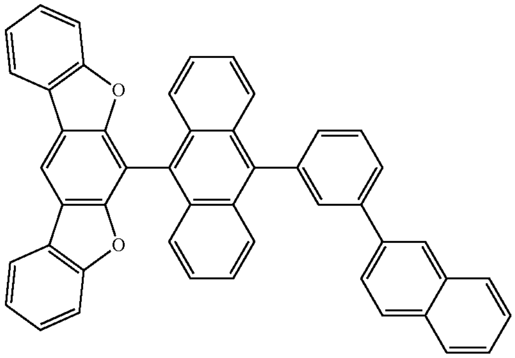
H59
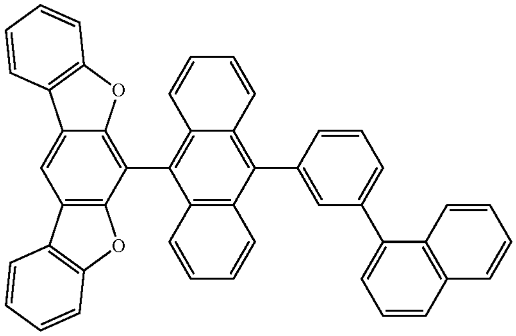
H60
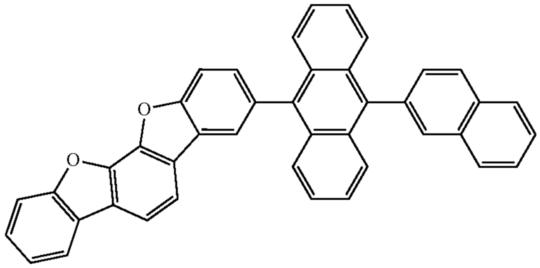
H61
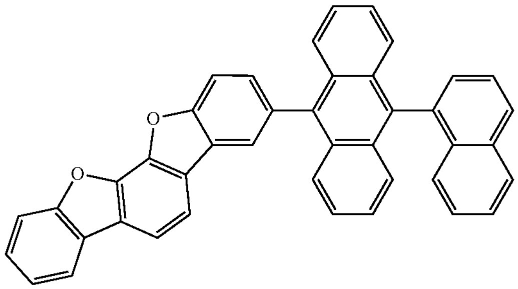
H62
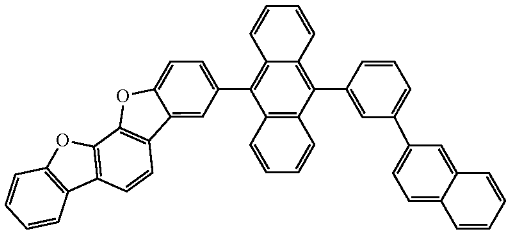
H63
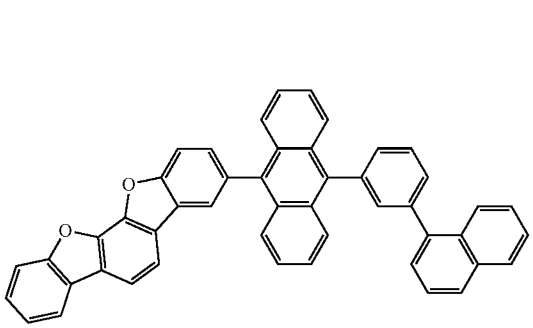
H64
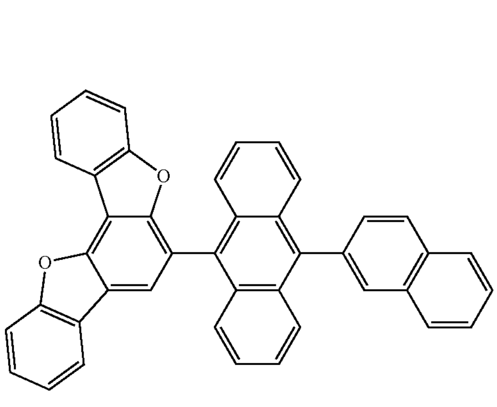

-continued
H65
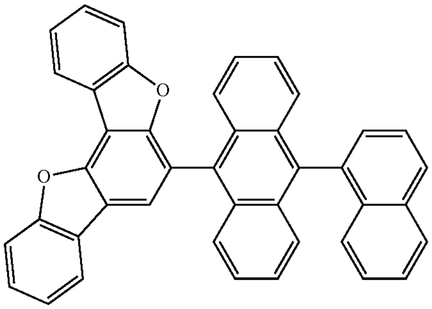
H66
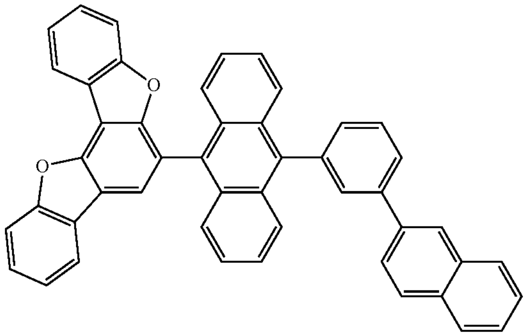
H67
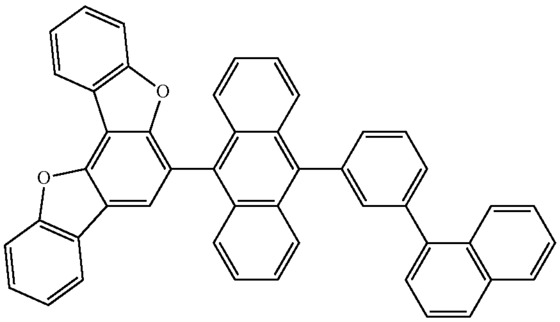
H68
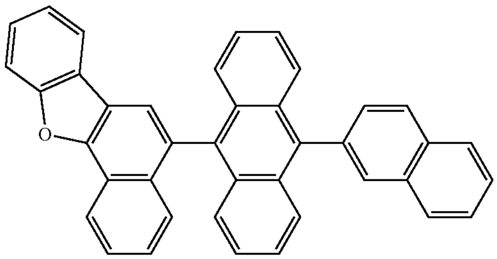
H69
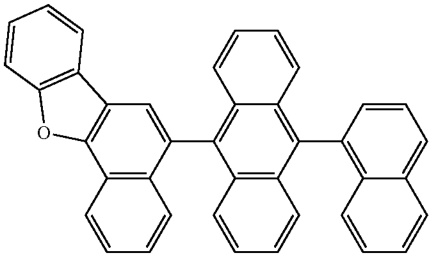
H70
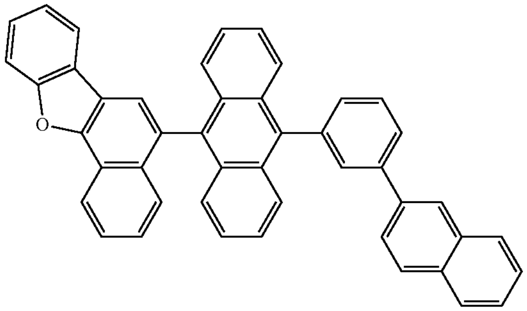
H71
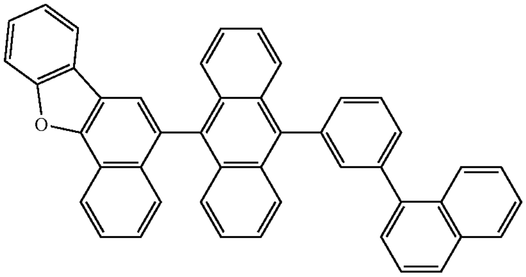
H72
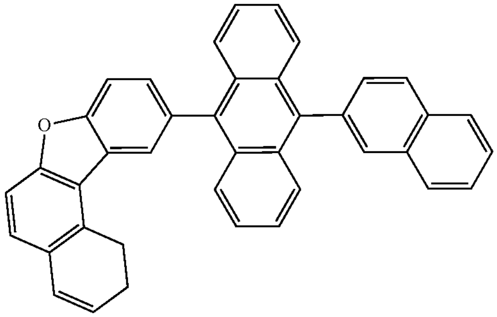

-continued
H73
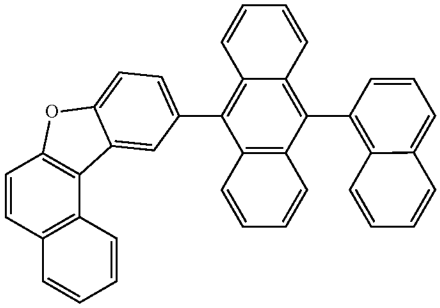
H74
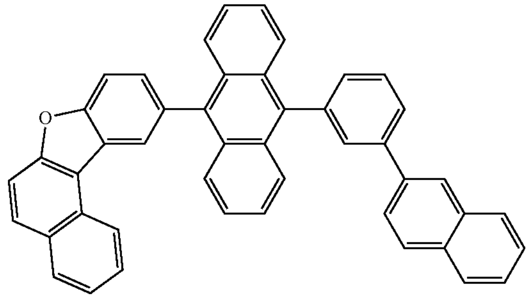
H75
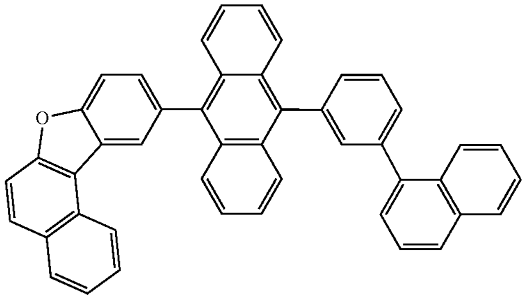
H76
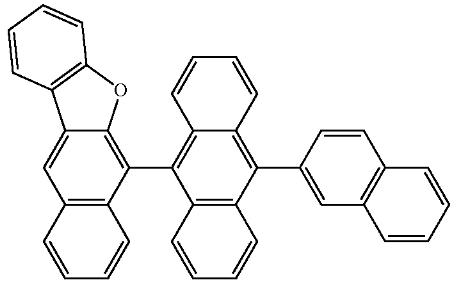
H77
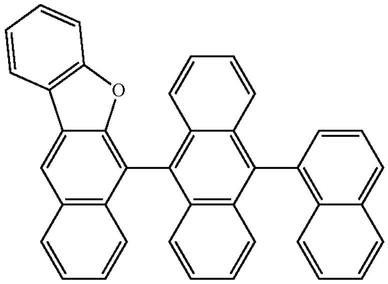
H78
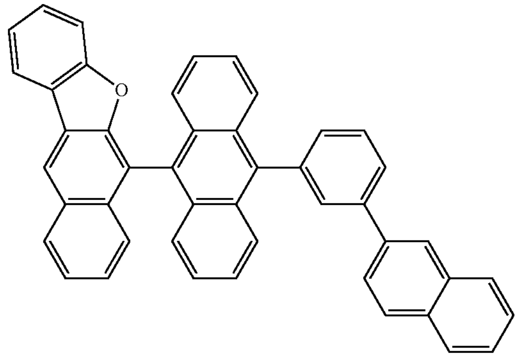
H79
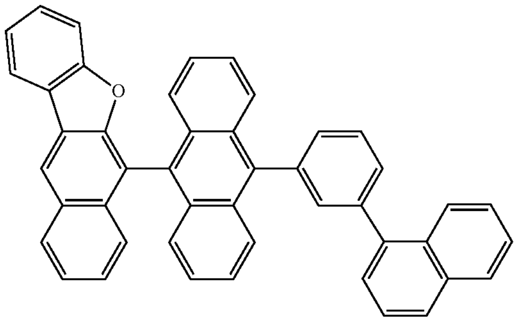
H80
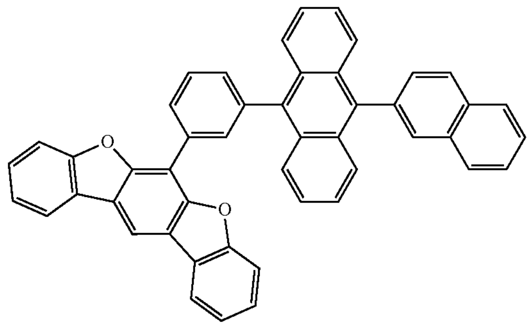

-continued
H81
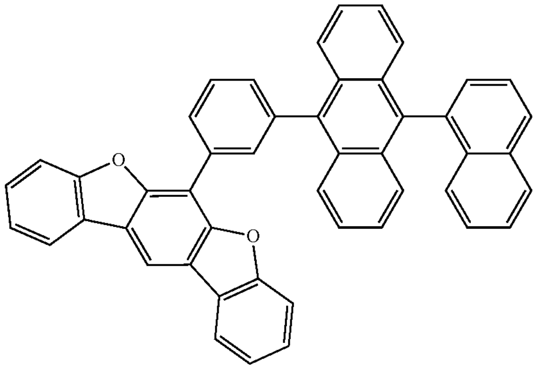
H82
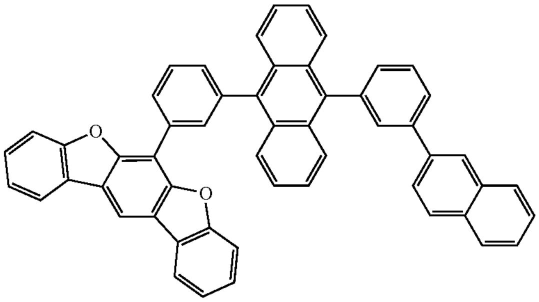
H83
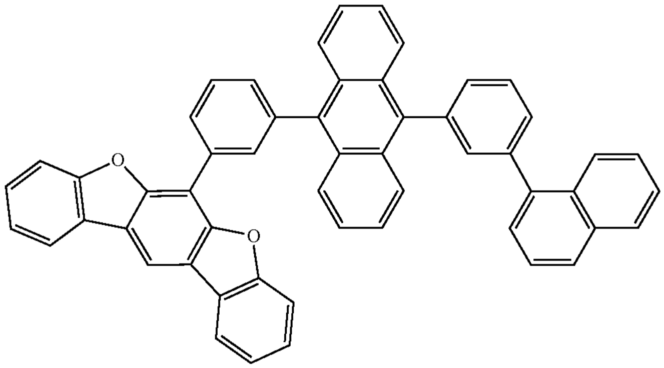
H84
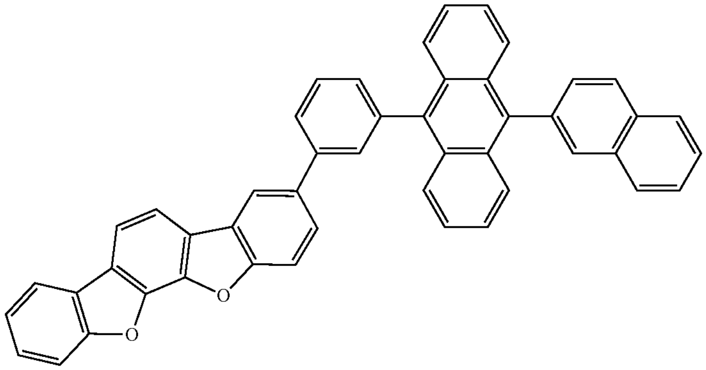
H85
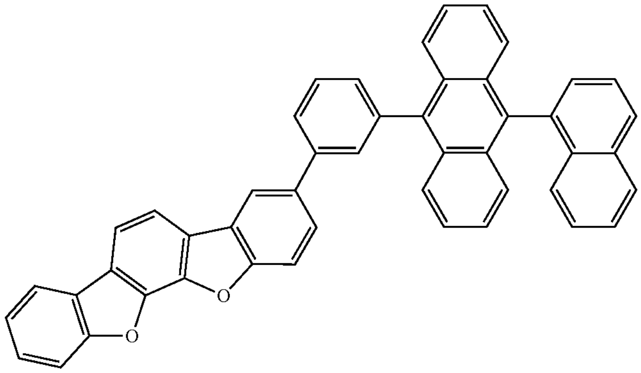

-continued
H86
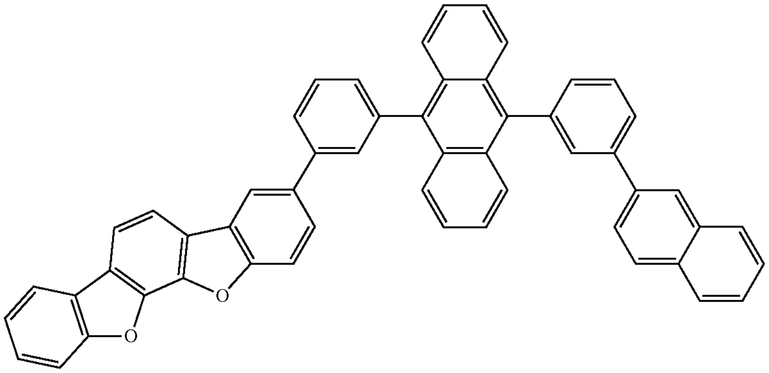
H87
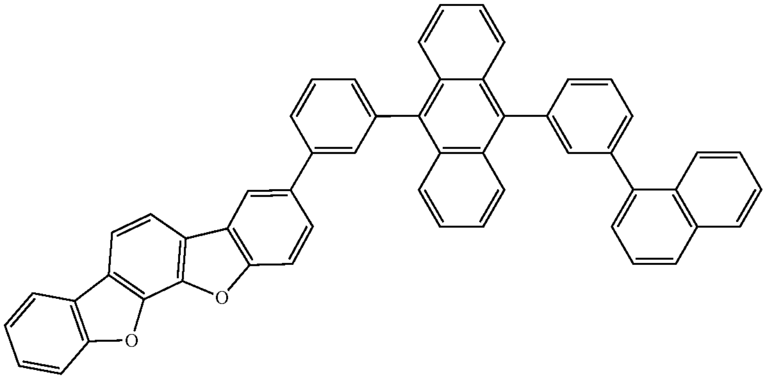
H88
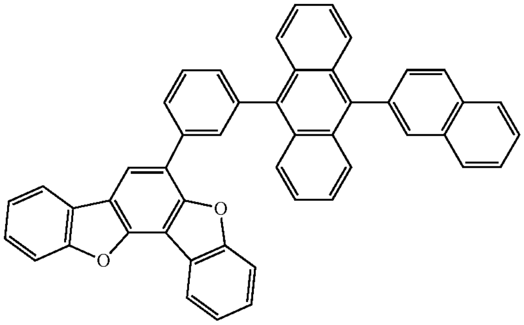
H89
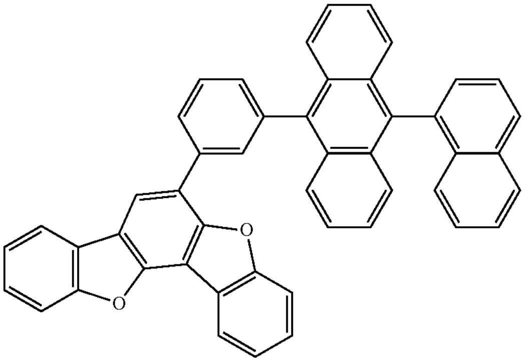
H90
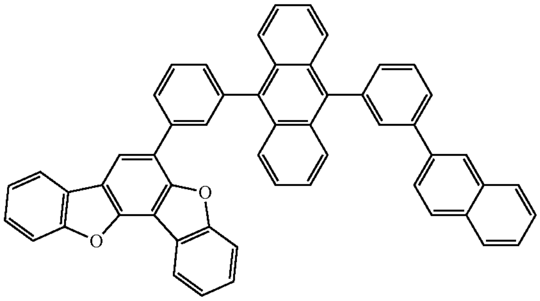
H91
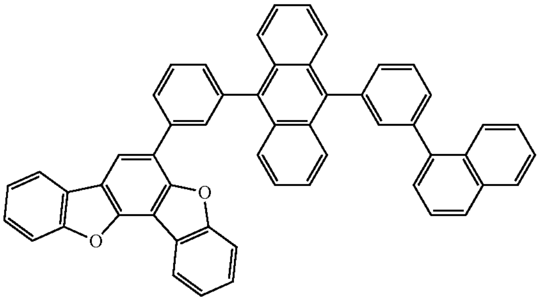

-continued
H92
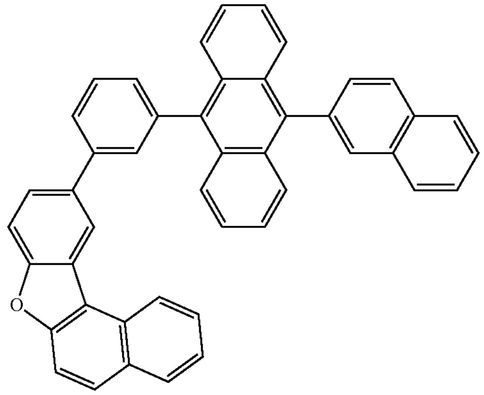
H93
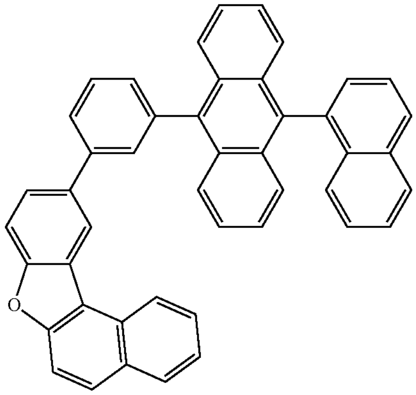
H94
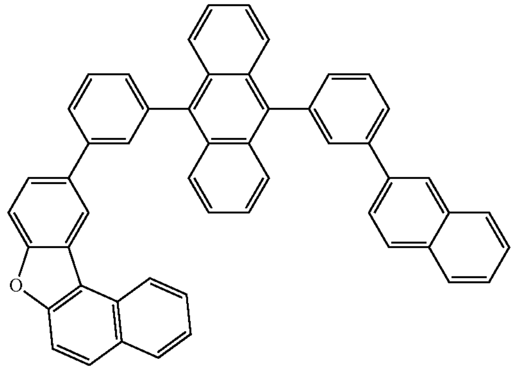
H95
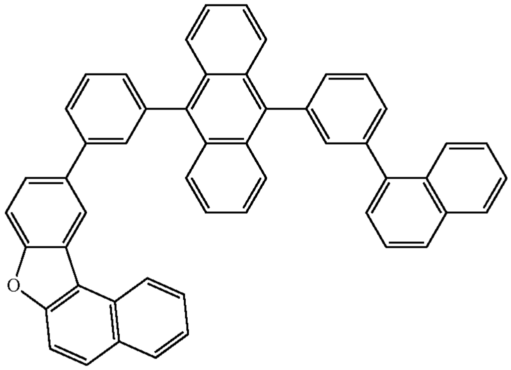
H96
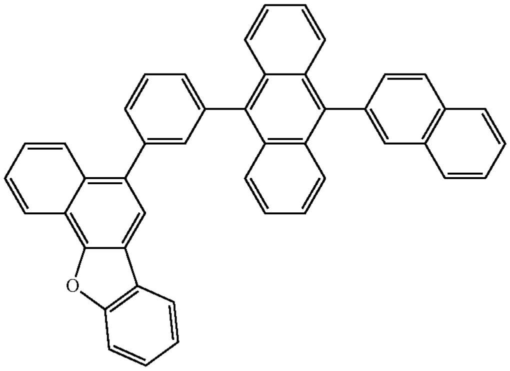
H97
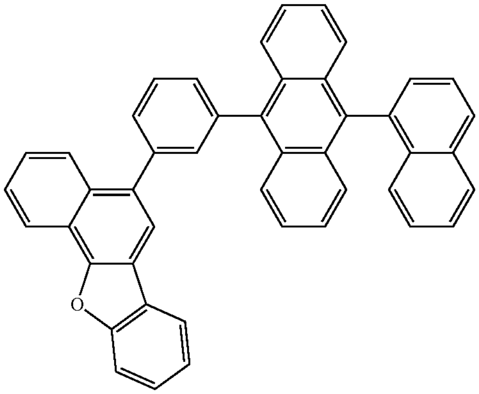
H98
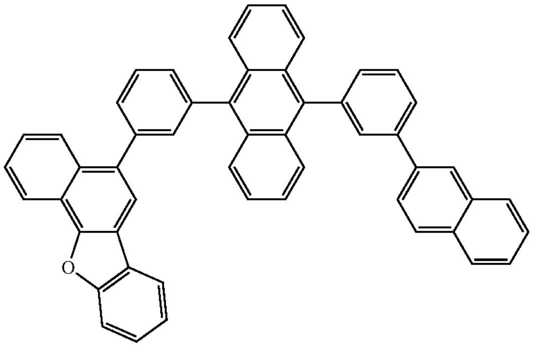
H99
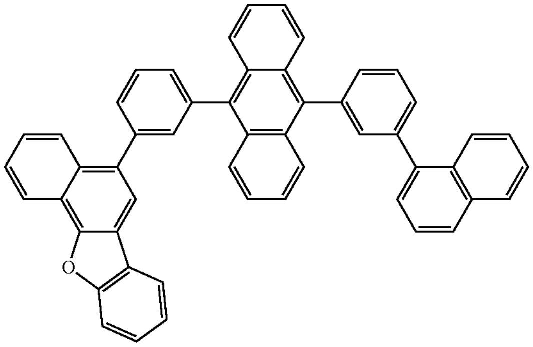

-continued
H100
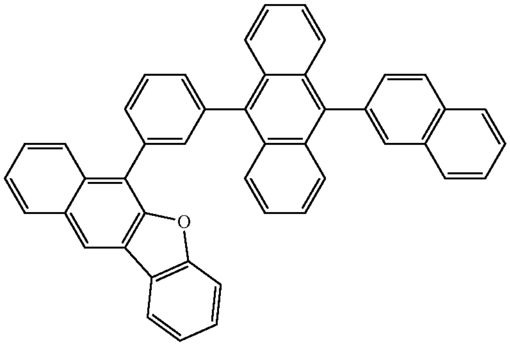
H101
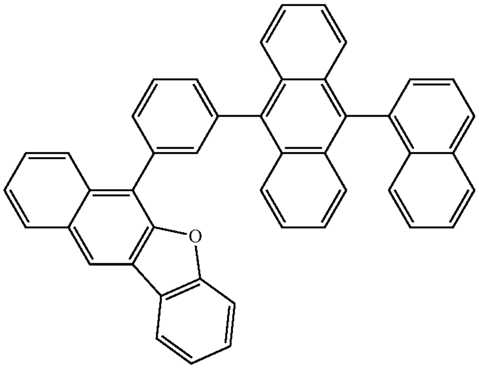
H102
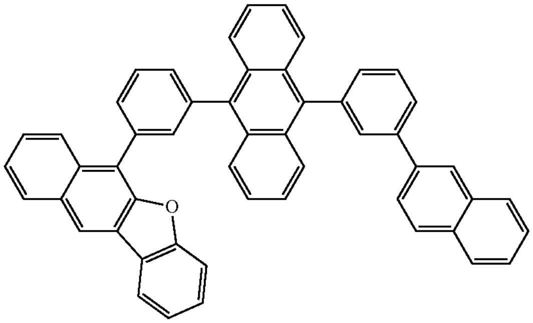
H103
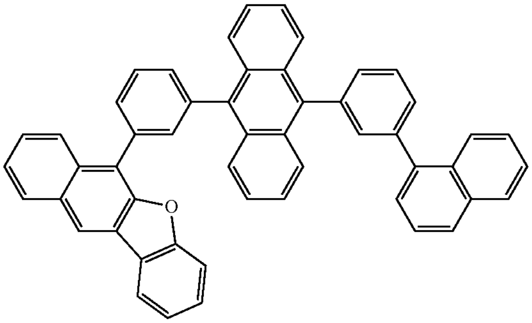
H104
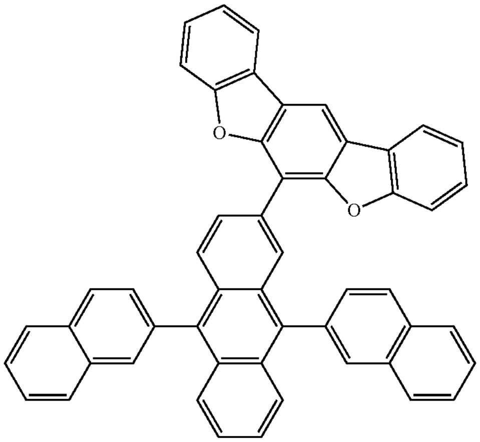
H105
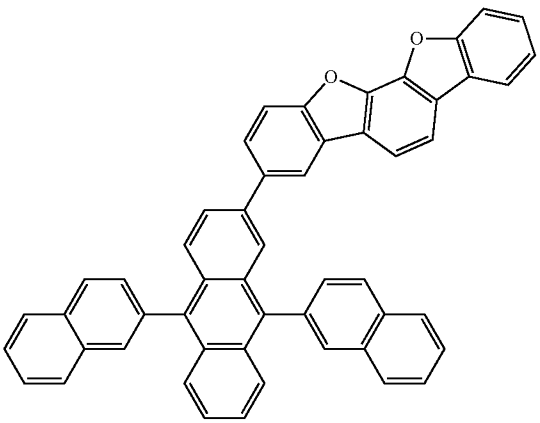
H106
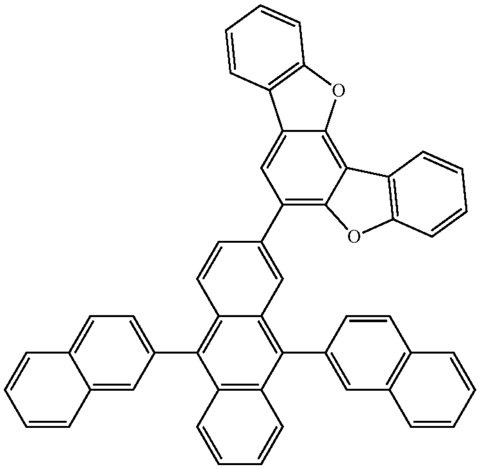
H107
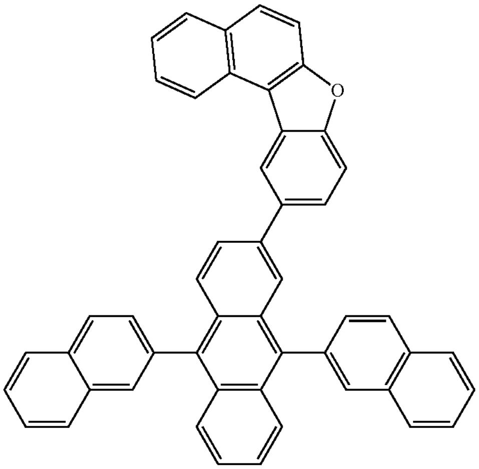

-continued
H108
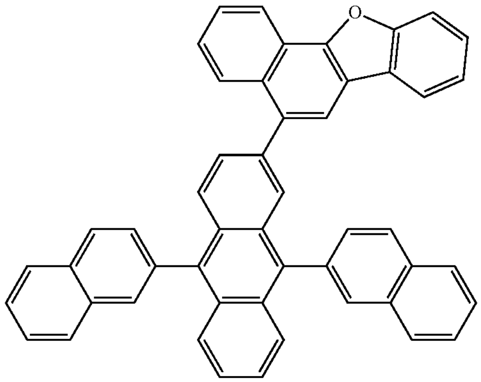
H109
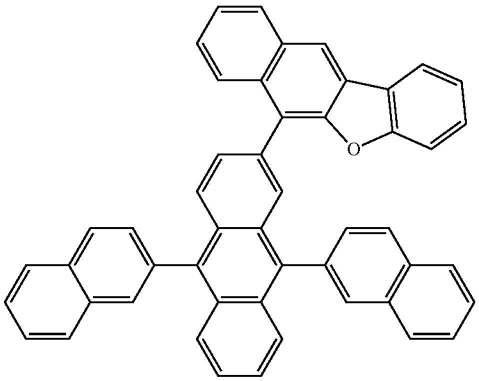
H110
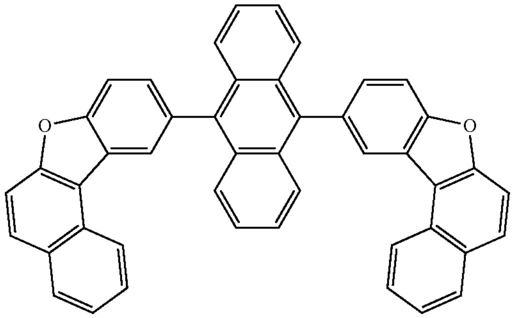
H111
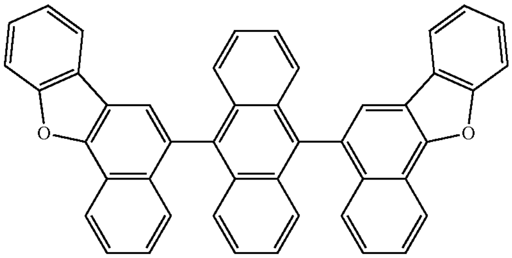
H112
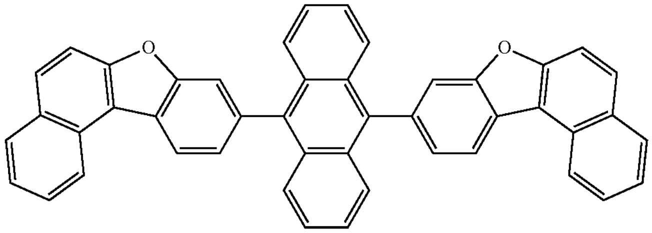
H113
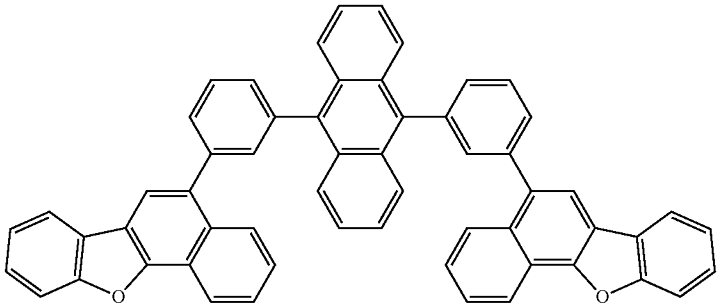
H114
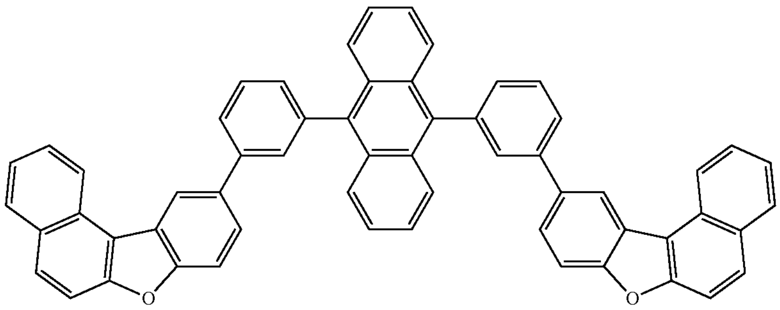

-continued
H115
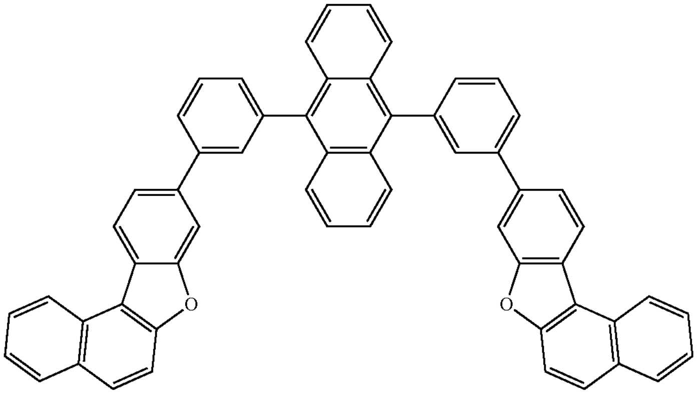
H116
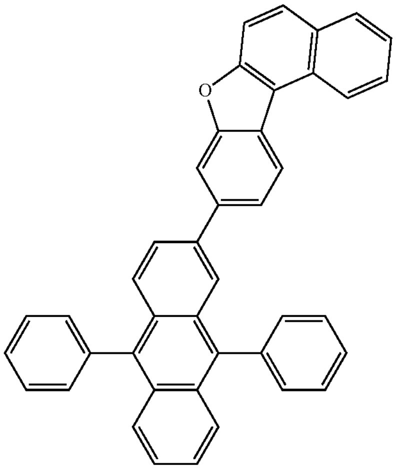
H117
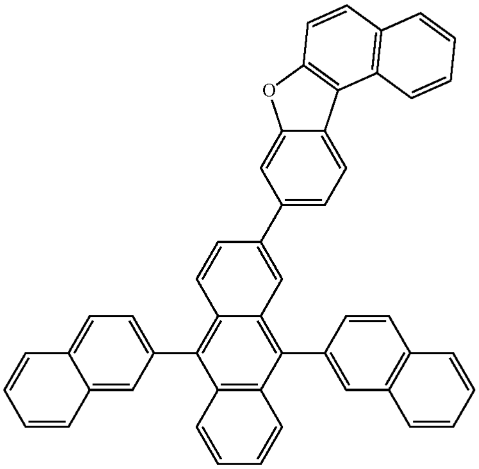
H118
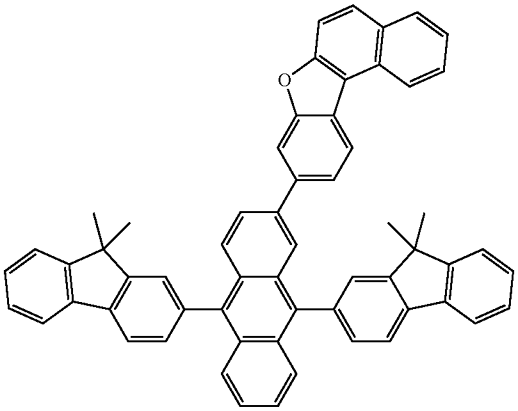
H119
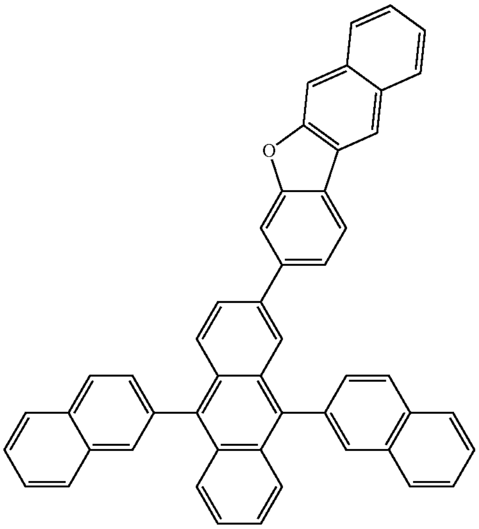

-continued
H120
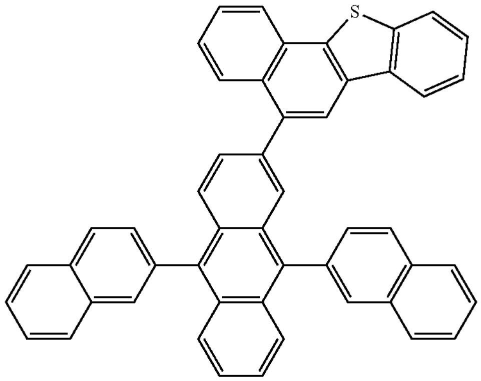
H121
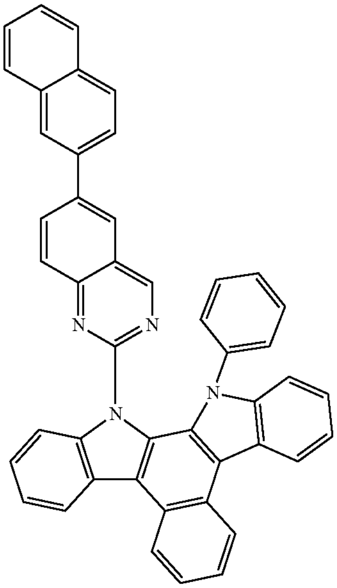
H122
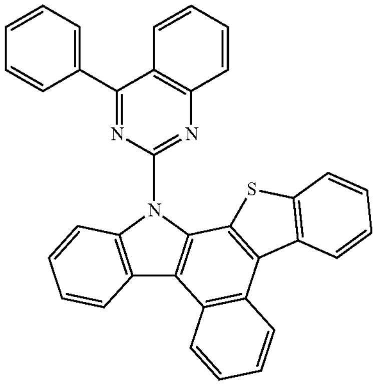
H123
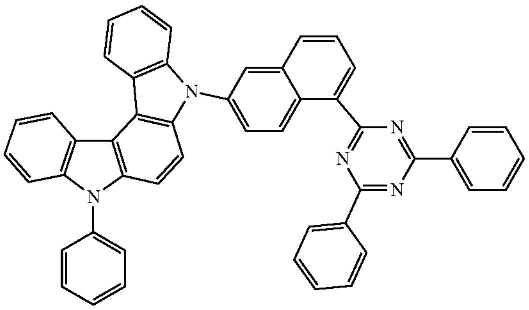
H124
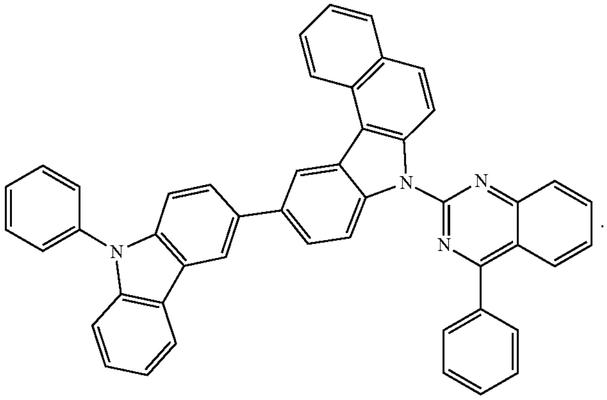
.

Phosphorescent Dopant

The phosphorescent dopant may include at least one transition metal as a center 38' metal.

The phosphorescent dopant may include a monodentate ligand, a bidentate ligand, a tridentate ligand, a tetradentate ligand, a pentadentate ligand, a hexadentate ligand, or a combination thereof.

The phosphorescent dopant may be electrically neutral.

In some embodiments, the phosphorescent dopant may include an organometallic complex represented by Formula 401:

Formula 401

$$M(L_{401})_{xc1}(L_{402})_{xc2}$$

Formula 402

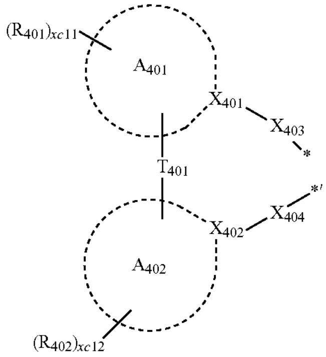

wherein, in Formulae 401 and 402,

M may be transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, and when xc1 is 2 or greater, at least two of $L_{401}$ may be identical to or different from each other, $L_{402}$ may be an organic ligand, and xc2 may be an integer from 0 to 4, and when xc2 is 2 or greater, at least two of $L_{402}$ may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', $X_{403}$ and $X_{404}$ may each independently be a chemical bond (e.g., a covalent bond or a coordinate bond), O, S, N($Q_{413}$), B($Q_{413}$), P($Q_{413}$), C($Q_{413}$)($Q_{414}$), or Si($Q_{413}$)($Q_{414}$), wherein $Q_{411}$ to $Q_{414}$ may each be understood by referring to the description of $Q_1$ provided herein, $R_{401}$ and $R_{402}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), —P($Q_{401}$)($Q_{402}$), or —P(=O)($Q_{401}$)($Q_{402}$), wherein $Q_{401}$ to $Q_{403}$ may each be understood by referring to the description of $Q_1$ provided herein, xc11 and xc12 may each independently be an integer from 0 to 10, and

* and *' in Formula 402 each indicate a binding site to M in Formula 401.

For example, in Formula 402, i) $X_{401}$ may be nitrogen, and $X_{402}$ may be carbon, or ii) $X_{401}$ and $X_{402}$ may each be nitrogen.

In one or more embodiments, when xc1 in Formula 402 is 2 or greater, two of ring $A_{401}$ of at least two $L_{401}$ (s) may optionally be bonded via $T_{402}$ as a linking group, or two of ring $A_{402}$ may optionally be bonded via $T_{403}$ as a linking group (see Compounds PD1 to PD4 and PD7). $T_{402}$ and $T_{403}$ may each be understood by referring to the description of $T_{401}$ provided herein.

In Formula 401, $L_{402}$ may be any suitable organic ligand. For example, $L_{402}$ may be a halogen group, a diketone group (e.g., an acetylacetonate group), a carboxylic acid group (e.g., a picolinate group), —C(=O), an isonitrile group, —CN, a phosphorus group (e.g., a phosphine group or a phosphite group), or a combination thereof.

The phosphorescent dopant may be, for example, one of Compounds PD1 to PD39 or a combination thereof:

PD1

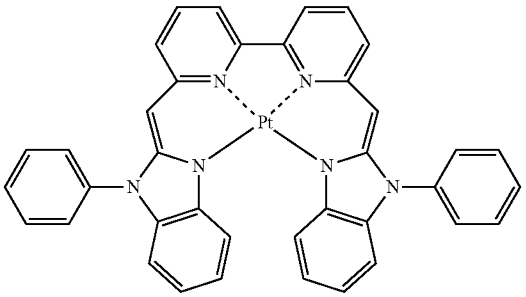

PD2

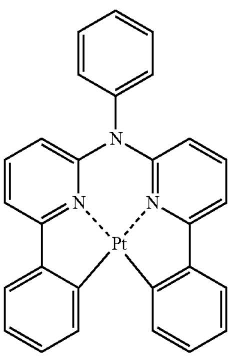

-continued
PD3
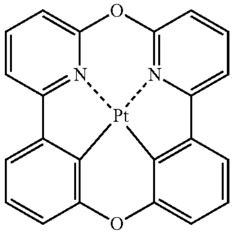
PD4
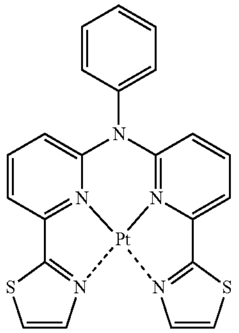
PD5
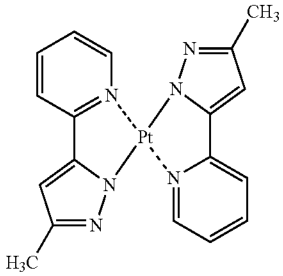
PD6
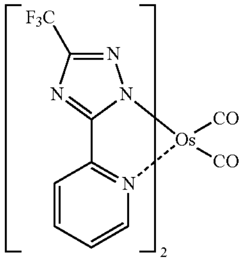
PD7
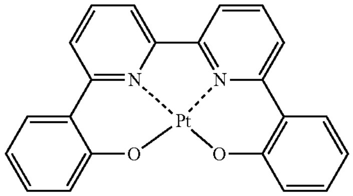
PD8
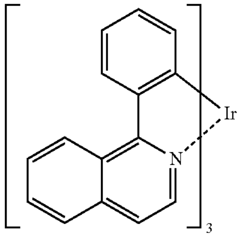
-continued
PD9
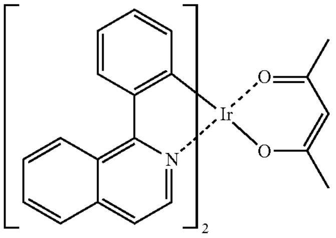
PD10
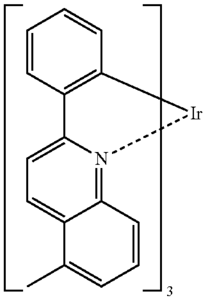
PD11
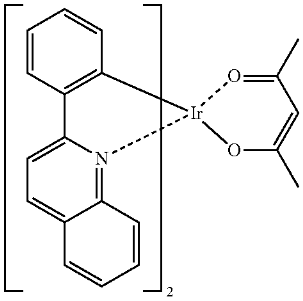
PD12
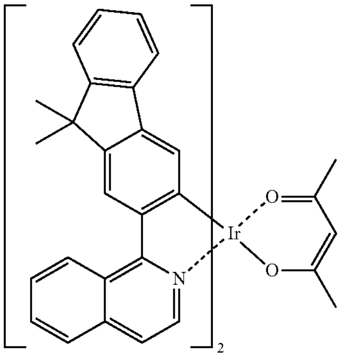
PD13
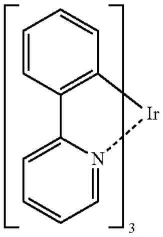

-continued
PD14
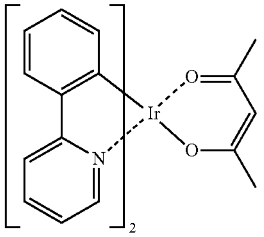
PD15
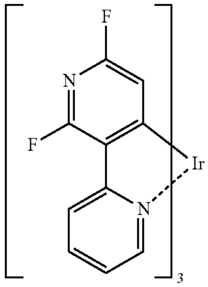
PD16
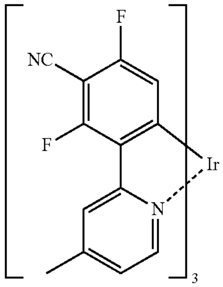
PD17
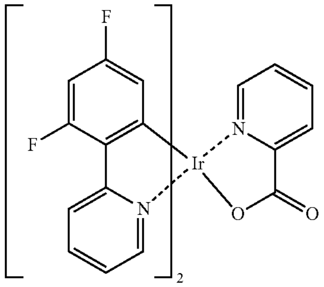
PD18
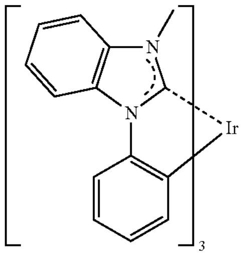
-continued
PD19
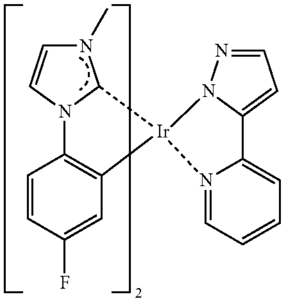
PD20
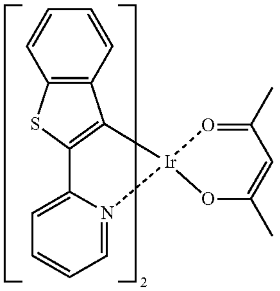
PD21
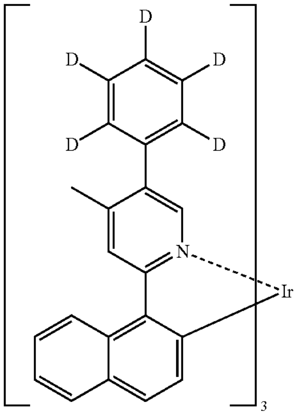
PD22
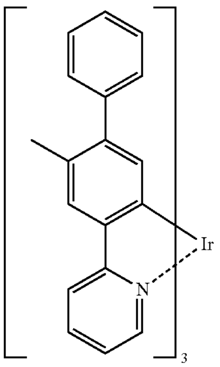

-continued
PD23
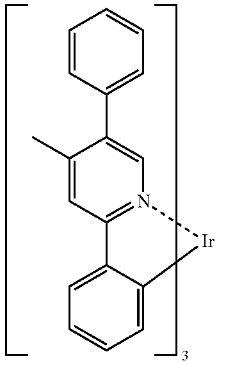
PD24
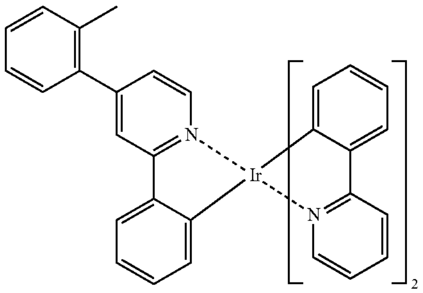
PD25
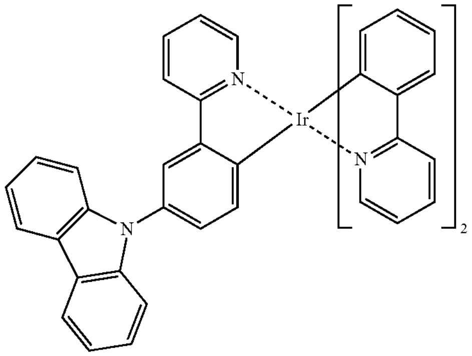
PD26
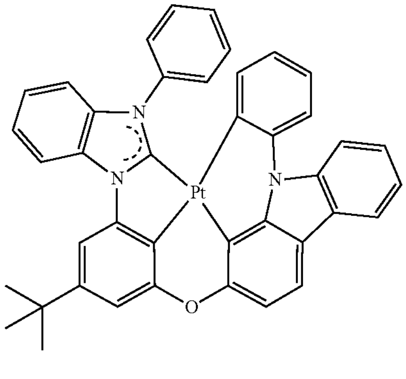
-continued
PD27
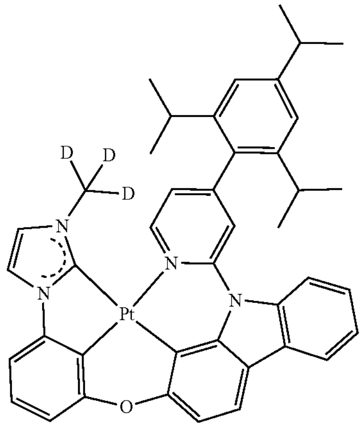
PD28
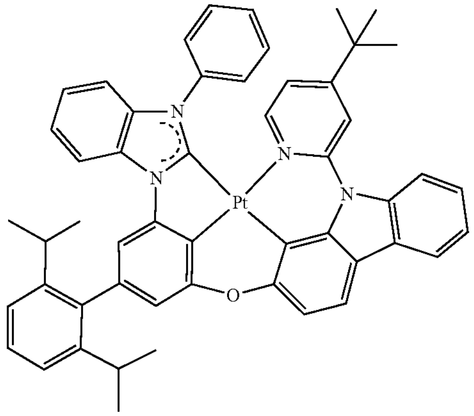
PD29
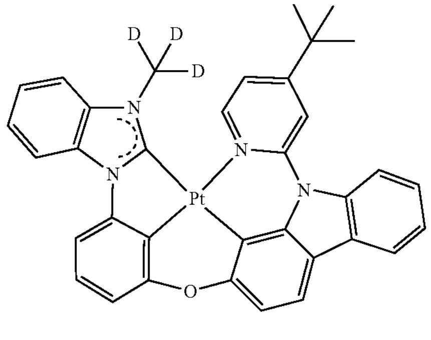

-continued
PD30
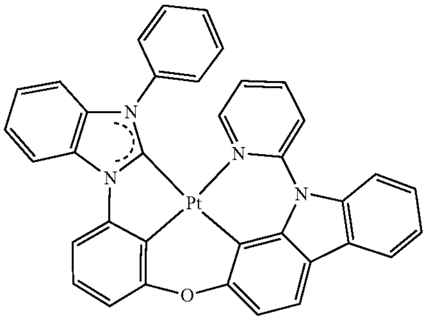
PD31
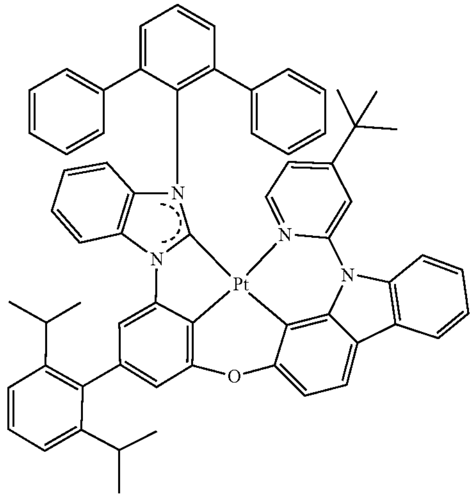
PD32
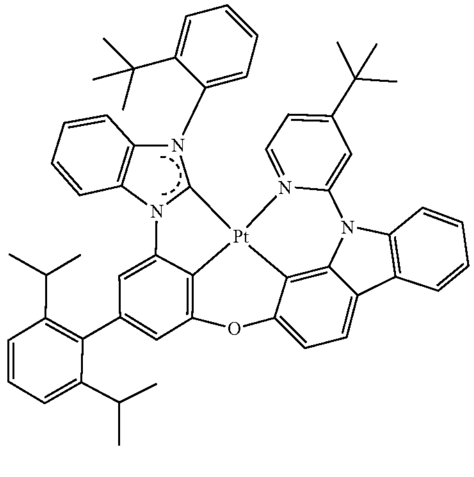
-continued
PD33
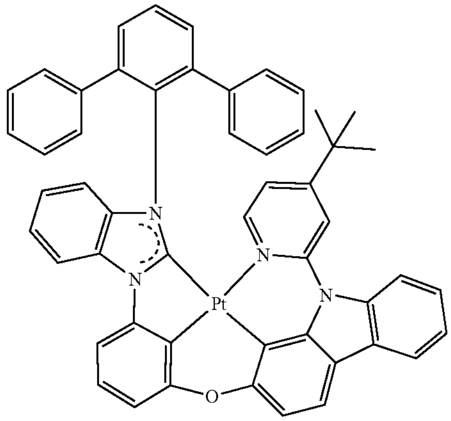
PD34
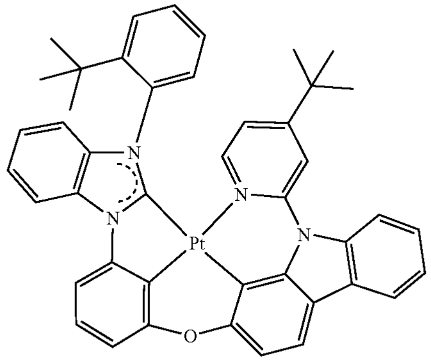
PD35
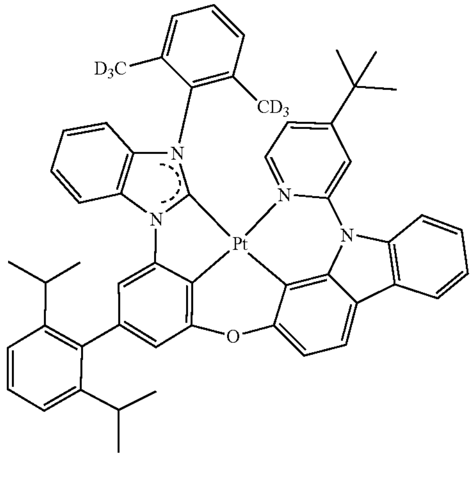

-continued

PD36

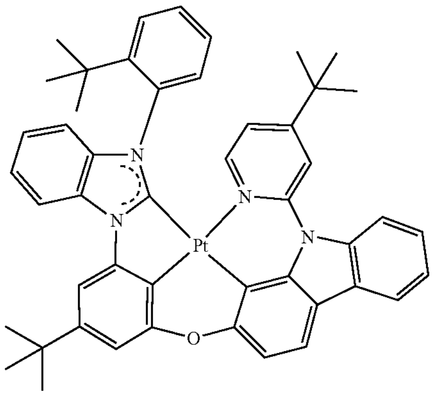

PD37

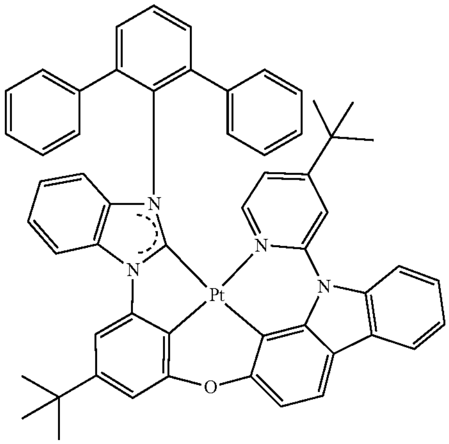

PD38

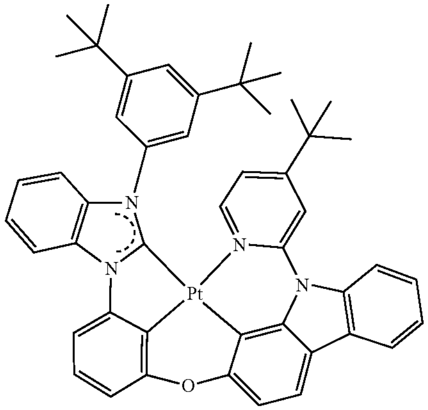

-continued

PD39

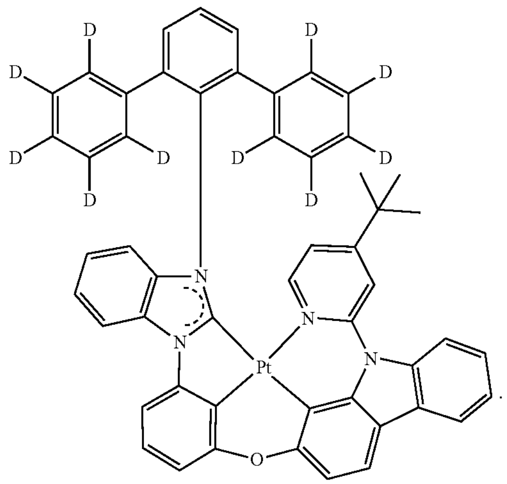

Fluorescent Dopant

The fluorescent dopant may include an amine group-containing compound, a styryl group-containing compound, or a combination thereof.

In some embodiments, the fluorescent dopant may include a compound represented by Formula 501:

Formula 501

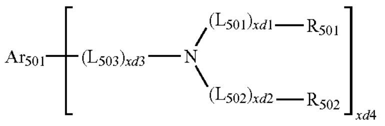

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In some embodiments, in Formula 501, $Ar_{501}$ may include a condensed ring group (e.g., an anthracene group, a chrysene group, or a pyrene group) in which at least three monocyclic groups are condensed.

In some embodiments, xd4 in Formula 501 may be 2.

In some embodiments, the fluorescent dopant may include one of Compounds FD1 to FD36, 4,4'-bis(2,2-diphenylvinyl)-1,1'-biphenyl (DPVBi), 4,4'-bis[4-(di-p-tolylamino)styryl]biphenyl (DPAVBi), or a combination thereof:

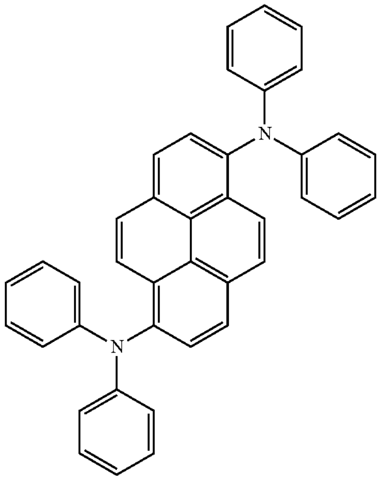
FD2
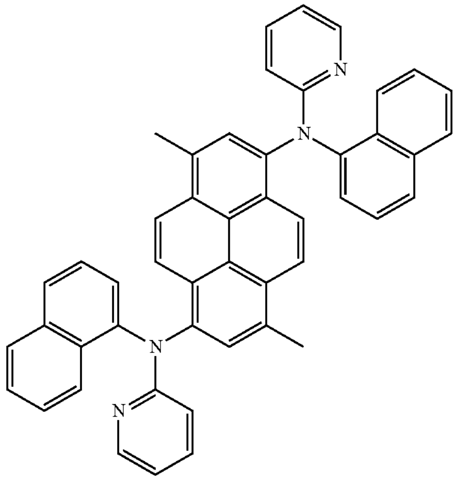
FD3
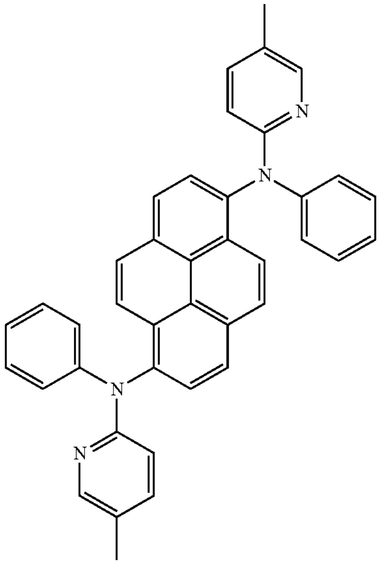
FD4
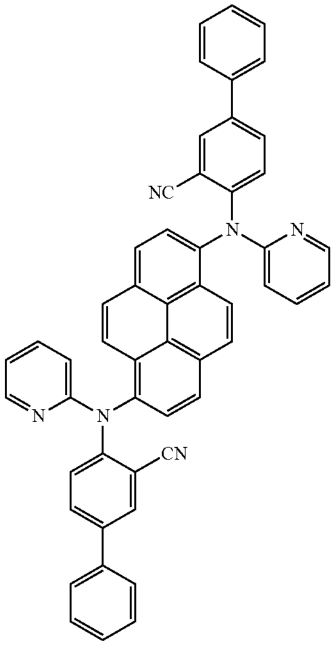
FD5
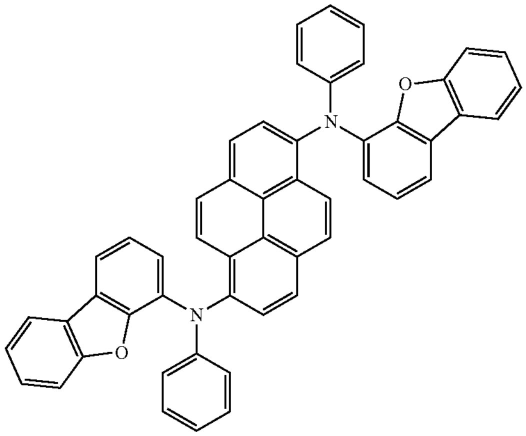
FD6
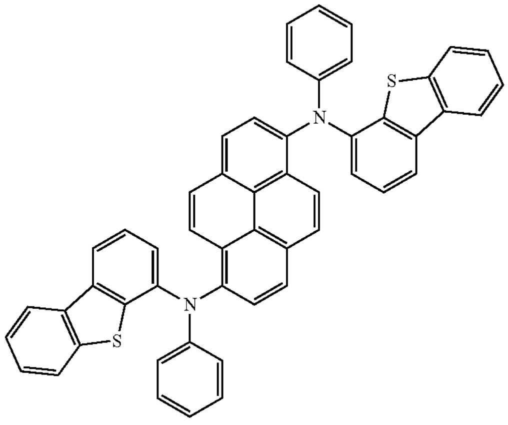

-continued
FD7
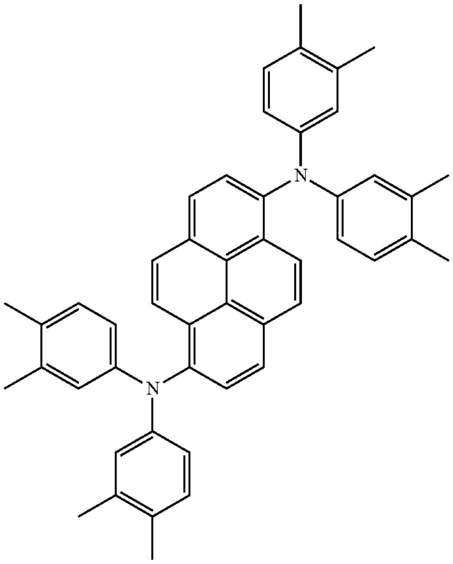
FD8
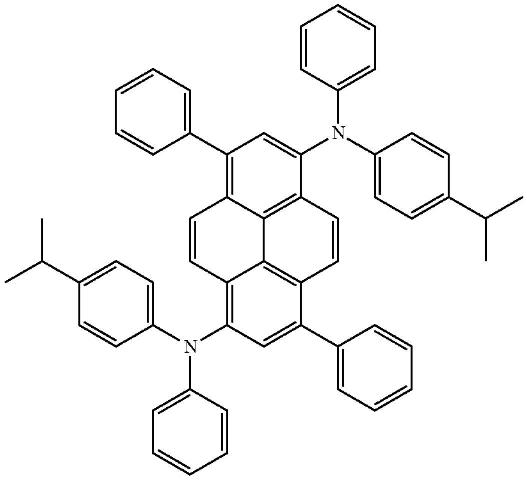
FD9
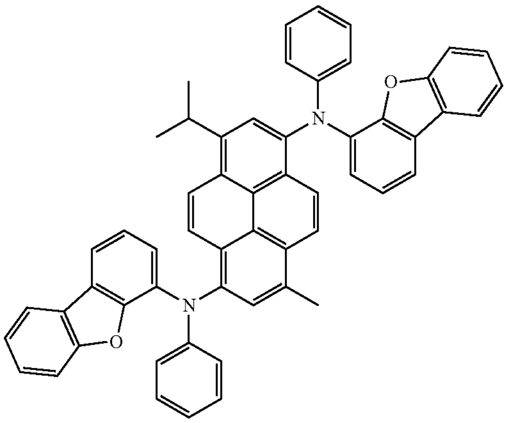
FD10
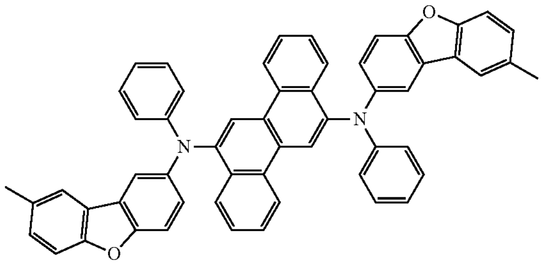
FD11
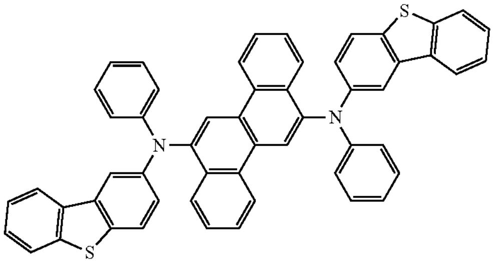
FD12
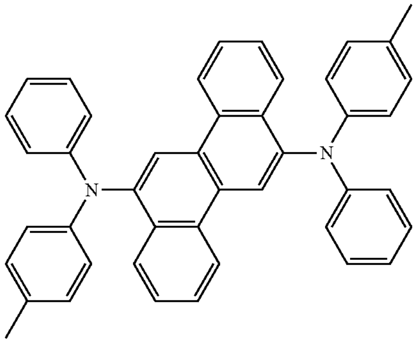
FD13
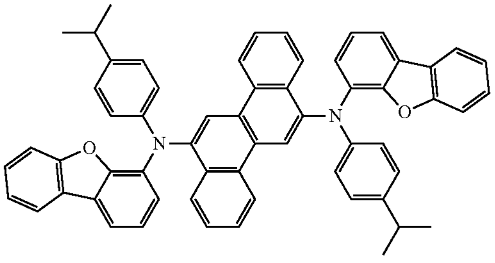
FD14
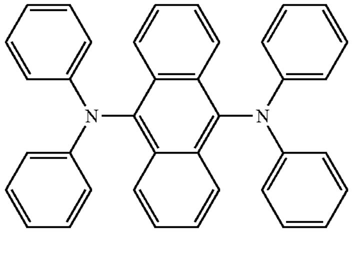

-continued
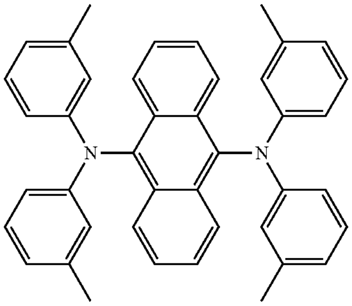
FD15
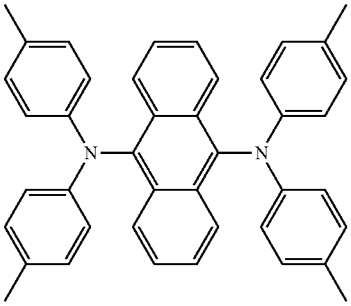
FD16
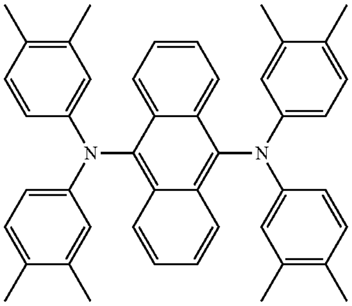
FD17
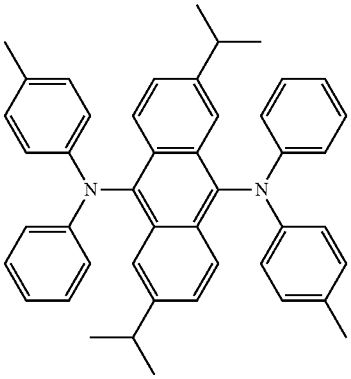
FD18
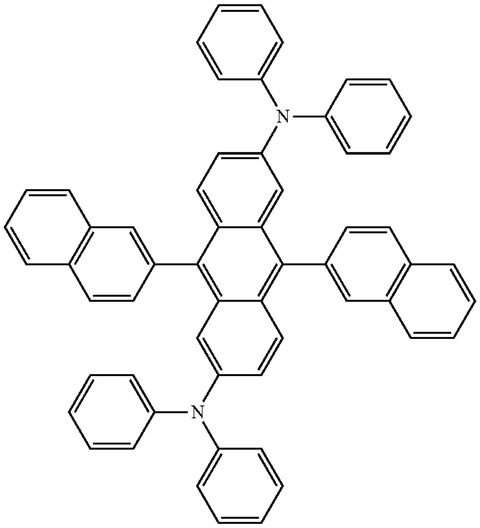
FD19
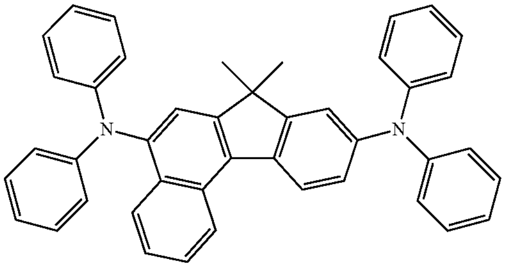
FD20
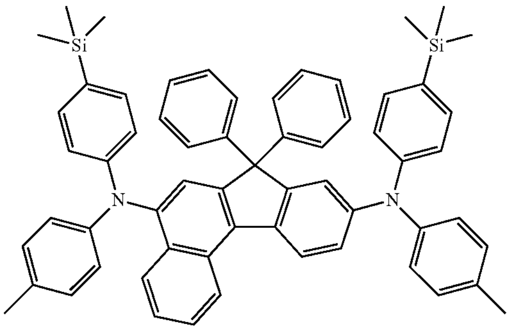
FD21
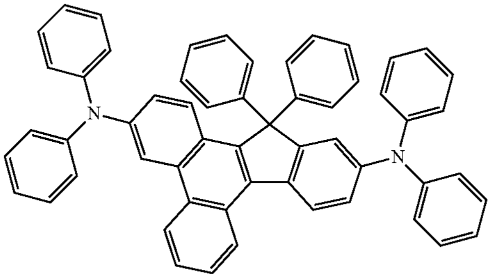
FD22

-continued
FD23
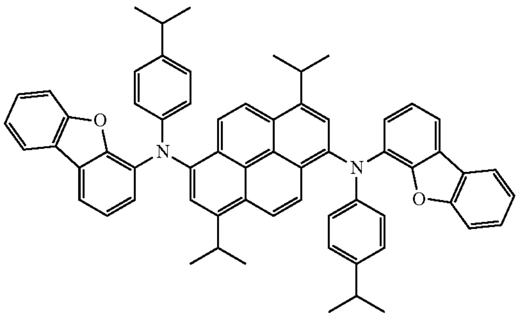
FD24
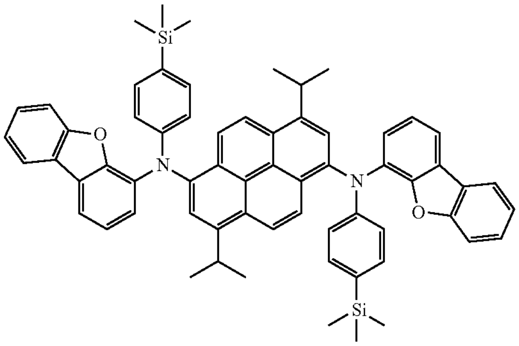
FD25
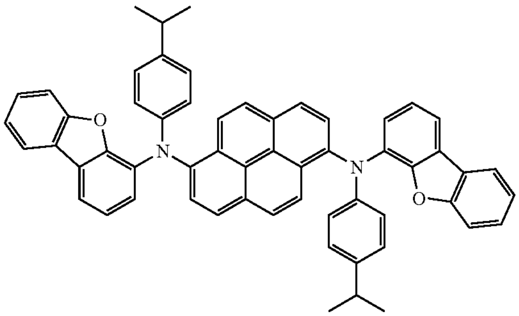
FD26
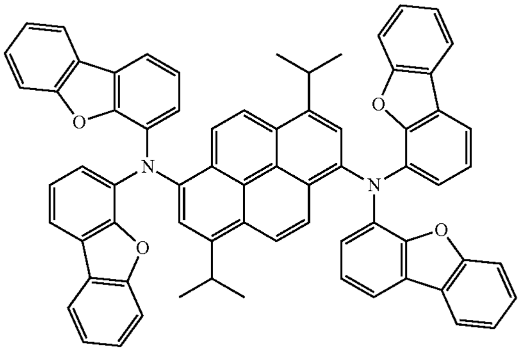
FD27
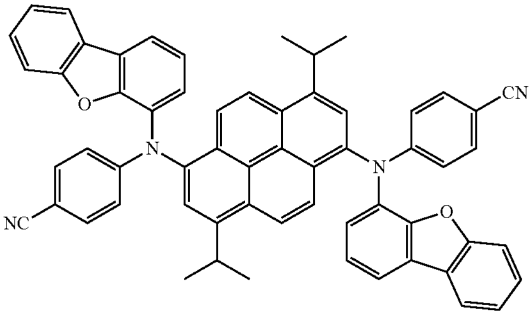
FD28
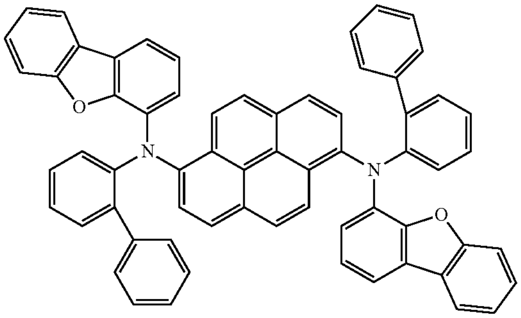
FD29
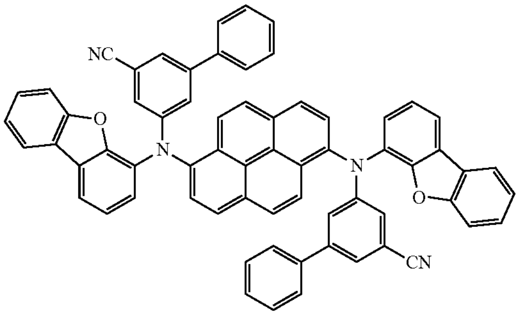
FD30
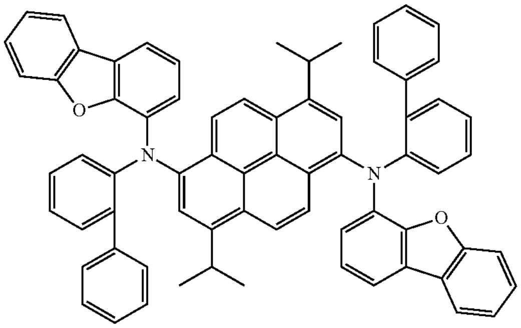

-continued
FD31
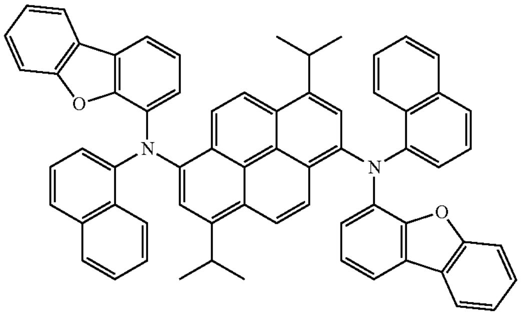
FD32
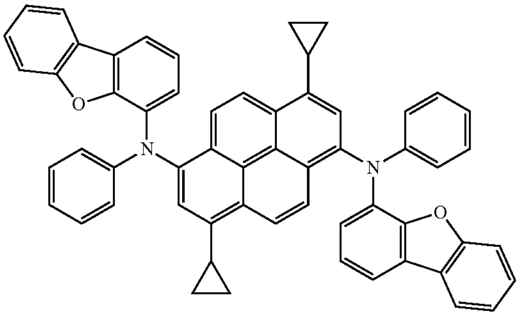
FD33
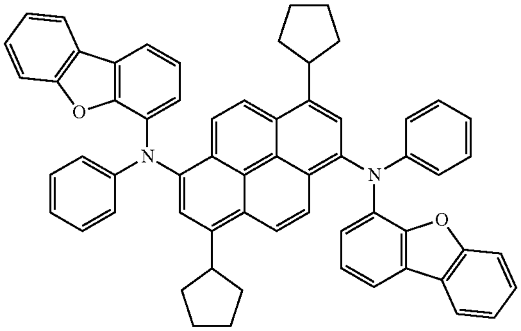
FD34
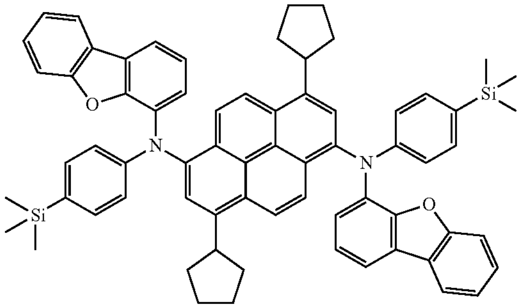
FD35
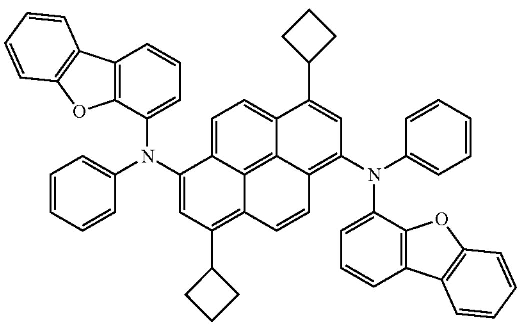
FD36
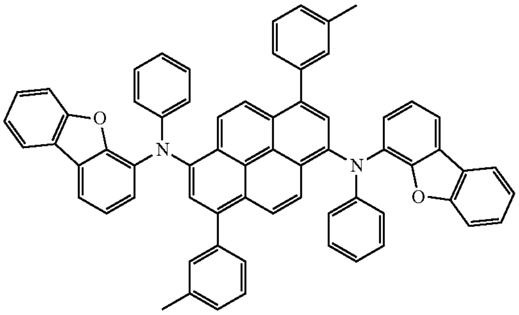

-continued

DPVBi

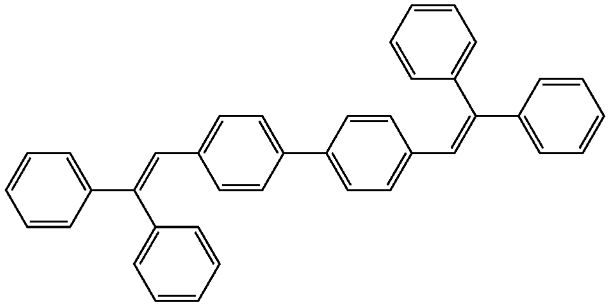

DPAVBi

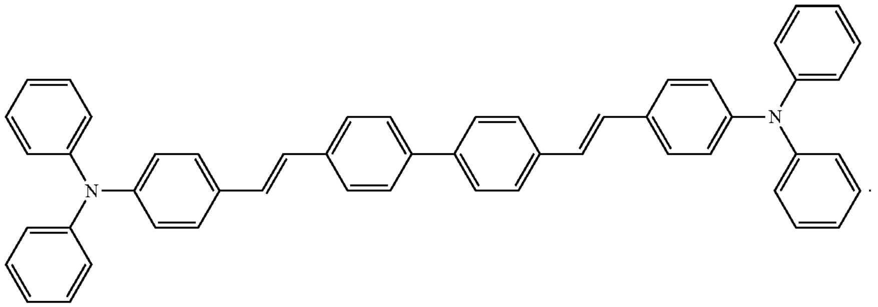

Delayed Fluorescence Material

The emission layer may include a delayed fluorescence material.

The delayed fluorescence material described herein may be any suitable compound that may emit delayed fluorescence according to a delayed fluorescence emission mechanism.

The delayed fluorescence material included in the emission layer may serve as a host or a dopant, depending on types of other materials included in the emission layer.

In some embodiments, a difference between a triplet energy level (electron Volts (eV)) of the delayed fluorescence material and a singlet energy level (eV) of the delayed fluorescence material may be about 0 eV or greater to about 0.5 eV or less. When the difference between a triplet energy level (eV) of the delayed fluorescence material and a singlet energy level (eV) of the delayed fluorescence material is within this range, up-conversion from a triplet state to a singlet state in the delayed fluorescence material may be effectively occurred, thus improving luminescence efficiency and the like of the light-emitting device 10.

In some embodiments, the delayed fluorescence material may include: i) a material including at least one electron donor (e.g., a π electron-rich $C_3$-$C_{60}$ cyclic group such as a carbazole group and the like) and at least one electron acceptor (e.g., a sulfoxide group, a cyano group, a π electron-deficient nitrogen-containing $C_1$-$C_{60}$ cyclic group, and the like), ii) a material including a $C_8$-$C_{60}$ polycyclic group including at least two cyclic groups condensed to each other and sharing boron (B), and the like.

Examples of the delayed fluorescence material may include at least one of Compounds DF1 to DF9:

DF1

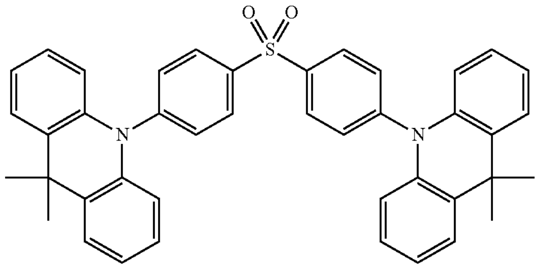

(DMAC-DPS)

DF2

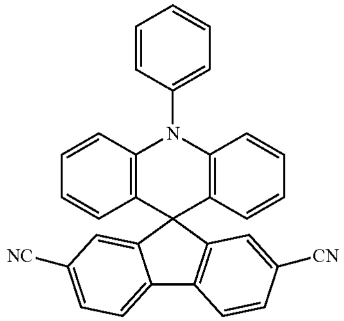

(ACRFLCN)

-continued

DF3

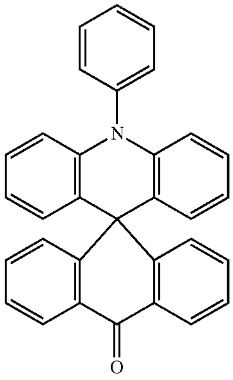

(ACRSA)

DF4

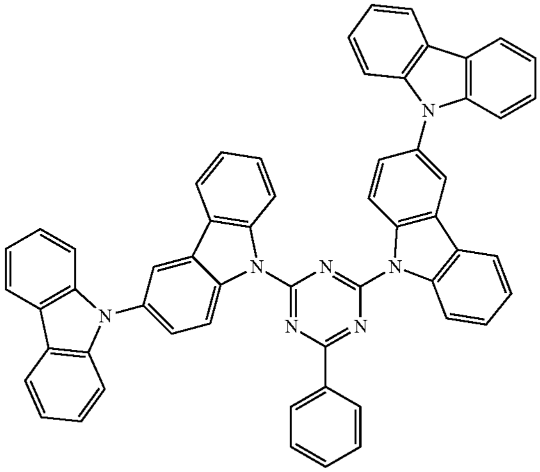

(CC2TA)

DF5

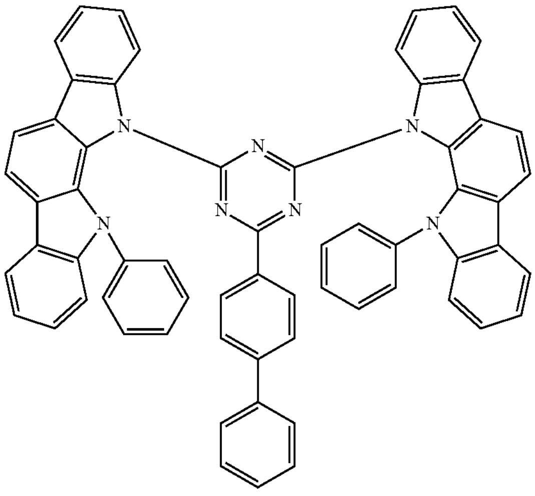

(PIC-TRZ)

-continued

DF6

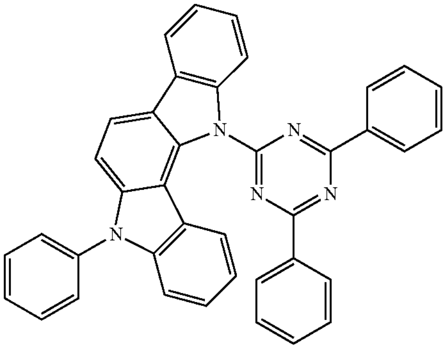

(PIC-TRZ2)

DF7

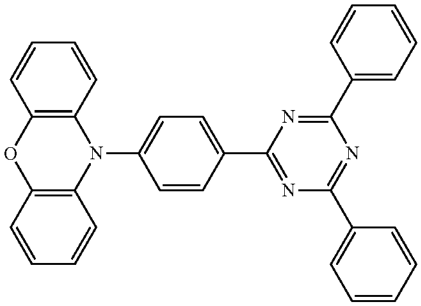

(PXZ-TRZ)

DF8

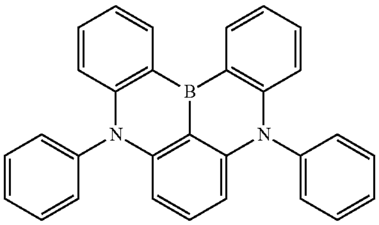

(DABNA-1)

DF9

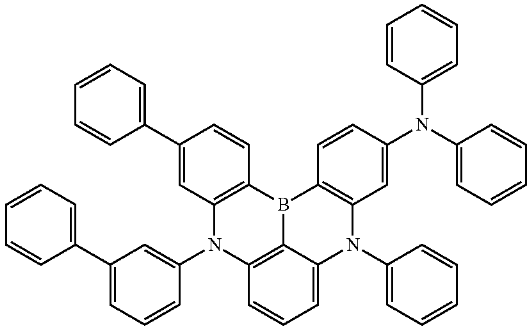

(DABNA-2)

Quantum Dots

The emission layer may include one or more quantum dots.

The term "quantum dot" as used herein refers to a crystal (e.g., a nanocrystal) of a semiconductor compound and may include any suitable material capable of emitting emission wavelengths of various lengths according to the average particle size (D50) of the crystal.

The diameter or average particle size (D50) of the quantum dot may be, for example, in a range of about 1 nanometer (nm) to about 10 nm.

Quantum dots may be synthesized by a wet chemical process, an organic metal chemical vapor deposition process, a molecular beam epitaxy process, or any suitable process.

The wet chemical process is a method of growing a quantum dot particle crystal by mixing a precursor material with an organic solvent. When the crystal grows, the organic solvent may naturally serve as a dispersant coordinated on the surface of the quantum dot crystal and control the growth of the crystal. Thus, the wet chemical method may be easier to perform than the vapor deposition process such a metal organic chemical vapor deposition (MOCVD) or a molecular beam epitaxy (MBE) process. Further, the growth of quantum dot particles may be controlled with a lower manufacturing cost.

The quantum dot may include a group II-VI semiconductor compound; a group III-V semiconductor compound; a group III-VI semiconductor compound; a group I-III-VI semiconductor compound; a group IV-VI semiconductor compound; a group IV element or compound; or a combination thereof.

Examples of the group II-VI semiconductor compound may include a binary compound such as CdS, CdSe, CdTe, ZnS, ZnSe, ZnTe, ZnO, HgS, HgSe, HgTe, MgSe, MgS, or the like, or a combination thereof; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or the like, or a combination thereof; a quaternary compound such as CdZnSeS, CdZnSeTe, CdZnSTe, CdHgSeS, CdHgSeTe, CdHgSTe, HgZnSeS, HgZnSeTe, HgZnSTe, or the like, or a combination thereof; or a combination thereof.

Examples of the group III-V semiconductor compound may include a binary compound such as GaN, GaP, GaAs, GaSb, AlN, AlP, AlAs, AlSb, InN, InP, InAs, InSb, or the like, or a combination thereof; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or the like, or a combination thereof; a quaternary compound such as GaAlNP, GaAlNAs, GaAlNSb, GaAlPAs, GaAlPSb, GaInNP, GaInNAs, GalnNSb, GaInPAs, GalnPSb, InAlNP, InAlNAs, InAlNSb, InAlPAs, InAlPSb, or the like, or a combination thereof; or a combination thereof. In some embodiments, the group III-V semiconductor compound may further include a group II element. Examples of the group III-V semiconductor compound further including the group II element may include InZnP, InGaZnP, InAIZnP, or the like, or a combination thereof.

Examples of the III-VI group semiconductor compound may include a binary compound such as GaS, GaSe, $Ga_2Se_3$, GaTe, InS, InSe, $In_2S_3$, $In_2Se_3$, InTe, or the like, or a combination thereof; a ternary compound such as $InGaS_3$, InGaSes, or the like, or a combination thereof; or a combination thereof.

Examples of the group I-III-VI semiconductor compound may include a ternary compound such as AgInS, $AgInS_2$, CuInS, $CuInS_2$, $CuGaO_2$, $AgGaO_2$, $AgAlO_2$, or the like, or a combination thereof.

Examples of the group IV-VI semiconductor compound may include a binary compound such as SnS, SnSe, SnTe, PbS, PbSe, PbTe, or the like, or a combination thereof; a ternary compound such as SnSeS, SnSeTe, SnSTe, PbSeS, PbSeTe, PbSTe, SnPbS, SnPbSe, SnPbTe, or the like, or a combination thereof; a quaternary compound such as SnPbSSe, SnPbSeTe, SnPbSTe, or the like, or a combination thereof; or a combination thereof.

The group IV element or compound may be a single element material such as Si, Ge, or the like, or a combination thereof; a binary compound such as SiC, SiGe, or the like, or a combination thereof; or a combination thereof.

Individual elements included in the multi-element compound, such as a binary compound, a ternary compound, and/or a quaternary compound, may be present in a particle thereof at a uniform or non-uniform concentration.

The quantum dot may have a single structure in which the concentration of each element included in the quantum dot is uniform or a core-shell double structure. In some embodiments, materials included in the core may be different from materials included in the shell.

The shell of the quantum dot may serve as a protective layer for preventing chemical denaturation of the core to maintain semiconductor characteristics and/or as a charging layer for imparting electrophoretic characteristics to the quantum dot. The shell may be a monolayer or a multilayer. An interface between a core and a shell may have a concentration gradient where a concentration of elements present in the shell decreases toward the core.

Examples of the shell of the quantum dot include metal, metalloid, or nonmetal oxide, a semiconductor compound, or a combination thereof. Examples of the metal, the metalloid, or the nonmetal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or the like, or a combination thereof; a ternary compound such as $MgAl_2O_4$, $CoFe_2O_4$, $NiFe_2O_4$, $CoMn_2O_4$, or the like, or a combination thereof; or a combination thereof. Examples of the semiconductor compound may include a group II-VI semiconductor compound; a group III-V semiconductor compound; a group III-VI semiconductor compound; a group I-III-VI semiconductor compound; a group IV-VI semiconductor compound; or a combination thereof. In some embodiments, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, or a combination thereof.

The quantum dot may have a full width of half maximum (FWHM) of a spectrum of an emission wavelength of about 45 nm or less, about 40 nm or less, or about 30 nm or less. When the FWHM of the quantum dot is within this range, color purity or color reproducibility may be improved. In addition, because light emitted through the quantum dots is emitted in all directions, an optical viewing angle may be improved.

In addition, the quantum dot may be specifically, a spherical, pyramidal, multi-arm, or cubic nanoparticle, nanotube, nanowire, nanofiber, nanoplate particle, or a combination thereof.

By adjusting the average particle size of the quantum dot, the energy band gap may also be adjusted, thereby obtaining light of various wavelengths in the quantum dot emission layer. By using quantum dots of various average particle sizes, a light-emitting device that may emit light of various wavelengths may be realized. In some embodiments, the average particle size of the quantum dot may be selected such that the quantum dot may emit a red light, a green light, and/or a blue light. In addition, the average particle size of the quantum dot may be selected such that the quantum dot may emit a white light by combining various light colors.

Hole Transport Region in Interlayer 130

The hole transport region may have i) a single-layered structure consisting of a single layer consisting of a single material, ii) a single-layered structure consisting of a single layer including a plurality of different materials, or iii) a multi-layered structure having a plurality of layers including a plurality of different materials.

The hole transport region may include a hole injection layer, a hole transport layer, an emission auxiliary layer, an electron blocking layer, or a combination thereof.

For example, the hole transport region may have a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are sequentially stacked on the emission layer in each stated order.

The hole transport region may include the compound represented by Formula 201, the compound represented by Formula 202, or a combination thereof:

Formula 201

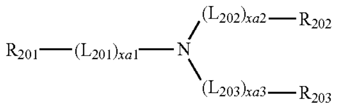

Formula 202

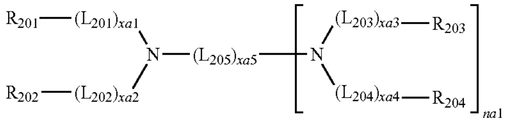

wherein, in Formulae 201 and 202, $L_{201}$ to $L_{204}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group or the like) unsubstituted or substituted with at least one $R_{10a}$ (e.g., Compound HT16 described herein), $R_{203}$ and $R_{204}$ may optionally be bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

In some embodiments, Formulae 201 and 202 may each include at least one of groups represented by Formulae CY201 to CY217:

CY201

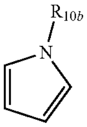

CY202

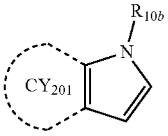

CY203

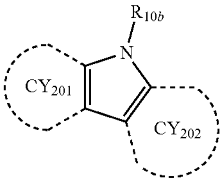

CY204

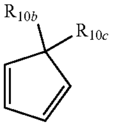

CY205

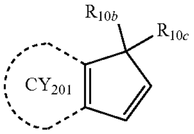

CY206

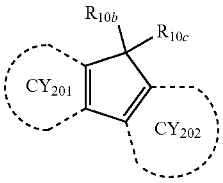

-continued

CY207

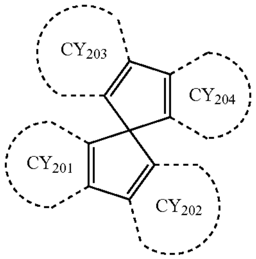

CY208

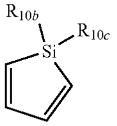

CY209

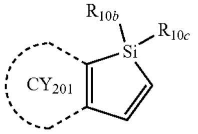

CY210

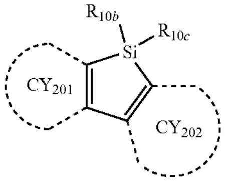

CY211

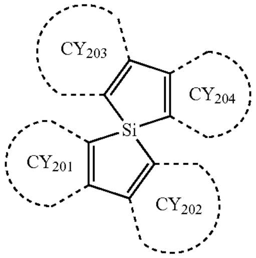

CY212

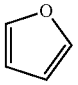

CY213

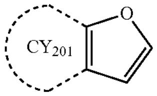

CY214

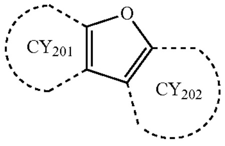

CY215

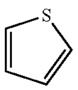

-continued

CY216

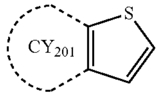

CY217

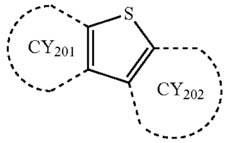

wherein, in Formulae CY201 to CY217, $R_{10b}$ and $R_{10c}$ may each be understood by referring to the descriptions of $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In one or more embodiments, in Formulae CY201 to CY217, ring CY201 to ring CY204 may each independently be a benzene group, a naphthalene group, a phenanthrene group, or an anthracene group.

In one or more embodiments, Formulae 201 and 202 may each include at least one of groups represented by Formulae CY201 to CY203.

In one or more embodiments, Formula 201 may include at least one of groups represented by Formulae CY201 to CY203 and at least one of groups represented by Formulae CY204 to CY217.

In one or more embodiments, in Formula 201, xa1 may be 1, $R_{201}$ may be represented by one of Formulae CY201 to CY203, xa2 may be 0, and $R_{202}$ may be represented by one of Formulae CY204 to CY207.

In one or more embodiments, Formulae 201 and 202 may each not include groups represented by Formulae CY201 to CY203.

In one or more embodiments, Formulae 201 and 202 may each not include groups represented by Formulae CY201 to CY203, and include at least one of groups represented by Formulae CY204 to CY217.

In one or more embodiments, Formulae 201 and 202 may each not include groups represented by Formulae CY201 to CY217.

In some embodiments, the hole transport region may include one of Compounds HT1 to HT46, 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), N,N'-di(1-naphthyl)-N,N'-diphenylbenzidine (NPB) (NPD), p-NPB, N,N'-bis(3-methylphenyl)-N,N'-diphenyl-[1,1-biphenyl]-4,4'-diamine (TPD), spiro-TPD, spiro-NPB, methylated-NPB, 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate (PANI/PSS), or a combination thereof:

HT1
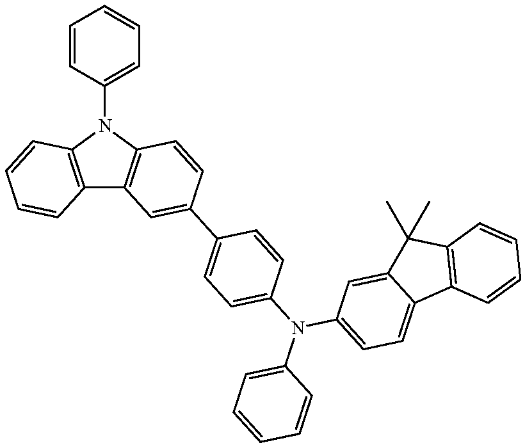
HT2
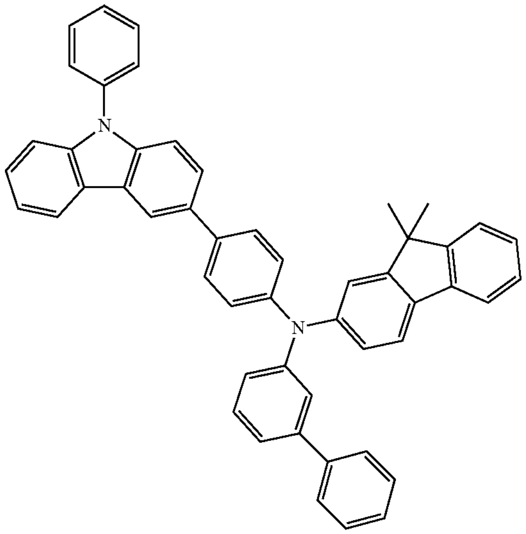
HT3
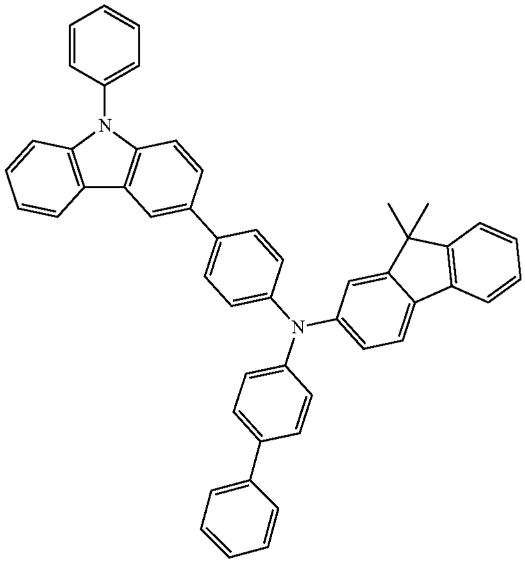
HT4
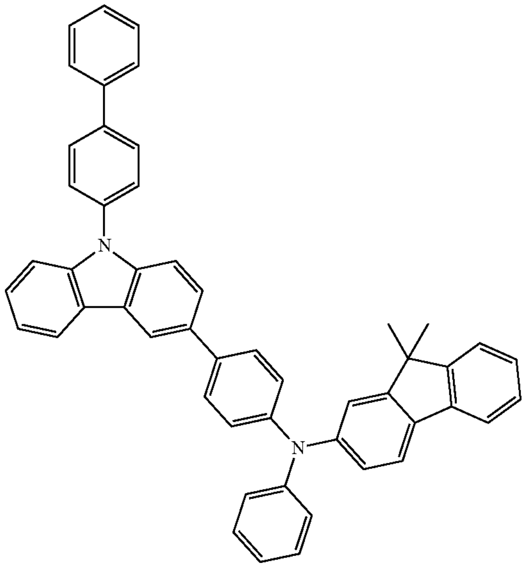

-continued
HT5
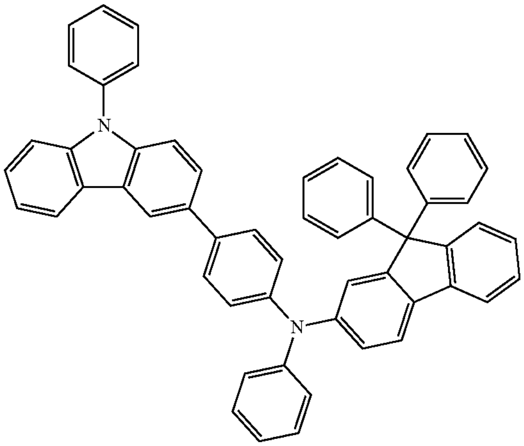
HT6
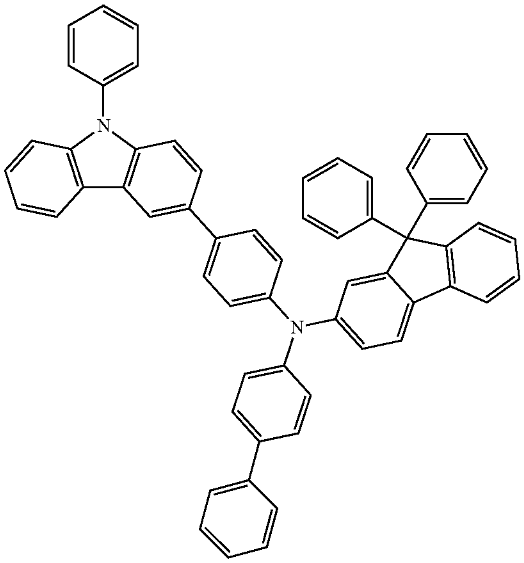
HT7
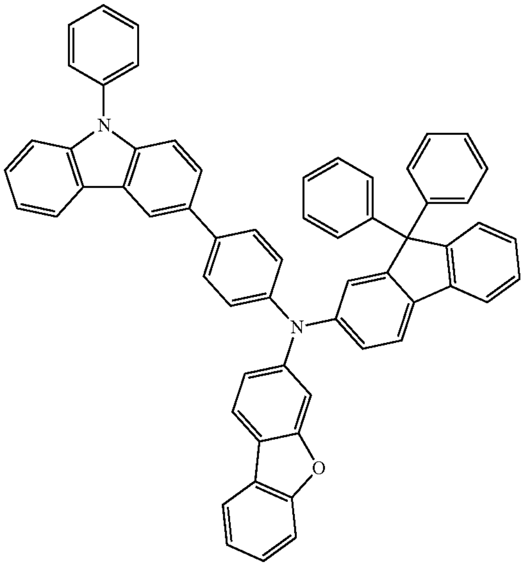
HT8
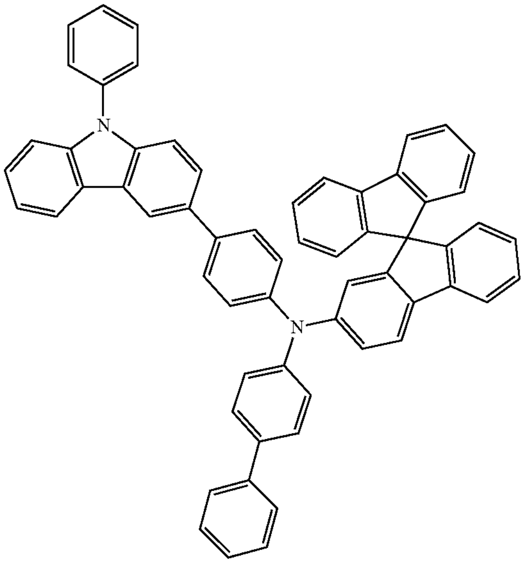

-continued
HT9
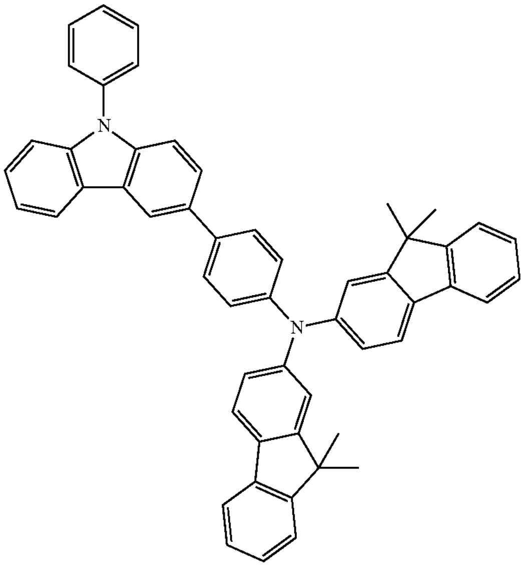
HT10
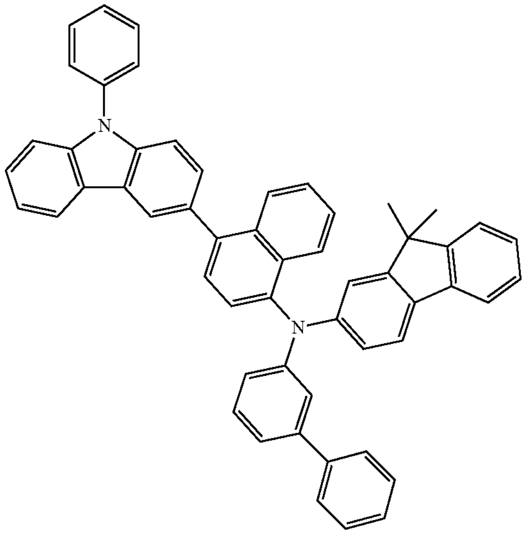
HT11
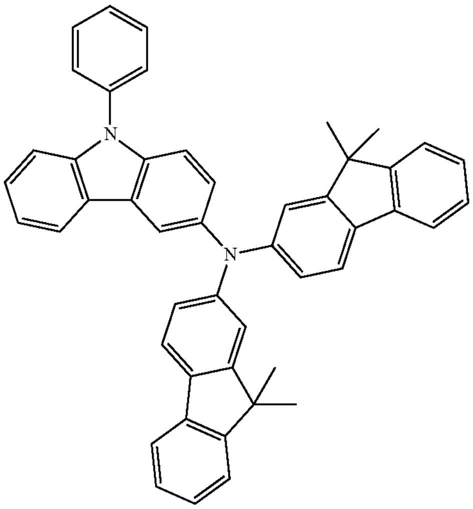
HT12
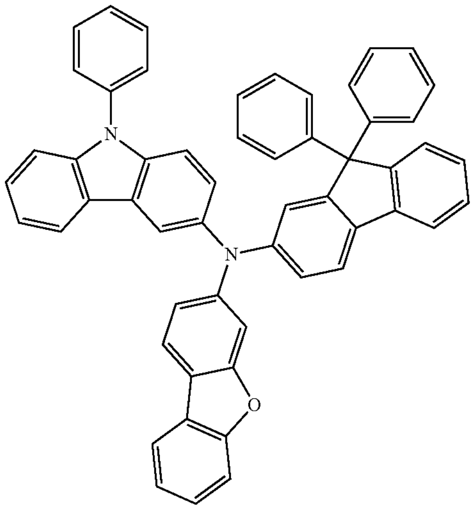

-continued
HT13
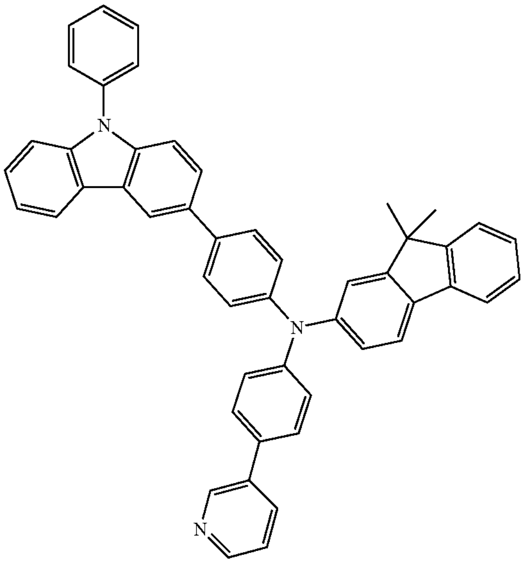
HT14
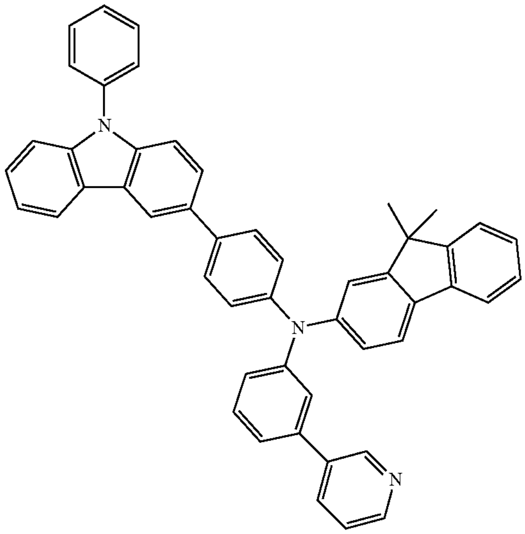
HT15
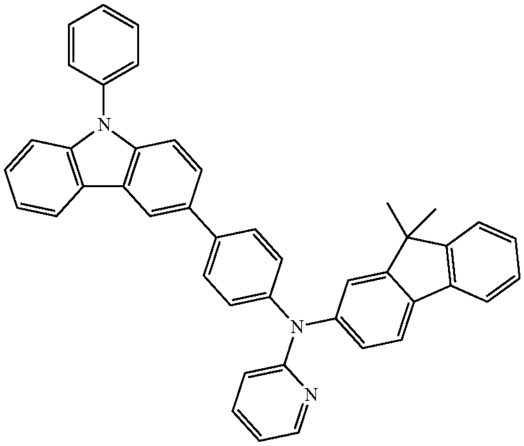
HT16
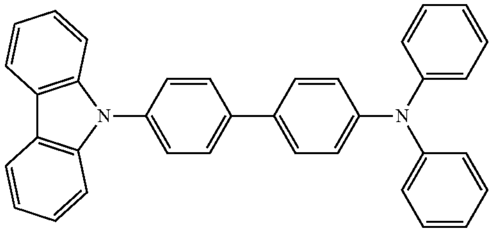
HT17
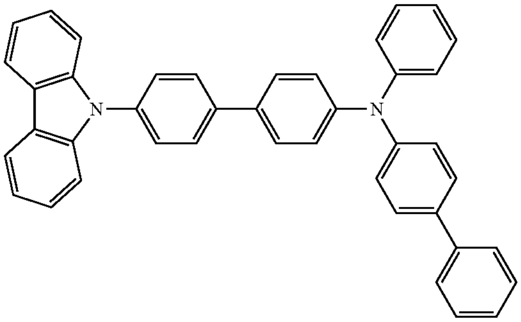
HT18
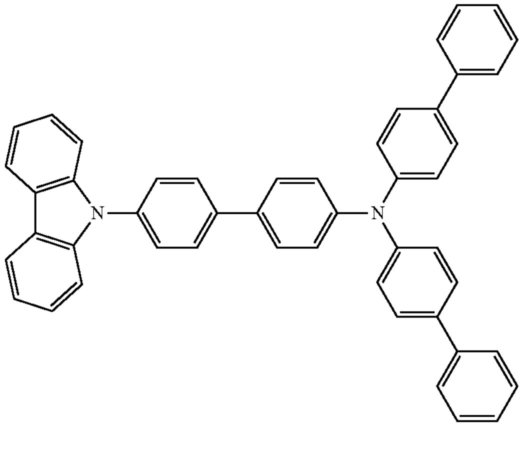

-continued
HT19
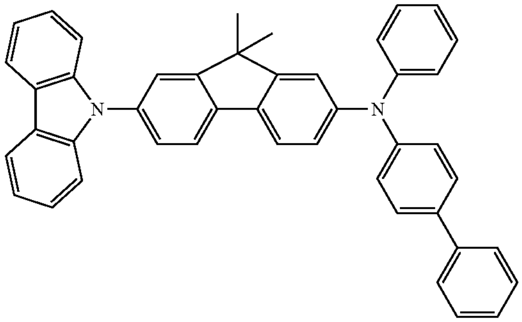
HT20
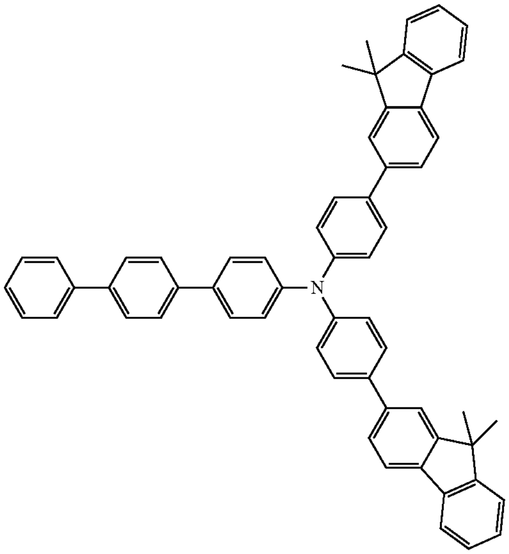
HT21
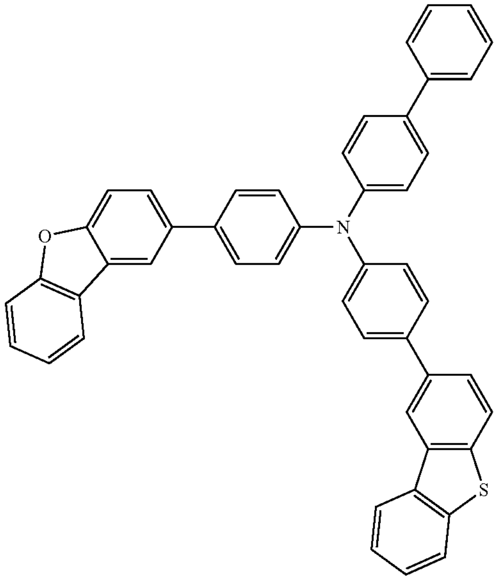
HT22
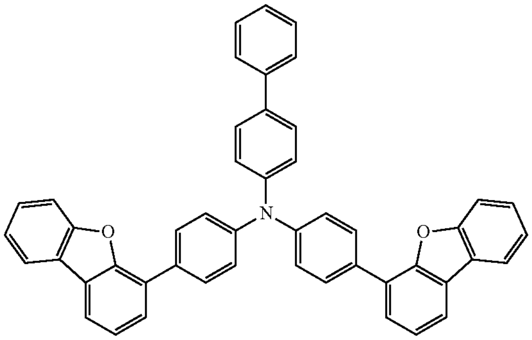
HT23
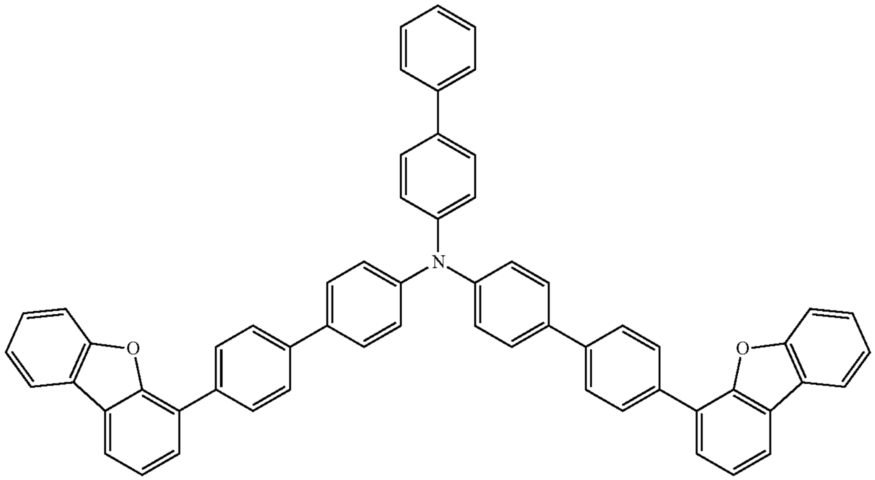

-continued
HT24
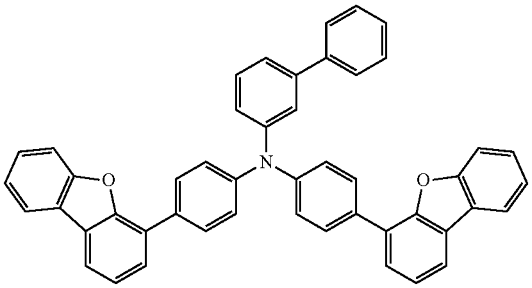
HT25
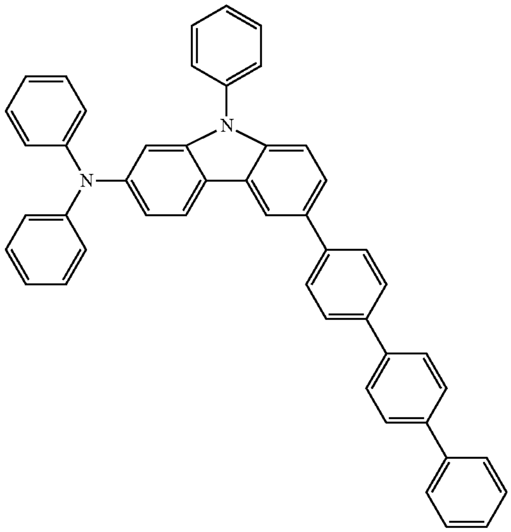
HT26
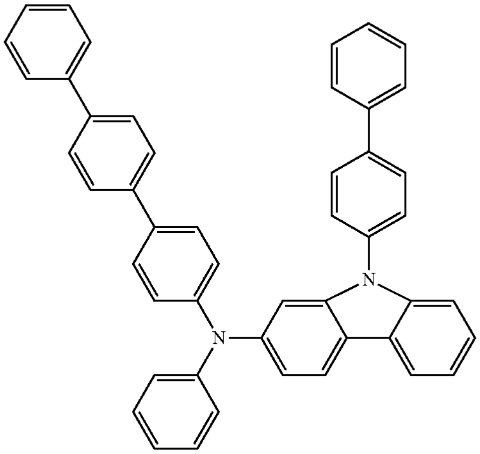
HT27
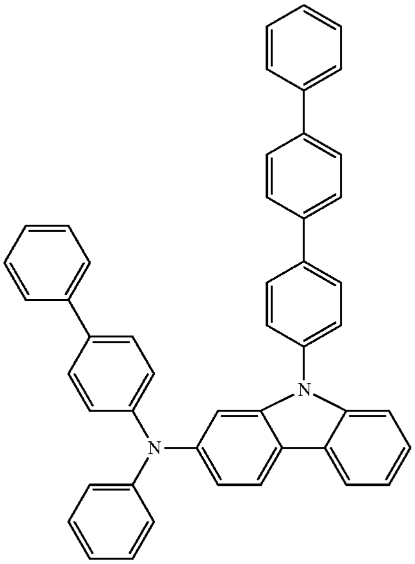
HT28
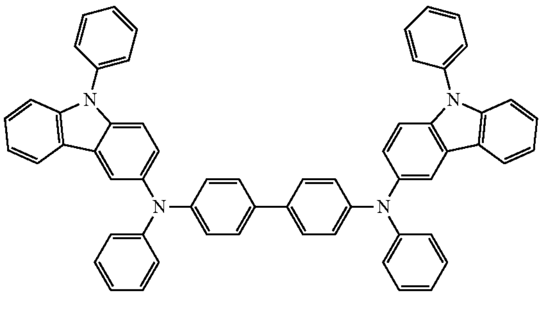
HT29
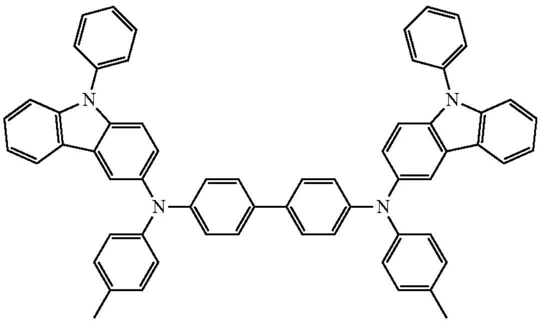

-continued
HT30
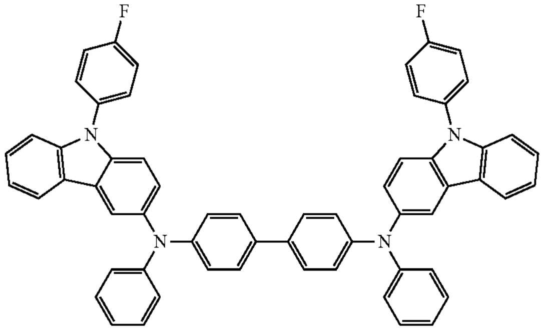
HT31
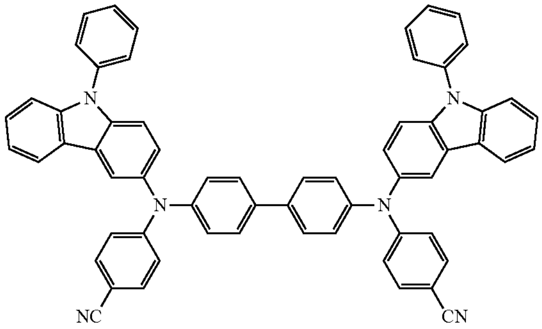
HT32
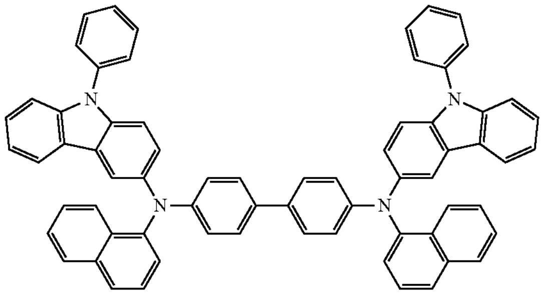
HT33
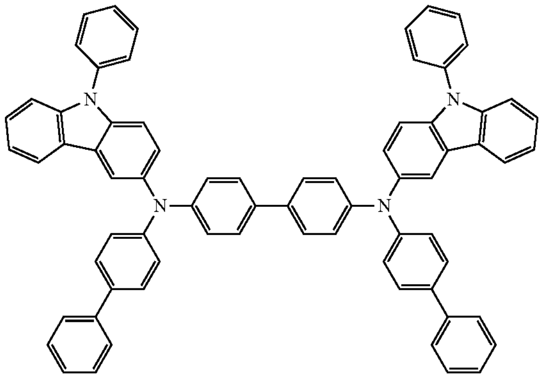
HT34
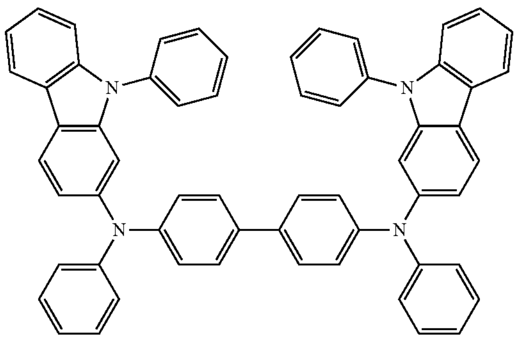
HT35
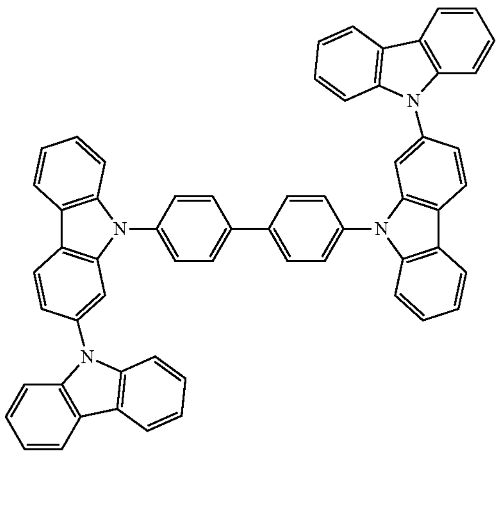

-continued
HT36
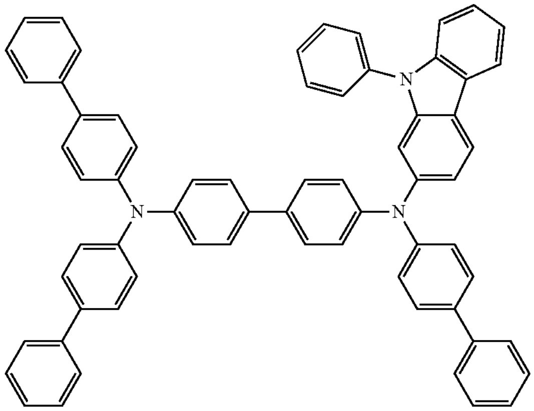
HT37
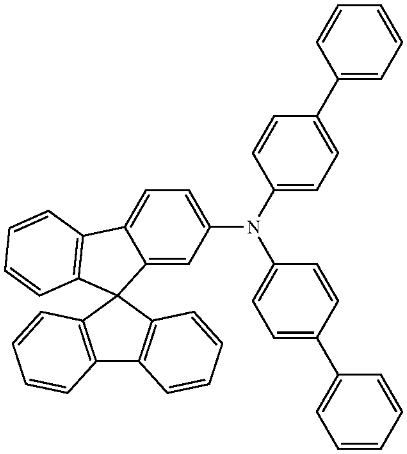
HT38
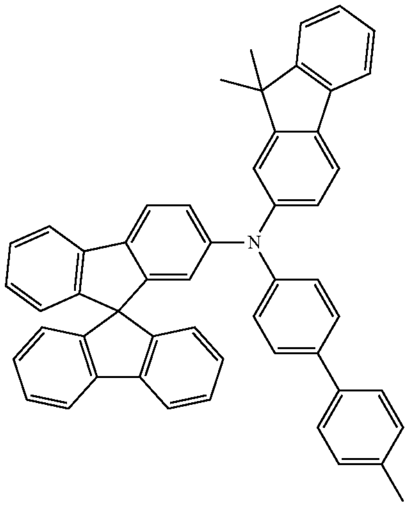
HT39
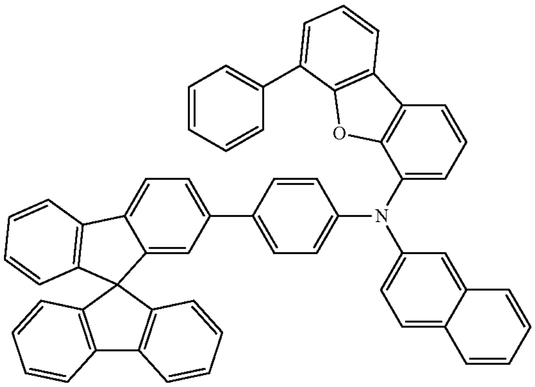
HT40
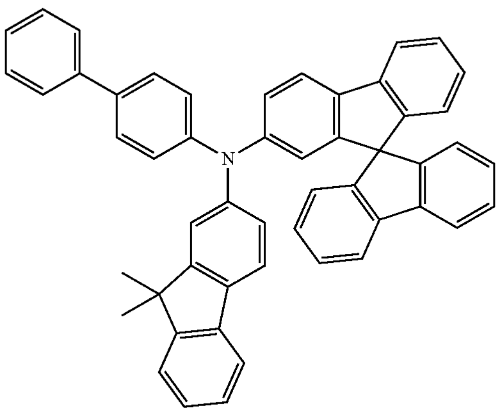
HT41
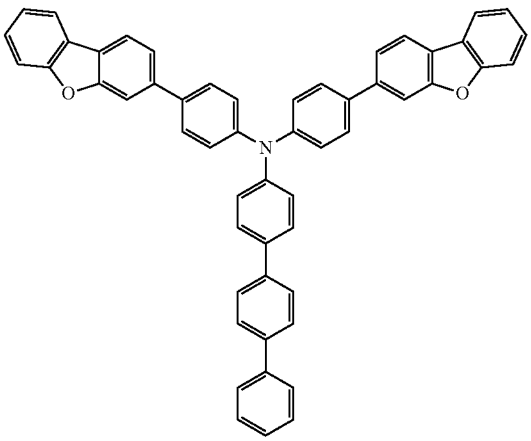

-continued
HT42
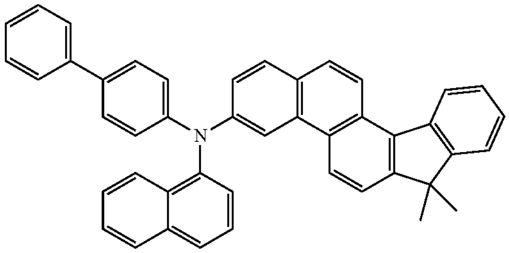
HT43
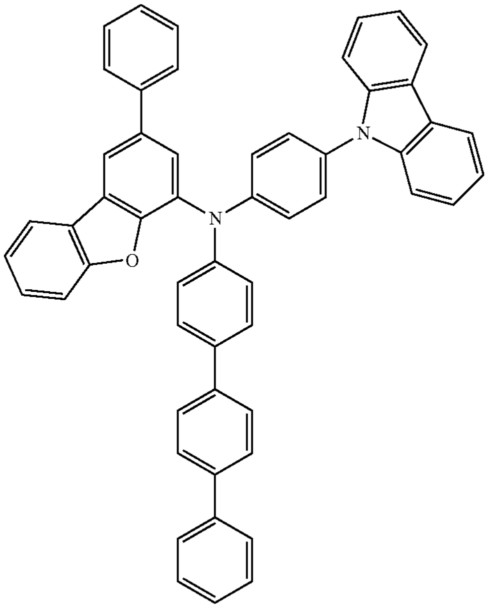
HT44
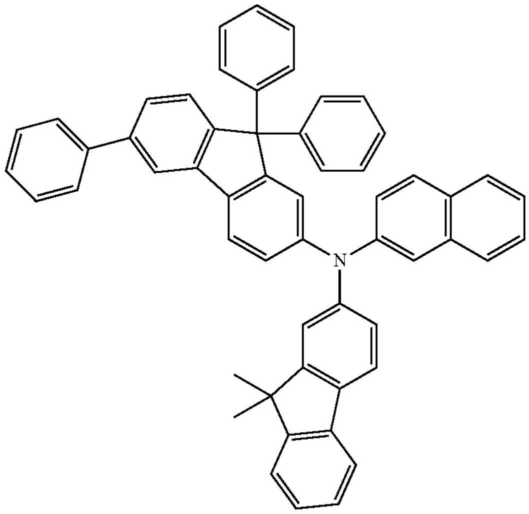
HT45
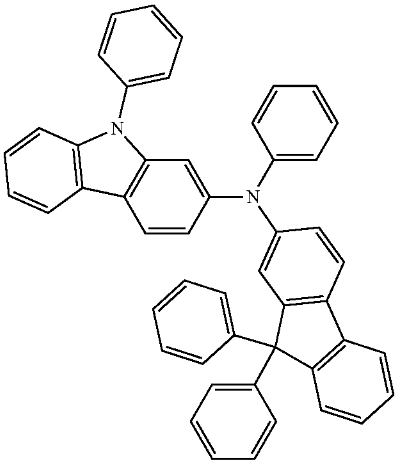

-continued
HT46
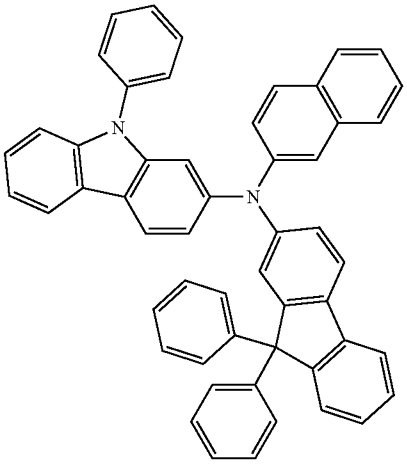
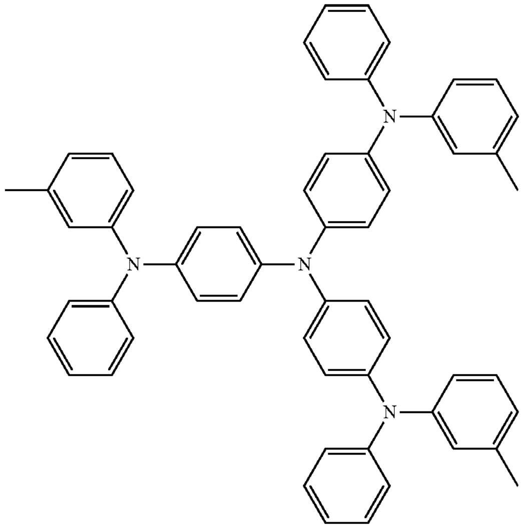
m-MTDATA
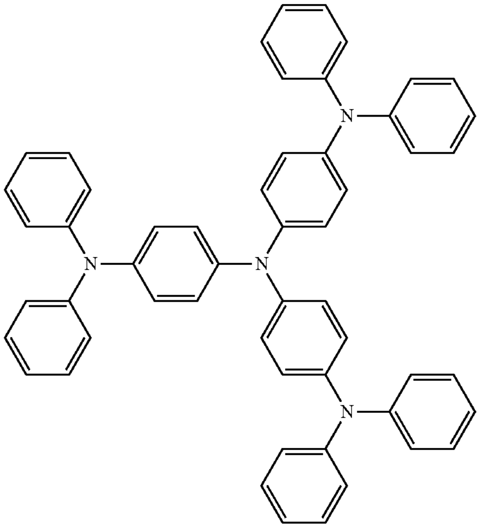
TDATA
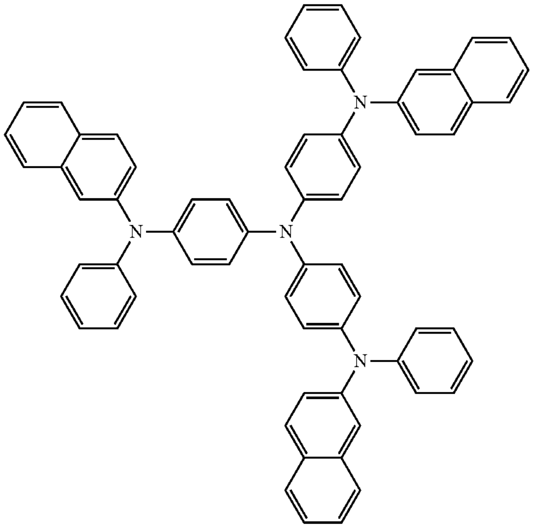
2-TNATA
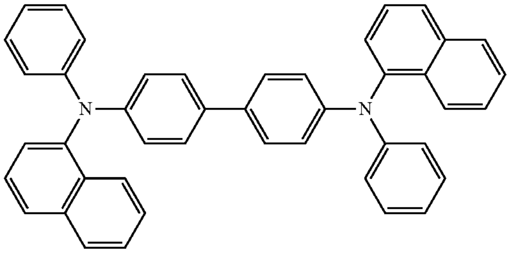
NPB
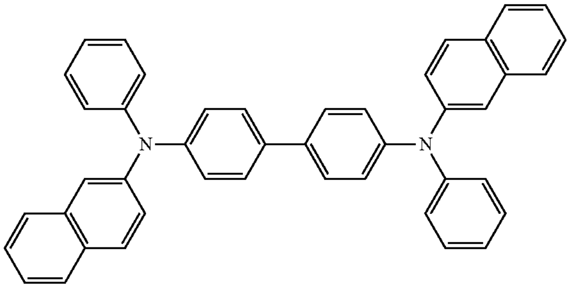
β-NPB
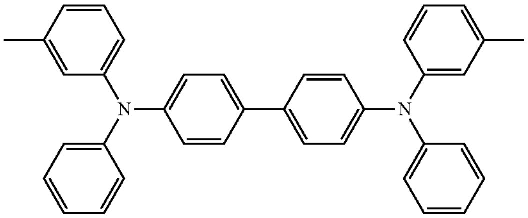
TPD
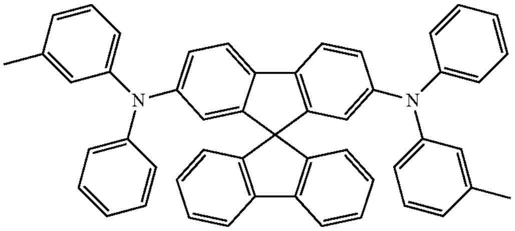
Spiro-TPD -continued

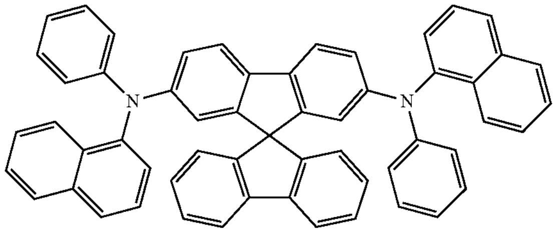

Spiro-NPB

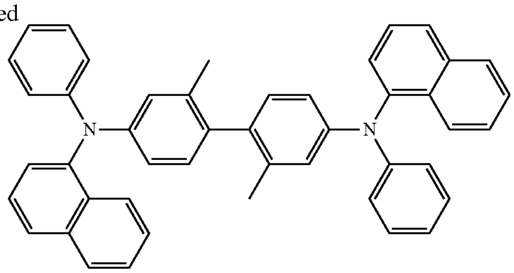

methylated-NPB

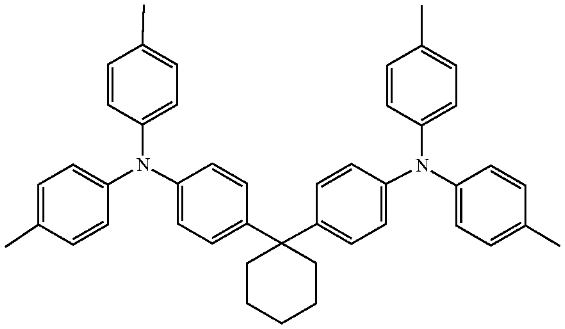

TAPC

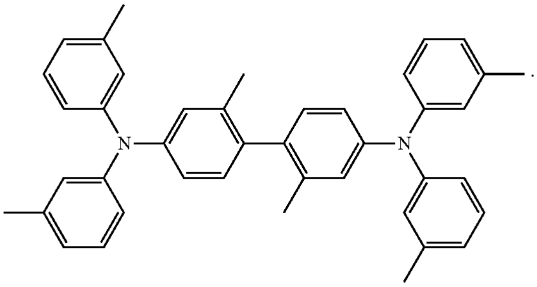

HMTPD

The thickness of the hole transport region may be in a range of about 50 Å to about 10,000 Å, and in some embodiments, about 100 Å to about 4,000 Å. When the hole transport region includes a hole injection layer, a hole transport layer, or a combination thereof, the thickness of the hole injection layer may be in a range of about 100 Å to about 9,000 Å, and in some embodiments, about 100 Å to about 1,000 Å, and the thickness of the hole transport layer may be in a range of about 50 Å to about 2,000 Å, and in some embodiments, about 100 Å to about 1,500 Å. When the thicknesses of the hole transport region, the hole injection layer, and the hole transport layer are within any of these ranges, excellent hole transport characteristics may be obtained without a substantial increase in driving voltage.

The emission auxiliary layer may increase light emission efficiency by compensating for an optical resonance distance according to the wavelength of light emitted by an emission layer. The electron blocking layer may prevent leakage of electrons to a hole transport region from the emission layer. Materials that may be included in the hole transport region may also be included in an emission auxiliary layer and an electron blocking layer.

P-dopant

The hole transport region may include a charge generating material as well as the aforementioned materials to improve conductive properties of the hole transport region. The charge generating material may be substantially homogeneously or non-homogeneously dispersed (for example, as a single layer consisting of charge generating material) in the hole transport region.

The charge generating material may include, for example, a p-dopant.

In some embodiments, a lowest unoccupied molecular orbital (LUMO) energy level of the p-dopant may be about −3.5 eV or less.

In some embodiments, the p-dopant may include a quinone derivative, a compound containing a cyano group, a compound containing element EL1 and element EL2, or a combination thereof.

Examples of the quinone derivative may include 7,7,8,8-tetracyanoquinodimethane (TCNQ), 2,3,5,6-tetrafluoro-7,7,8,8-tetracyanoquinodimethane (F4-TCNQ), or the like, or a combination thereof.

Examples of the compound containing a cyano group include 1,4,5,8,9,11-hexaazatriphenylene-hexacarbonitrile (HAT-CN), a compound represented by Formula 221, or the like, or a combination thereof:

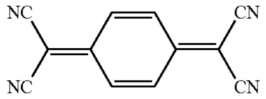

TCNQ

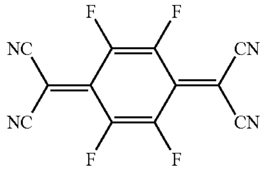

F4-TCNQ

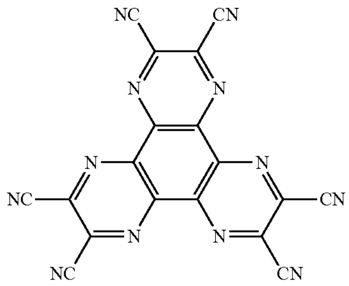

HAT-CN

-continued

Formula 221

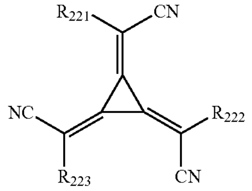

wherein, in Formula 221, $R_{221}$ to $R_{223}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, at least one of $R_{221}$ to $R_{223}$ may each independently be: a $C_3$-$C_{60}$ carbocyclic group or a $C_1$-$C_{60}$ heterocyclic group, substituted with at least one of a cyano group; —F; —Cl; —Br; —I; a $C_1$-$C_{20}$ alkyl group substituted with at least one of a cyano group, —F, —Cl, —Br, —I, —$SF_5$, or a combination thereof; or a combination thereof.

In the compound containing element EL1 and element EL2, element EL1 may be a metal, a metalloid, or a combination thereof, and element EL2 may be non-metal, a metalloid, or a combination thereof.

Examples of the metal may include: an alkali metal (e.g., lithium (Li), sodium (Na), potassium (K), rubidium (Rb), cesium (Cs), or the like, or a combination thereof); an alkaline earth metal (e.g., beryllium (Be), magnesium (Mg), calcium (Ca), strontium (Sr), barium (Ba), or the like, or a combination thereof); a transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), or the like, or a combination thereof); post-transition metal (e.g., zinc (Zn), indium (In), tin (Sn), or the like, or a combination thereof); a lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or the like, or a combination thereof); or a combination thereof.

Examples of the metalloid may include silicon (Si), antimony (Sb), tellurium (Te), or the like, or a combination thereof.

Examples of the non-metal may include oxygen (O), halogen (e.g., F, Cl, Br, I, or the like, or a combination thereof), or the like, or a combination thereof.

For example, the compound containing element EL1 and element EL2 may include a metal oxide, a metal halide (e.g., metal fluoride, metal chloride, metal bromide, metal iodide, or the like, or a combination thereof), a metalloid halide (e.g., a metalloid fluoride, a metalloid chloride, a metalloid bromide, a metalloid iodide, or the like, or a combination thereof), a metal telluride, or the like, or a combination thereof.

Examples of the metal oxide may include a tungsten oxide (e.g., WO, $W_2O_3$, $WO_2$, $WO_3$, $W_2O_5$, or the like, or a combination thereof), a vanadium oxide (e.g., VO, $V_2O_3$, $VO_2$, $V_2O_5$, or the like, or a combination thereof), a molybdenum oxide (MoO, $Mo_2O_3$, $MoO_2$, $MoO_3$, $Mo_2O_5$, or the like, or a combination thereof), a rhenium oxide (e.g., $ReO_3$, or the like), a niobium oxide, a tantalum oxide, a titanium oxide, a zinc oxide, a nickel oxide, a copper oxide, a cobalt oxide, a manganese oxide, a chromium oxide, an indium oxide, or the like, or a combination thereof.

Examples of the metal halide may include alkali metal halide, alkaline earth metal halide, transition metal halide, post-transition metal halide, lanthanide metal halide, or the like, or a combination thereof.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, or the like, or a combination thereof.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, or the like, or a combination thereof.

Examples of the transition metal halide may include a titanium halide (e.g., $TiF_4$, $TiCl_4$, $TiBr_4$, $TiI_4$, or the like, or a combination thereof), a zirconium halide (e.g., $ZrF_4$, $ZrCl_4$, $ZrBr_4$, $ZrI_4$, or the like, or a combination thereof), a hafnium halide (e.g., $HfF_4$, $HfCl_4$, $HfBr_4$, $HfI_4$, or the like, or a combination thereof), a vanadium halide (e.g., $VF_3$, $VCl_3$, $VBr_3$, $VI_3$, or the like, or a combination thereof), a niobium halide (e.g., $NbF_3$, $NbCl_3$, $NbBr_3$, $NbI_3$, or the like, or a combination thereof), a tantalum halide (e.g., $TaF_3$, $TaCl_3$, $TaBr_3$, $Ta_{13}$, or the like, or a combination thereof), a chromium halide (e.g., $CrF_3$, $CrCl_3$, $CrBr_3$, $CrI_3$, or the like, or a combination thereof), a molybdenum halide (e.g., $MoF_3$, $MoCl_3$, $MoBr_3$, $MoI_3$, or the like, or a combination thereof), a tungsten halide (e.g., $WF_3$, $WCl_3$, $WBr_3$, $WI_3$, or the like, or a combination thereof), a manganese halide (e.g., $MnF_2$, $MnCl_2$, $MnBr_2$, $MnI_2$, or the like, or a combination thereof), a technetium halide (e.g., $TcF_2$, $TcCl_2$, $TcBr_2$, $TcI_2$, or the like, or a combination thereof), a rhenium halide (e.g., $ReF_2$, $ReCl_2$, $ReBr_2$, $ReI_2$, or the like, or a combination thereof), an iron halide (e.g., $FeF_2$, $FeCl_2$, $FeBr_2$, $FeI_2$, or the like, or a combination thereof), a ruthenium halide (e.g., $RuF_2$, $RuCl_2$, $RuBr_2$, $RuI_2$, or the like, or a combination thereof), an osmium halide (e.g., $OsF_2$, $OSC_{12}$, $OsBr_2$, $OsI_2$, or the like, or a combination thereof), a cobalt halide (e.g., $CoF_2$, $COC_{12}$, $CoBr_2$, $CoI_2$, or the like, or a combination thereof), a rhodium halide (e.g., $RhF_2$, $RhCl_2$, $RhBr_2$, $RhI_2$, or the like, or a combination thereof), an iridium halide (e.g., $IrF_2$, $IrCl_2$, $IrBr_2$, $IrI_2$, or the like, or a combination thereof), a nickel halide (e.g., $NiF_2$, $NiCl_2$, $NiBr_2$, $NiI_2$, or the like, or a combination thereof), a palladium halide (e.g., $PdF_2$, $PdCl_2$, $PdBr_2$, $PdI_2$, or the like, or a combination thereof), a platinum halide (e.g., $PtF_2$, $PtCl_2$, $PtBr_2$, $PtI_2$, or the like, or a combination thereof), a copper halide (e.g., CuF, CuCl, CuBr, CuI, or the like, or a combination thereof), a silver halide (e.g., AgF, AgCl, AgBr, AgI, or the like, or a combination thereof), a gold halide (e.g., AuF, AuCl, AuBr, AuI, or the like, or a combination thereof), or a combination thereof.

Examples of the post-transition metal halide may include a zinc halide (e.g., $ZnF_2$, $ZnCl_2$, $ZnBr_2$, $ZnI_2$, or the like, or a combination thereof), an indium halide (e.g., $InI_3$, or the like), a tin halide (e.g., $SnI_2$, or the like), or the like, or a combination thereof.

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, $SmI_3$, or the like, or a combination thereof.

Examples of the metalloid halide may include an antimony halide (e.g., $SbCl_5$, or the like).

Examples of the metal telluride may include an alkali metal telluride (e.g., $Li_2Te$, $Na_2Te$, $K_2Te$, $Rb_2Te$, $Cs_2Te$, or the like, or a combination thereof), an alkaline earth metal telluride (e.g., BeTe, MgTe, CaTe, SrTe, BaTe, or the like, or a combination thereof), a transition metal telluride (e.g., $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, or the like, or a combination thereof), a post-transition metal telluride (e.g., ZnTe, or the like), a lanthanide metal telluride (e.g., LaTe, CeTe, PrTe, NdTe, PmTe, EuTe, GdTe, TbTe, DyTe, HoTe, ErTe, TmTe, YbTe, LuTe, or the like, or a combination thereof), or a combination thereof.

Anode 150

The anode 150 may be on the interlayer 130.

The anode 150 may include an anode material that may be a high work function material that may easily inject holes.

The anode 150 may be a reflective electrode, a semi-transmissive electrode, or a transmissive electrode. When the anode 150 is a transmissive electrode, a material for forming the anode 150 may be indium tin oxide (ITO), indium zinc oxide (IZO), tin oxide ($SnO_2$), zinc oxide (ZnO), or a combination thereof. In some embodiments, when the anode 150 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or a combination thereof may be used as a material for forming the anode 150.

The anode 150 may have a single-layered structure consisting of a single layer or a multi-layered structure including two or more layers. In some embodiments, the anode 150 may have a triple-layered structure of ITO/Ag/ITO.

Capping Layer

A first capping layer may be located outside the cathode 110, and/or a second capping layer may be located outside the anode 150. In some embodiments, the light-emitting device 10 may have a structure in which the first capping layer, the cathode 110, the interlayer 130, and the anode 150 are sequentially stacked in this stated order, a structure in which the cathode 110, the interlayer 130, the anode 150, and the second capping layer are sequentially stacked in this stated order, or a structure in which the first capping layer, the cathode 110, the interlayer 130, the anode 150, and the second capping layer are sequentially stacked in this stated order.

In the light-emitting device 10, light emitted from the emission layer in the interlayer 130 may pass through the cathode 110 (which may be a semi-transmissive electrode or a transmissive electrode) and through the first capping layer to the outside. In the light-emitting device 10, light emitted from the emission layer in the interlayer 130 may pass through the anode 150 (which may be a semi-transmissive electrode or a transmissive electrode) and through the second capping layer to the outside.

The first capping layer and the second capping layer may improve the external luminescence efficiency based on the principle of constructive interference. Accordingly, the optical extraction efficiency of the light-emitting device 10 may be increased, thus improving the luminescence efficiency of the light-emitting device 10.

The first capping layer and the second capping layer may each include a material having a refractive index of about 1.6 or greater (at 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or a combination thereof. The carbocyclic compound, the heterocyclic compound, and the amine group-containing compound may optionally be substituted with a substituent of O, N, S, Se, Si, F, Cl, Br, I, or a combination thereof. In some embodiments, at least one of the first capping layer and the second capping layer may each independently include an amine group-containing compound.

In some embodiments, at least one of the first capping layer and the second capping layer may each independently include the compound represented by Formula 201, the compound represented by Formula 202, or a combination thereof.

In one or more embodiments, at least one of the first capping layer and the second capping layer may each independently include one of Compounds HT28 to HT33, one of Compounds CP1 to CP7, p-NPB, or a combination thereof:

CP1

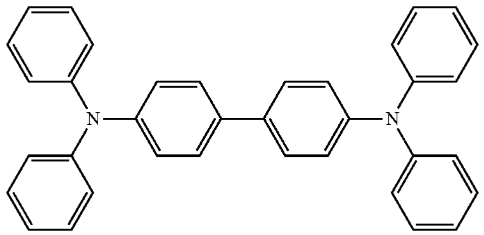

-continued
CP2
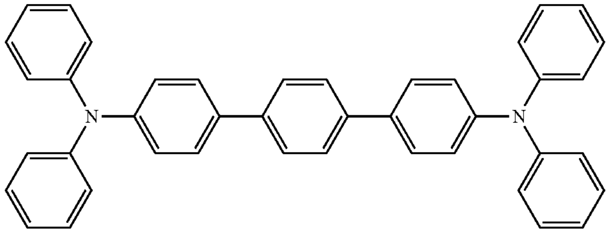
CP3
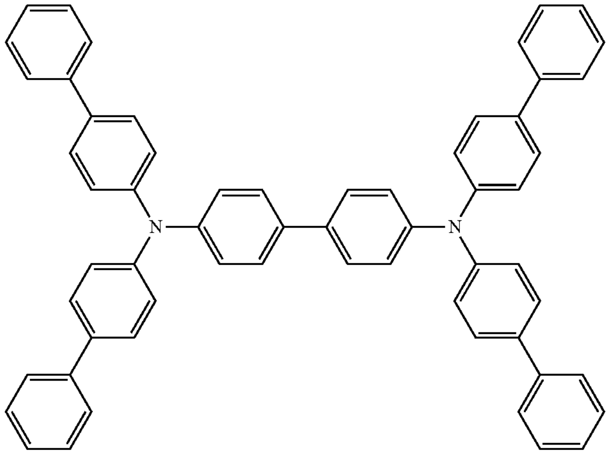
CP4
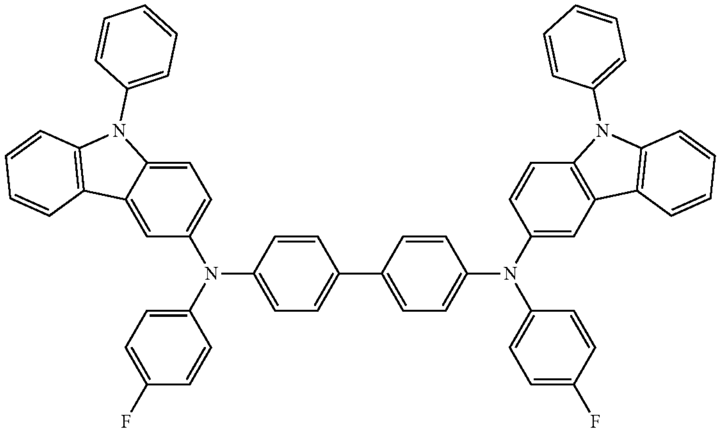
CP5
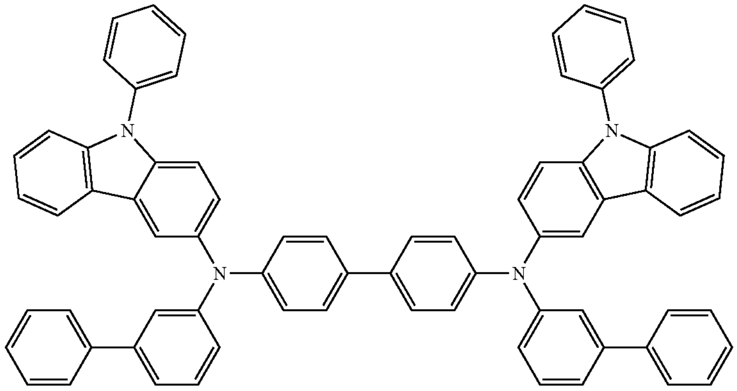

-continued

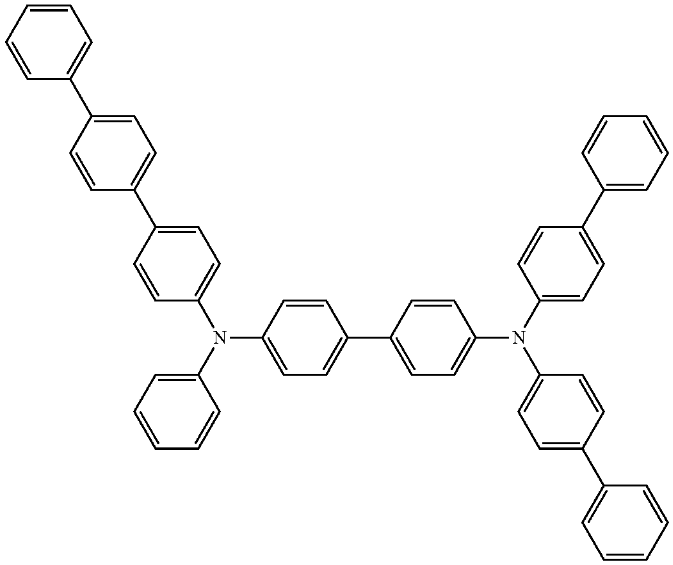

CP6

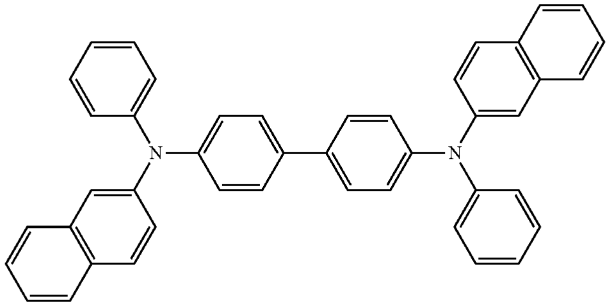

β-NPB

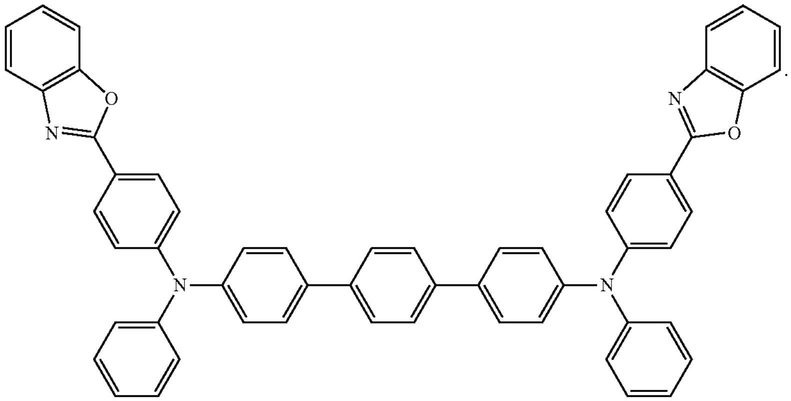

CP7

Electronic Apparatus

The light-emitting device may be included in various electronic apparatuses. In some embodiments, an electronic apparatus including the light-emitting device may be a light-emitting apparatus or an authentication apparatus.

The electronic apparatus (e.g., a light-emitting apparatus) may further include, in addition to the light-emitting device, i) a color filter, ii) a color-conversion layer, or iii) a color filter and a color-conversion layer. The color filter and/or the color-conversion layer may be disposed on at least one traveling direction of light emitted from the light-emitting device. For example, light emitted from the light-emitting device may be blue light or white light. The light-emitting device may be understood by referring to the descriptions provided herein. In some embodiments, the color-conversion layer may include quantum dots. The quantum dot may be, for example, the quantum dot described herein.

The electronic apparatus may include a first substrate. The first substrate may include a plurality of sub-pixel areas, the color filter may include a plurality of color filter areas respectively corresponding to the plurality of sub-pixel areas, and the color-conversion layer may include a plurality of color-conversion areas respectively corresponding to the plurality of sub-pixel areas.

A pixel-defining film may be located between the plurality of sub-pixel areas to define each sub-pixel area.

The color filter may further include a plurality of color filter areas and light-blocking patterns located between the plurality of color filter areas, and the color-conversion layer may further include a plurality of color-conversion areas and light-blocking patterns located between the plurality of color-conversion areas.

The plurality of color filter areas (or a plurality of color-conversion areas) may include: a first area emitting first color light; a second area emitting second color light; and/or a third area emitting third color light, and the first color light, the second color light, and/or the third color light may have different maximum emission wavelengths. In some embodiments, the first color light may be red light, the second color light may be green light, and the third color light may be blue light. In some embodiments, the plurality of color filter areas (or the plurality of color-conversion areas) may each include one or more quantum dots. In some embodiments, the first area may include one or more red quantum dots, the second area may include one or more green quantum dots, and the third area may not include a quantum dot. The quantum dot may be understood by referring to the description of the quantum dot provided herein. The first area, the second area, and/or the third area may each further include an emitter.

In some embodiments, the light-emitting device may emit first light, the first area may absorb the first light to emit 1-1 color light, the second area may absorb the first light to emit 2-1 color light, and the third area may absorb the first light to emit 3-1 color light. In this embodiment, the 1-1 color light, the 2-1 color light, and the 3-1 color light may each have a different maximum emission wavelength. In some embodiments, the first light may be a blue light, the 1-1 color light may be a red light, the 2-1 color light may be a green light, and the 3-1 light may be a blue light.

The electronic apparatus may further include a thin-film transistor, in addition to the light-emitting device. The thin-film transistor may include a source electrode, a drain electrode, and an active layer, wherein one of the source electrode and the drain electrode may be electrically connected to one of the cathode and the anode of the light-emitting device.

The thin-film transistor may further include a gate electrode, a gate insulating film, or the like, or a combination thereof.

The active layer may include a crystalline silicon, an amorphous silicon, an organic semiconductor, an oxide semiconductor, or a combination thereof.

The electronic apparatus may further include an encapsulation unit for sealing the light-emitting device. The encapsulation unit may be located between the color filter and/or the color-conversion layer and the light-emitting device. The encapsulation unit may allow light to pass to the outside from the light-emitting device and to prevent the air and moisture from permeating into the light-emitting device at the same time. The encapsulation unit may be a sealing substrate including a transparent glass or a plastic substrate. The encapsulation unit may be a thin-film encapsulating layer including at least one of an organic layer and/or an inorganic layer. When the encapsulation unit is a thin-film encapsulating layer, the electronic apparatus may be flexible.

In addition to the color filter and/or the color-conversion layer, various functional layers may be disposed on the encapsulation unit depending on the use of an electronic apparatus. Examples of the functional layer may include a touch screen layer, a polarizing layer, or the like. The touch screen layer may be a resistive touch screen layer, a capacitive touch screen layer, or an infrared beam touch screen layer. The authentication apparatus may be, for example, a biometric authentication apparatus that identifies an individual according to biometric information (e.g., a fingertip, a pupil, or the like).

The authentication apparatus may further include a biometric information collecting unit, in addition to the light-emitting device described above.

The electronic apparatus may be applicable to various displays, an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, or an endoscope display device), a fish finder, various measurement devices, gauges (e.g., gauges of an automobile, an airplane, or a ship), and a projector.

Figure 2:
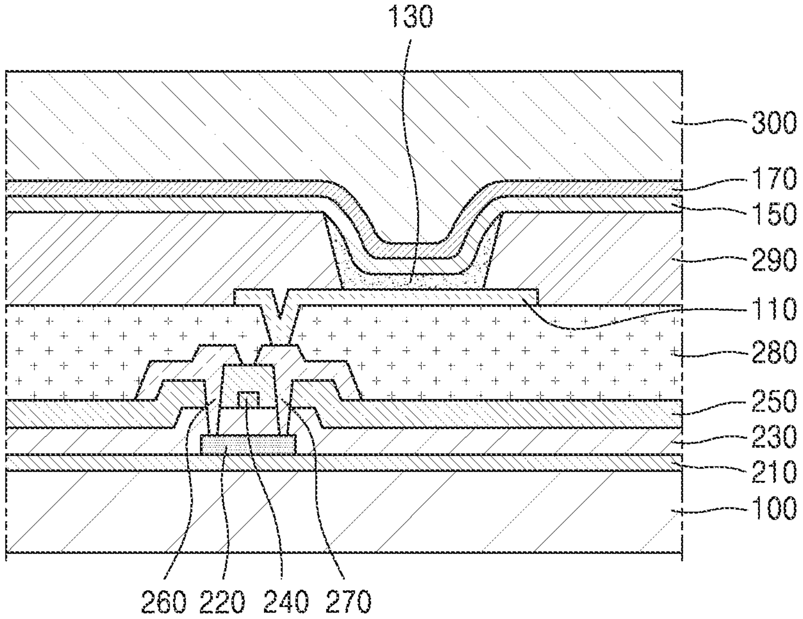
FIG. 2 is a schematic cross-sectional view of a light-emitting apparatus according to one or more embodiments.
Figure 3:
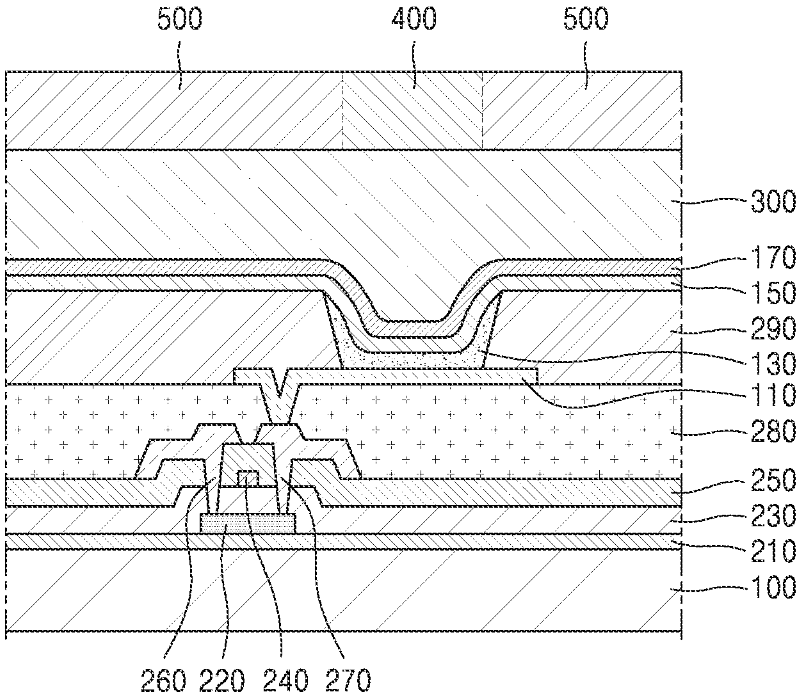
FIG. 3 is a schematic cross-sectional view of a light-emitting apparatus according to one or more embodiments.

Descriptions of FIGS. 2 and 3

FIG. 2 is a schematic cross-sectional view of one or more embodiments of a light-emitting apparatus.

An emission apparatus in FIG. 2 may include a substrate 100, a thin-film transistor, a light-emitting device, and an encapsulation unit 300 sealing the light-emitting device.

The substrate 100 may be a flexible substrate, a glass substrate, or a metal substrate. A buffer layer 210 may be on the substrate 100. The buffer layer 210 may prevent penetration of impurities through the substrate 100 and provide a flat surface on the substrate 100.

A thin-film transistor may be on the buffer layer 210. The thin-film transistor may include an active layer 220, a gate electrode 240, a source electrode 260, and a drain electrode 270.

The active layer 220 may include an inorganic semiconductor such as silicon or polysilicon, an organic semiconductor, or an oxide semiconductor and include a source area, a drain area, and a channel area.

A gate insulating film 230 for insulating the active layer 220 and the gate electrode 240 may be on the active layer 220, and the gate electrode 240 may be on the gate insulating film 230.

An interlayer insulating film 250 may be on the gate electrode 240. The interlayer insulating film 250 may be located between the gate electrode 240 and the source electrode 260 and located between the gate electrode 240 and the drain electrode 270 to provide insulation therebetween.

The source electrode 260 and the drain electrode 270 may be on the interlayer insulating film 250. The interlayer insulating film 250 and the gate insulating film 230 may be formed to expose the source area and the drain area of the active layer 220, and the source electrode 260 and the drain electrode 270 may be adjacent to the exposed source area and the exposed drain area of the active layer 220.

Such a thin-film transistor may be electrically connected to a light-emitting device to drive the light-emitting device and may be protected by a passivation layer 280. The passivation layer 280 may include an inorganic insulating film, an organic insulating film, or a combination thereof. A light-emitting device may be on the passivation layer 280. The light-emitting device 10 may include the cathode 110, the interlayer 130, and the anode 150.

The cathode 110 may be located on the passivation layer 280. The passivation layer 280 may not fully cover the drain electrode 270 and expose a specific area of the drain electrode 270, and the cathode 110 may be disposed to connect to the exposed area of the drain electrode 270.

A pixel-defining film 290 including an insulating material may be located on the cathode 110. The pixel-defining film 290 may expose a specific area of the first electrode 110, and the interlayer 130 may be formed in the exposed area of the cathode 110. The pixel-defining film 290 may be a polyimide or poly(acrylic) organic film. Although it is not shown in FIG. 2, at least some layers of the interlayer 130 may extend to the upper portion of the pixel-defining film 290 to be located in the form of a common layer (i.e., may be provided as a common layer).

The anode 150 may be on the interlayer 130, and a capping layer 170 may be additionally formed on the anode 150. The capping layer 170 may be formed to cover the anode 150.

The encapsulation unit 300 may be located on the capping layer 170. The encapsulation unit 300 may be located on the light-emitting device to protect a light-emitting device from moisture or oxygen. The encapsulation unit 300 may include: an inorganic film including a silicon nitride ($SiN_x$), a silicon oxide ($SiO_x$), an indium tin oxide, an indium zinc oxide, or a combination thereof; an organic film including a PET, a polyethylene naphthalate, a polycarbonate, a polyimide, a polyethylene sulfonate, a poly(oxymethylene), a poly(arylate), hexamethyldisiloxane, an acrylic resin (e.g., poly(methyl methacrylate), poly(acrylic acid), or the like, or a combination thereof), an epoxy resin (e.g., aliphatic glycidyl ether (AGE), or the like), or a combination thereof; or a combination of the inorganic film and the organic film.

FIG. 3 is a schematic cross-sectional view of another embodiment of a light-emitting apparatus.

The emission apparatus shown in FIG. 3 may be substantially identical to the emission apparatus shown in FIG. 2, except that a light-shielding pattern 500 and a functional area 400 are additionally located on the encapsulation unit 300. The functional area 400 may be i) a color filter area, ii) a color-conversion area, or iii) a combination of a color filter area and a color-conversion area. In some embodiments, the light-emitting device shown in FIG. 3 included in the emission apparatus may be a tandem light-emitting device.

Manufacturing Method

The layers constituting the hole transport region, the emission layer, and the layers constituting the electron transport region may be formed in a specific region by using one or more suitable methods such as vacuum deposition, spin coating, casting, Langmuir-Blodgett (LB) deposition, ink-jet printing, laser printing, and/or laser-induced thermal imaging.

When the layers constituting the hole transport region, the emission layer, and the layers constituting the electron transport region are each formed by vacuum deposition, the vacuum deposition may be performed at a deposition temperature in a range of about 100° C. to about 500° C. at a vacuum degree in a range of about $10^{-8}$ torr to about $10^{-3}$ torr, and at a deposition rate in a range of about 0.01 Angstroms per second (A/sec) to about 100 Å/sec, depending on the material to be included in each layer and the structure of each layer to be formed.

General Definitions of Terms

The term "$C_3$-$C_{60}$ carbocyclic group" as used herein refers to a cyclic group consisting of carbon atoms only as ring-forming atoms and having 3 to 60 carbon atoms as ring-forming atoms. The term "$C_1$-$C_{60}$ heterocyclic group" as used herein refers to a cyclic group having 1 to 60 carbon atoms as ring-forming atoms in addition to at least one heteroatom selected from N, O, Si, P, Ge, Se, and S as ring-forming atoms other than carbon atoms. The $C_3$-$C_{60}$ carbocyclic group and the $C_1$-$C_{60}$ heterocyclic group may each be a monocyclic group consisting of one ring or a polycyclic group in which at least two rings are condensed.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" refers to a cyclic group having 3 to 60 carbon atoms and not including *—N=*' as a ring-forming moiety. The term "π electron-deficient nitrogen-containing $C_1$-$C_{60}$ cyclic group" as used herein refers to a heterocyclic group having 1 to 60 carbon atoms and *—N=*' as a ring-forming moiety.

In some embodiments, the $C_3$-$C_{60}$ carbocyclic group may be i) a T1 group or ii) a group in which at least two T1 groups are condensed (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a group in which at least two T2 groups are condensed, or iii) a group in which at least one T2 group is condensed with at least one T1 group (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), the π electron-rich $C_3$-$C_{60}$ cyclic group may be i) a T1 group, ii) a condensed group in which at least two T1 groups are condensed, iii) a T3 group, iv) a condensed group in which at least two T3 groups are condensed, or v) a condensed group in which at least one T3 group is condensed with at least one T1 group (for example, a $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, or the like), and the π electron-deficient nitrogen-containing $C_1$-$C_{60}$ cyclic group may be i) a T4 group, ii) a group in which at least two T4 groups are condensed, iii) a group in which at least one T4 group is condensed with at least one T1 group, iv) a group in which at least one T4 group is condensed with at least one T3 group, or v) a group in which at least one T4 group, at least one T1 group, and at least one T3 group are condensed (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, or the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "π electron-rich $C_3$-$C_{60}$ cyclic group", and "π electron-deficient nitrogen-containing $C_1$-$C_{60}$ cyclic group" as used herein may be a group condensed with any suitable cyclic group, a monovalent group, or a polyvalent group (e.g., a divalent group, a trivalent group, a quadrivalent group, or the like), depending on the structure of the formula to which the term is applied. For example, a "benzene group" may be a benzene ring, a phenyl group, a phenylene group, or the like, and this may be understood by one of ordinary skill in the art, depending on the structure of the formula including the "benzene group".

In some embodiments, non-limiting examples of the monovalent $C_3$-$C_{60}$ carbocyclic group and monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and non-limiting examples of the divalent $C_3$-$C_{60}$ carbocyclic group and the monovalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms, and non-limiting examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an iso-nonyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group. Non-limiting examples thereof include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group. Non-limiting examples thereof include an ethynyl group and a propynyl group. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by-$OA_{101}$ (wherein $A_{101}$ is a $C_1$-$C_{60}$ alkyl group). Non-limiting examples thereof include a methoxy group, an ethoxy group, and an isopropyloxy group.

The term "$C_1$-$C_{60}$ alkylthio group" as used herein refers to a monovalent group represented by-$SA_{101}$ (wherein $A_{101}$ is a $C_1$-$C_{60}$ alkyl group).

The term "$C_3$-$C_{10}$ cycloalkyl group" as used herein refers to a monovalent saturated hydrocarbon monocyclic group including 3 to 10 carbon atoms. Non-limiting examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, or a bicyclo[2.2.2]octyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent cyclic group including at least one heteroatom other than carbon atoms as a ring-forming atom and having 1 to 10 carbon atoms. Non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Non-limiting examples thereof include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent cyclic group including at least one heteroatom other than carbon atoms as a ring-forming atom, 1 to 10 carbon atoms, and at least one double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system further including at least one heteroatom other than carbon atoms as a ring-forming atom and 1 to 60 carbon atoms as ring forming atom(s). The term "$C_1$-$C_{60}$ heteroarylene group" as used herein refers to a divalent group having a heterocyclic aromatic system further including at least one heteroatom other than carbon atoms as a ring-forming atom and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be fused.

The term "monovalent non-aromatic condensed polycyclic group" as used herein refers to a monovalent group that has two or more condensed rings and only carbon atoms (e.g., 8 to 60 carbon atoms) as ring forming atoms, wherein the molecular structure when considered as a whole is non-aromatic. Examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom other than carbon atoms (e.g., 1 to 60 carbon atoms), as a ring-forming atom, wherein the molecular structure when considered as a whole is non-aromatic. Examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having substantially the same structure as the monovalent non-aromatic condensed heteropolycyclic group.

The term "$C_6$-$C_{60}$ aryloxy group" as used herein refers to-$OA_{102}$ (wherein $A_{102}$ is a $C_6$-$C_{60}$ aryl group). The term "$C_6$-$C_{60}$ arylthio group" as used herein refers to-$SA_{103}$ (wherein $A_{103}$ is a $C_6$-$C_{60}$ aryl group).

The term "$C_1$-$C_{60}$ heteroaryloxy group" as used herein refers to-$OA_{102}$ (wherein $A_{102}$ is a $C_1$-$C_{60}$ heteroaryl group). The term "$C_1$-$C_{60}$ heteroarylthio group" as used herein refers to-$SA_{103}$ (wherein $A_{103}$ is a $C_1$-$C_{60}$ heteroaryl group).

The term "$C_7$-$C_{60}$ aryl alkyl group" as used herein refers to-$A_{104}A_{105}$ (wherein $A_{104}$ is a $C_1$-$C_{54}$ alkylene group, and $A_{105}$ is a $C_6$-$C_{59}$ aryl group). The term "$C_2$-$C_{60}$ heteroaryl alkyl group" as used herein refers to-$A_{106}A_{107}$ (wherein $A_{106}$ is a $C_1$-$C_{59}$ alkylene group, and $A_{107}$ is a $C_1$-$C_{59}$ heteroaryl group).

The term "$R_{10a}$" as used herein may be:

deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof;

a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, a $C_1$-$C_{60}$ heteroaryloxy group, a $C_1$-$C_{60}$ heteroarylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(Q_{11})(Q_{12})$, —$P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, a $C_1$-$C_{60}$ heteroaryloxy group, or a $C_1$-$C_{60}$ heteroarylthio group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, a $C_1$-$C_{60}$ heteroaryloxy group, a $C_1$-$C_{60}$ heteroarylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(Q_{21})(Q_{22})$, —$P(=O)(Q_{21})(Q_{22})$, or a combination thereof; or $Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(Q_{31})(Q_{32})$, or —$P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; —$SF_5$; a hydroxyl group; a cyano group; a nitro group; an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{60}$ carbocyclic group; a $C_1$-$C_{60}$ heterocyclic group; a $C_6$-$C_{60}$ aryloxy group; a $C_6$-$C_{60}$ arylthio group; a $C_7$-$C_{60}$ aryl alkyl group; a $C_2$-$C_{60}$ heteroaryl alkyl group; a $C_1$-$C_{60}$ heteroaryloxy group; or a $C_1$-$C_{60}$ heteroarylthio group; each unsubstituted or substituted with at least one of deuterium, —F, a cyano group, a $C_1$-$C_{60}$ alkyl group, a $C_1$-$C_{60}$ alkoxy group, a $C_1$-$C_{60}$ alkylthio group, a phenyl group, a biphenyl group, or a combination thereof.

The term "heteroatom" as used herein refers to any atom other than a carbon atom. Examples of the heteroatom may include O, S, N, P, Si, B, Ge, Se, or a combination thereof.

A third-row transition metal as used herein may include hafnium (Hf), tantalum (Ta), tungsten (W), rhenium (Re), osmium (Os), iridium (Ir), platinum (Pt), gold (Au), or the like, or a combination thereof.

"Ph" used herein represents a phenyl group, "Me" used herein represents a methyl group, "Et" used herein represents an ethyl group, "tert-Bu" or "$Bu^t$" used herein represents a tert-butyl group, and "OMe" used herein represents a methoxy group.

The term "biphenyl group" as used herein refers to a phenyl group substituted with a phenyl group. The "biphenyl group" belongs to "a substituted phenyl group" having a "$C_6$-$C_{60}$ aryl group" as a substituent.

The term "terphenyl group" as used herein refers to a phenyl group substituted with a biphenyl group. The "terphenyl group" belongs to "a substituted phenyl group" having a "$C_6$-$C_{60}$ aryl group substituted with a $C_6$-$C_{60}$ aryl group" as a substituent.

The symbols * and *' as used herein, unless defined otherwise, refer to a binding site to an adjacent atom in a corresponding formula or moiety.

Hereinafter, a light-emitting device and a compound according to one or more embodiments will be described in more detail with reference to Examples. The wording "B was used instead of A" used in describing Examples means that an amount of B used was identical to an amount of A used in terms of molar equivalents.

EXAMPLES

Example 1

As a cathode, a glass substrate on which ITO were deposited was cut to a size of 50 millimeters (mm)×50 mm×0.7 mm, sonicated in isopropyl alcohol and deionized (DI) water for 5 minutes in each solvent, cleaned with ultraviolet rays for 30 minutes, and then ozone, and the glass substrate was mounted on a vacuum deposition apparatus.

A solution including ZnMgO and Compound TAG1 at a weight ratio of 99:1 was coated on the ITO electrode, followed by heat treatment at a temperature of 100° C. for 10 minutes, thereby forming an electron transport layer having a thickness of 480 Å.

An emission layer having a thickness of 200 Å and including InP/ZnSe/ZnS core-shell quantum dots was formed on the electron injection layer.

A hole transport layer having a thickness of 400 Å and including HT45 was formed on the emission layer, and then a hole injection layer having a thickness of 1,700 Å and including TCNQ was formed.

Ag was deposited on the hole injection layer to form an anode having a thickness of 1,000 Å, and CP7 was vacuum-deposited on the anode to form a capping layer having a thickness of 550 Å, thereby completing the manufacture of a light-emitting device.

Example 2

A light-emitting device was manufactured in a similar manner as in Example 1, except that ZnMgO and Compound TAG8 were used instead of ZnMgO and Compound TAG1 to form the electron transport layer.

Comparative Example 1

A light-emitting device was manufactured in a similar manner as in Example 1, except that ZnMgO was used instead of ZnMgO and Compound TAG1 to form the electron transport layer.

Evaluation Example 1

The driving voltage, operating voltage at a required luminance (610 candela per square meter (cd/$m^2$)), luminescence efficiency (candela per ampere, cd/A), external quantum efficiency (%), full width at half maximum (nm),

HT45

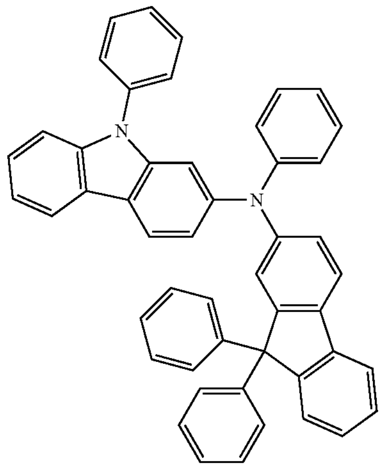

TCNQ

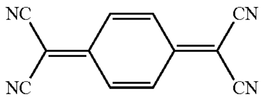

CP7

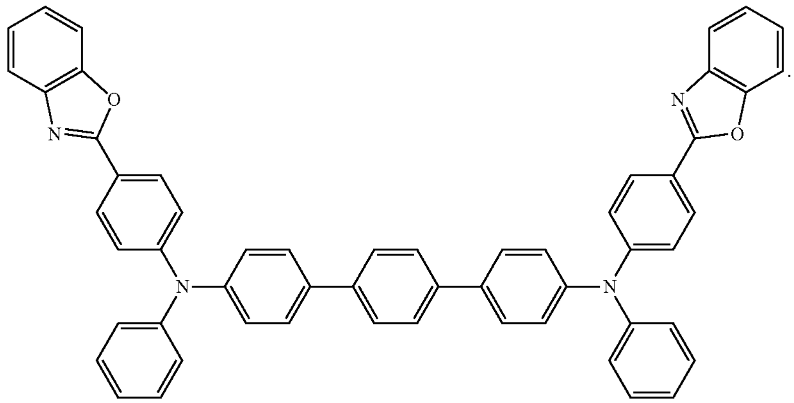
.

color-coordinates (CIE_x, CIE_y), and maximum emission wavelength ($\lambda_{max}$, nm) of the light-emitting devices manufactured in Examples 1 and 2 and Comparative Example 1 at a current density of 10 $mA/cm^2$ were measured by a current voltmeter (Keithley SMU 236), luminance meter PR650, and Hamamatsu Absolute PL Measurement System C9920-2-12. The results thereof are shown in Tables 1 and 2.

Figure 4:
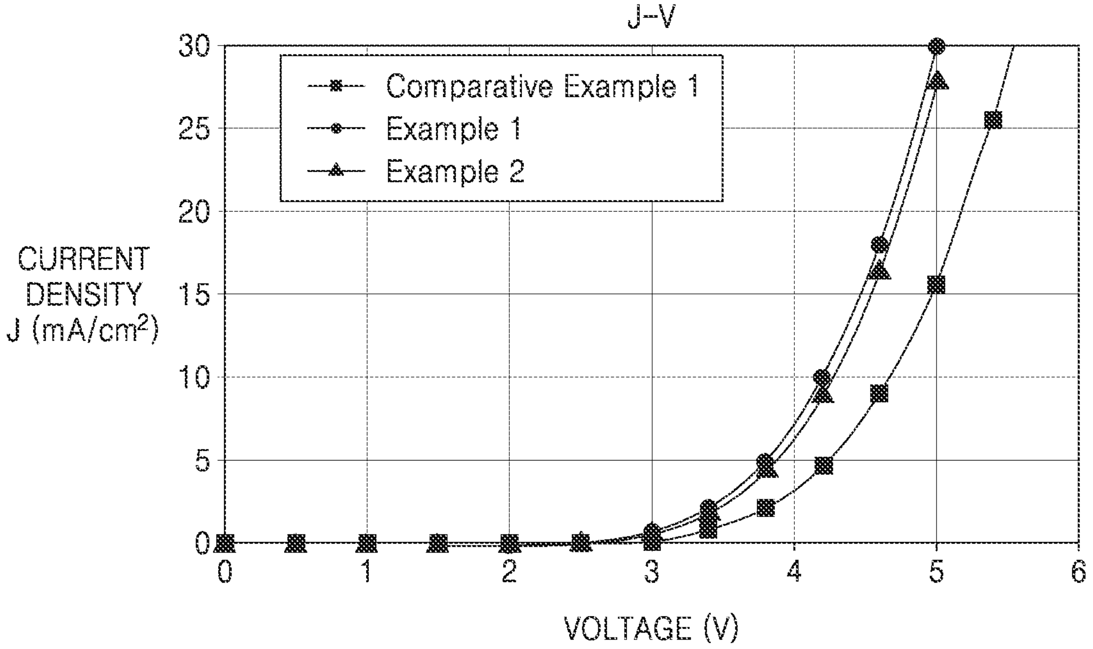
FIG. 4 is a graph of current density (J, milliamperes per square centimeter ($mA/cm^2$)) versus voltage (V) of the light-emitting devices of Examples 1 and 2 and Comparative Example 1.

In addition, the measured value of the current density according to the operating voltage is shown in FIG. 4.

TABLE 1

| | Electron transport layer | Driving voltage (V) @ 10 $mA/cm^2$ | @ required luminance (610 $cd/m^2$) Operating voltage (V) | Luminescence efficiency (Cd/A) | External quantum efficiency (%) | Full width at half maximum (nm) |
|---|---|---|---|---|---|---|
| Example 1 | ZnMgO + TAG1 | 4.2 | 4.1 | 6.8 | 7.5 | 32 |
| Example 2 | ZnMgO + TAG8 | 4.2 | 4.1 | 7.9 | 7.9 | 31 |
| Comparative Example 1 | ZnMgO | 4.7 | 5.1 | 3.2 | 4.7 | 32 |

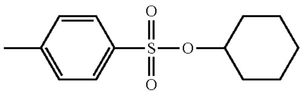

TAG1

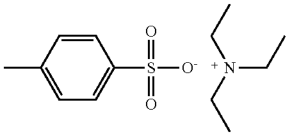

TAG8

TABLE 2

| | Electron transport layer | @ required luminance (610 $cd/m^2$) CIE_x | CIE_y | $\lambda_{max}$ (nm) |
|---|---|---|---|---|
| Example 1 | ZnMgO + TAG1 | 0.698 | 0.301 | 636 |
| Example 2 | ZnMgO + TAG8 | 0.700 | 0.299 | 637 |
| Comparative Example 1 | ZnMgO | 0.698 | 0.301 | 636 |

As shown in Tables 1 and 2 and FIG. 4, the light-emitting devices of Examples 1 and 2 were found to exhibit a low driving voltage and excellent luminescence efficiency, as compared with the light-emitting device of Comparative Example 1.

As apparent from the foregoing description, as the light-emitting device may include a thermal acid generator to prevent deterioration of the light-emitting device, the light-emitting device may be used to manufacture a high-quality electronic apparatus having a low driving voltage and excellent luminescence efficiency.

It should be understood that the exemplary embodiments described herein should be considered in a descriptive sense only and not for purposes of limitation. Descriptions of features or aspects within each exemplary embodiment should typically be considered as available for other similar features or aspects in other embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A light-emitting device, comprising:

a substrate;

a cathode on the substrate;

an anode facing the cathode;

an interlayer comprising an emission layer, wherein the interlayer is located between the cathode and the anode; and a thermal acid generator, wherein the interlayer further comprises an electron transport region located between the cathode and the emission layer, wherein the electron transport region comprises a buffer layer, a hole blocking layer, an electron control layer, an electron transport layer, an electron injection layer, or a combination thereof, and wherein the electron transport region comprises the thermal acid generator, wherein the electron transport region comprises an electron transport layer and an electron injection layer, and the electron transport layer comprises a metal oxide, wherein the electron transport layer comprises the thermal acid generator, the electron injection layer comprises the thermal acid generator, or a combination thereof;

the electron transport region further comprises a thermal acid generating layer comprising the thermal acid generator, wherein the thermal acid generating layer is in direct contact with the electron transport layer;

the electron transport region further comprises a thermal acid generating layer comprising the thermal acid generator, wherein the thermal acid generating layer is in direct contact with the electron injection layer; or a combination thereof.

2. An electronic apparatus, comprising the light-emitting device of claim 1.

3. The electronic apparatus of claim 2, wherein the substrate comprises a plurality of sub-pixel areas, and a pixel-defining film is located between the plurality of sub-pixel areas, wherein the pixel-defining film comprises the thermal acid generator, a thermal acid generating layer comprising the thermal acid generator is comprised in the pixel-defining film, or a combination thereof.

4. The electronic apparatus of claim 3, further comprising a color filter, a color-conversion layer, a touchscreen layer, a polarizing layer, or a combination thereof.

5. The light-emitting device of claim 1, wherein the metal oxide comprises a compound represented by Formula 1:

$$M_xO_y \quad \text{Formula 1}$$

wherein, in Formula 1,

M is at least one metal or metalloid from one of Groups 1 to 14 of the IUPAC Periodic Table of Elements, and x and y are each independently an integer from 1 to 5.

6. The light-emitting device of claim 5, wherein M comprises Zn, Ti, W, Sn, In, Nb, Fe, Ce, Sr, Ba, In, Al, Nb, Si, Mg, Ga, or a combination thereof.

7. The light-emitting device of claim 1, wherein the metal oxide comprises a compound represented by Formula 2:

$$M1_\alpha M2_\beta O_\gamma \quad \text{Formula 2}$$

wherein, in Formula 2,

M1 is metal or metalloid from one of Groups 1 to 14 of the IUPAC Periodic Table of Elements, M2 is metal or metalloid from one of Groups 1 to 14 of the IUPAC Periodic Table of Elements, M1 and M2 are different, and $0<\alpha\leq 2$, $0<\beta\leq 2$, and $1<\gamma\leq 5$.

8. The light-emitting device of claim 7, wherein

M1 comprises Zn, Ti, W, Sn, In, Nb, Fe, Ce, Sr, Ba, In, Al, Nb, or a combination thereof, and M2 comprises Ti, Sn, Si, Mg, Al, Ga, In, or a combination thereof.

9. The light-emitting device of claim 1, wherein the interlayer further comprises a hole transport region located between the emission layer and the anode, and the hole transport region comprises a hole injection layer, a hole transport layer, an emission auxiliary layer, an electron blocking layer, or a combination thereof.

10. The light-emitting device of claim 1, wherein the metal oxide is a zinc-containing oxide.

11. The light-emitting device of claim 1, wherein the thermal acid generator comprises an ammonium compound, a sulfonate compound, or a combination thereof.

12. The light-emitting device of claim 1, wherein the thermal acid generator is a compound represented by Formula 1 or Formula 2:

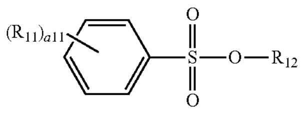

1

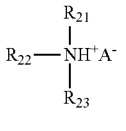

2 wherein, in Formulae 1 and 2, a11 is an integer from 1 to 5, $A^-$ is a counter anion, $R_{11}$, $R_{12}$, and $R_{21}$ to $R_{23}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ aryl alkyl group unsubstituted or substituted with at least one $R_{10a}$, a $C_2$-$C_{60}$ heteroaryl alkyl group unsubstituted or substituted with at least one $R_{10a}$, a $C_1$-$C_{60}$ heteroaryloxy group unsubstituted or substituted with at least one $R_{10a}$, a $C_1$-$C_{60}$ heteroarylthio group unsubstituted or substituted with at least one $R_{10a}$, —$B(Q_1)(Q_2)$, —$P(Q_1)(Q_2)$, or —$C(=O)(Q_1)$, wherein $R_{12}$ and $R_{21}$ to $R_{23}$ are each not hydrogen, when a11 is 2 or greater, two or more of $R_{11}$ in the number of a11 are optionally bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, at least two of $R_{21}$ to $R_{23}$ are optionally bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and $R_{10a}$ is:

deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, a $C_1$-$C_{60}$ heteroaryloxy group, a $C_1$-$C_{60}$ heteroarylthio group, —$Si(Q_{11})(Q_{12})(Q_{13})$, —N($Q_{11}$)($Q_{12}$), —B($Q_{11}$)($Q_{12}$), —C(═O)($Q_{11}$), —S(═O)$_2$($Q_{11}$), —P($Q_{11}$)($Q_{12}$), —P(═O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, or a $C_1$-$C_{60}$ heteroarylthio group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, a $C_1$-$C_{60}$ heteroaryloxy group, a $C_1$-$C_{60}$ heteroarylthio group, —Si($Q_{21}$)($Q_{22}$)($Q_{23}$), —N($Q_{21}$)($Q_{22}$), —B($Q_{21}$)($Q_{22}$), —C(═O)($Q_2$1), —S(═O)$_2$($Q_{21}$), —P($Q_{21}$)($Q_{22}$), —P(═O)($Q_{21}$)($Q_{22}$), or a combination thereof, or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), —P($Q_{31}$)($Q_{32}$), or —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; —$SF_5$; a hydroxyl group; a cyano group; a nitro group; an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{60}$ carbocyclic group; a $C_1$-$C_{60}$ heterocyclic group; a $C_6$-$C_{60}$ aryloxy group; a $C_6$-$C_{60}$ arylthio group; a $C_7$-$C_{60}$ aryl alkyl group; a $C_2$-$C_{60}$ heteroaryl alkyl group; a $C_1$-$C_{60}$ heteroaryloxy group; or a $C_1$-$C_{60}$ heteroarylthio group; each unsubstituted or substituted with at least one of deuterium, —F, a cyano group, a $C_1$-$C_{60}$ alkyl group, a $C_1$-$C_{60}$ alkoxy group, a $C_1$-$C_{60}$ alkylthio group, a phenyl group, a biphenyl group, or a combination thereof.

13. The light-emitting device of claim 1, wherein the thermal acid generator comprises at least one of Compounds TAG1 to TAG8:

TAG1

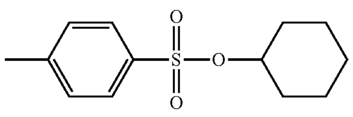

-continued

TAG2

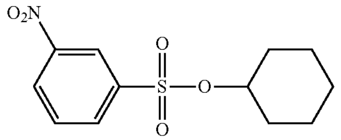

TAG3

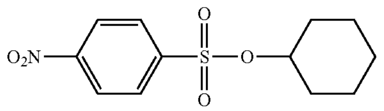

TAG4

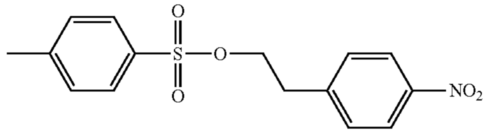

TAG5

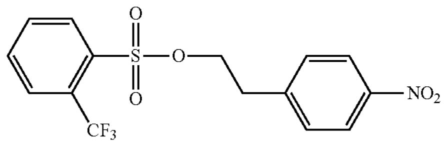

TAG6

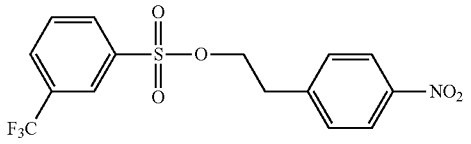

TAG7

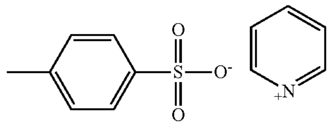

TAG8

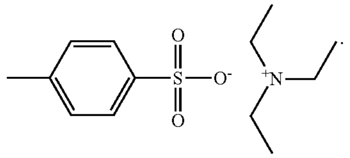

14. The light-emitting device of claim 1, wherein the emission layer comprises one or more quantum dots.

15. A method of manufacturing a light-emitting device, the method comprising:

forming a cathode on a substrate;

forming an electron transport region on the cathode, wherein the electron transport region comprises a thermal acid generator;

forming an emission layer on the electron transport region; and forming an anode on the emission layer.

* * * * *